(12) United States Patent
Watabe et al.

(10) Patent No.: US 12,349,538 B2
(45) Date of Patent: Jul. 1, 2025

(54) LIGHT-EMITTING DEVICE, DISPLAY DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Takeyoshi Watabe, Kanagawa (JP); Yuta Kawano, Kanagawa (JP); Airi Ueda, Kanagawa (JP); Nobuharu Ohsawa, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 638 days.

(21) Appl. No.: 17/695,982

(22) Filed: Mar. 16, 2022

(65) Prior Publication Data

US 2022/0320470 A1 Oct. 6, 2022

(30) Foreign Application Priority Data

Mar. 25, 2021 (JP) .................. 2021-052207

(51) Int. Cl.
*H10K 50/858* (2023.01)
*H10K 50/844* (2023.01)

(52) U.S. Cl.
CPC ......... *H10K 50/858* (2023.02); *H10K 50/844* (2023.02)

(58) Field of Classification Search
CPC .. H10K 50/858; H10K 50/844; H10K 59/879; H10K 59/80518; H10K 59/80524;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Nakayama.T et al., "Organic photo- and electroluminescent devices with double mirrors", Appl. Phys. Lett. (Applied Physics Letters), Aug. 2, 1993, vol. 63, No. 5, pp. 594-595.
(Continued)

*Primary Examiner* — Victor A Mandala
(74) *Attorney, Agent, or Firm* — Fish & Richardson P.C.

(57) ABSTRACT

A light-emitting device with high emission efficiency is provided. The light-emitting device includes an EL layer and a light-transmitting electrode. The EL layer includes a light-emitting layer and a low refractive index layer. The low refractive index layer is positioned between the light-emitting layer and the light-transmitting electrode. A cap layer is in contact with a surface of the light-transmitting electrode on the side opposite to the EL layer. The cap layer includes a high refractive index material having an ordinary refractive index of higher than or equal to 1.90 and lower than or equal to 2.40 and an ordinary extinction coefficient of higher than or equal to 0 and lower than or equal to 0.01. The low refractive index layer includes a low refractive index material having an ordinary refractive index of higher than or equal to 1.60 and lower than or equal to 1.70.

19 Claims, 29 Drawing Sheets

(58) Field of Classification Search
CPC ..... H10K 50/16; A47L 11/24; A47L 11/4002; A47L 11/4005; A47L 11/4008; A47L 11/4011

See application file for complete search history.

(56) References Cited

U.S. PATENT DOCUMENTS

| | | | |
|---|---|---|---|
| 11,871,656 B2* | 1/2024 | Miyake | H10K 50/18 |
| 2002/0072139 A1 | 6/2002 | Kashiwabara | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0021627 A1 | 1/2015 | Fujita. et al. | |
| 2015/0060826 A1 | 3/2015 | Matsumoto. et al. | |
| 2015/0069360 A1 | 3/2015 | Sato | |
| 2015/0076476 A1 | 3/2015 | Odaka et al. | |
| 2015/0348998 A1 | 12/2015 | Koezuka et al. | |
| 2015/0372022 A1 | 12/2015 | Okazaki et al. | |
| 2016/0118502 A1 | 4/2016 | Yamazaki et al. | |
| 2016/0133878 A1 | 5/2016 | Uesaka et al. | |
| 2016/0172595 A1 | 6/2016 | Malinowski et al. | |
| 2016/0315133 A1 | 10/2016 | Sato | |
| 2017/0104049 A1 | 4/2017 | Nakamura et al. | |
| 2017/0123268 A1 | 5/2017 | Sasaki et al. | |
| 2017/0141167 A1 | 5/2017 | Naganuma | |
| 2017/0154947 A1 | 6/2017 | Nakamura | |
| 2017/0213876 A1 | 7/2017 | Ohsawa et al. | |
| 2017/0256754 A1 | 9/2017 | Defranco et al. | |
| 2017/0271624 A1* | 9/2017 | Hua | H10K 50/858 |
| 2017/0331065 A1 | 11/2017 | Seo et al. | |
| 2018/0019285 A1 | 1/2018 | Seo et al. | |
| 2018/0190908 A1 | 7/2018 | Ke et al. | |
| 2018/0248146 A1 | 8/2018 | Seo et al. | |
| 2019/0008014 A1 | 1/2019 | Ikeda et al. | |
| 2019/0173021 A1* | 6/2019 | Zhang | C09K 11/06 |
| 2020/0176692 A1 | 6/2020 | Watabe et al. | |
| 2020/0203662 A1 | 6/2020 | Mollard et al. | |
| 2020/0207714 A1* | 7/2020 | Zhang | C07D 409/14 |
| 2021/0005814 A1 | 1/2021 | Watabe et al. | |
| 2021/0126132 A1 | 4/2021 | Sato et al. | |
| 2021/0202598 A1* | 7/2021 | Han | H10K 50/816 |
| 2021/0234112 A1 | 7/2021 | Seo et al. | |
| 2021/0234115 A1 | 7/2021 | Seo et al. | |
| 2021/0257562 A1 | 8/2021 | Watabe et al. | |
| 2021/0257594 A1* | 8/2021 | Kim | H10K 59/65 |
| 2021/0296617 A1 | 9/2021 | Seo et al. | |
| 2021/0336151 A1 | 10/2021 | Tosu et al. | |
| 2021/0384442 A1 | 12/2021 | Watabe et al. | |
| 2021/0395245 A1 | 12/2021 | Watabe et al. | |
| 2022/0028937 A1 | 1/2022 | Ohsawa et al. | |
| 2022/0119360 A1* | 4/2022 | Mochizuki | H10K 50/844 |
| 2023/0037397 A1 | 2/2023 | Watabe et al. | |
| 2023/0044829 A1* | 2/2023 | Helander | H10K 59/38 |
| 2023/0134350 A1* | 5/2023 | Yen | C07D 409/14 257/40 |
| 2023/0167072 A1* | 6/2023 | Yoshida | H10K 85/622 428/690 |
| 2023/0180501 A1 | 6/2023 | Kawano et al. | |
| 2023/0320130 A1 | 10/2023 | Watabe et al. | |
| 2023/0413603 A1* | 12/2023 | Helander | H10K 71/191 |
| 2023/0413649 A1* | 12/2023 | Helander | H10K 59/879 |
| 2024/0023359 A1* | 1/2024 | Kim | H10K 85/658 |
| 2024/0179930 A1* | 5/2024 | Yamamoto | H10K 50/844 |
| 2024/0324386 A1* | 9/2024 | Watabe | G02B 5/30 |

FOREIGN PATENT DOCUMENTS

| | | |
|---|---|---|
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-032851 A | 2/2014 |
| JP | 2014-120218 A | 6/2014 |
| JP | 2014-135251 A | 7/2014 |
| JP | 2014-232568 A | 12/2014 |
| JP | 2015-038859 A | 2/2015 |
| JP | 2015-115178 A | 6/2015 |
| JP | 2016-197494 A | 11/2016 |
| JP | 2019-179696 A | 10/2019 |
| JP | 2020-160305 A | 10/2020 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

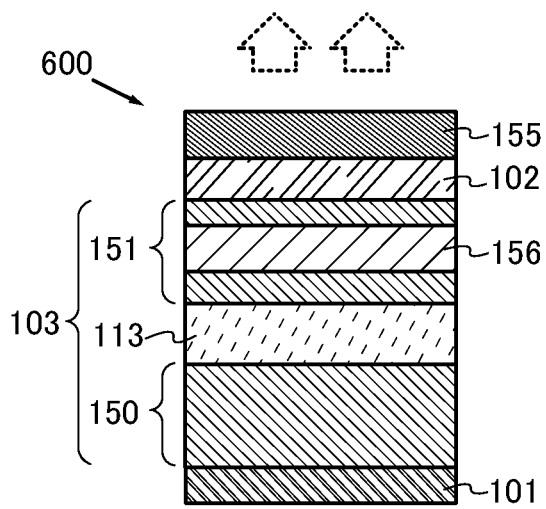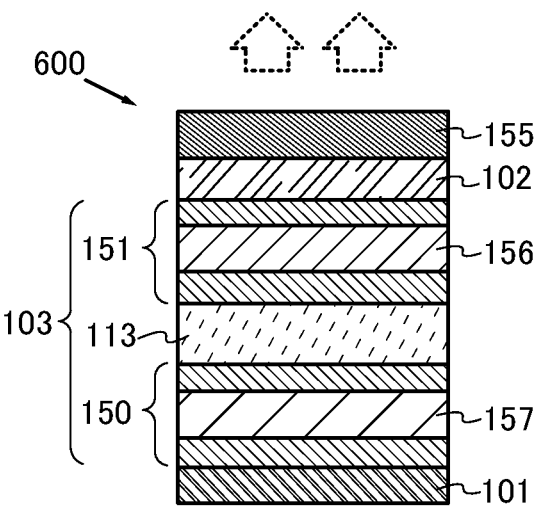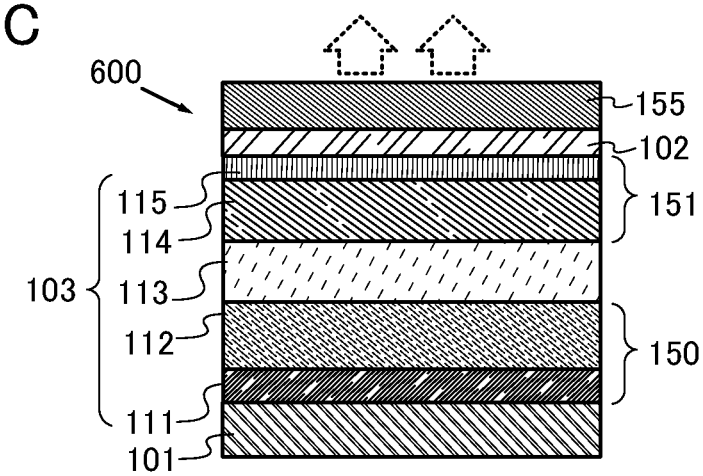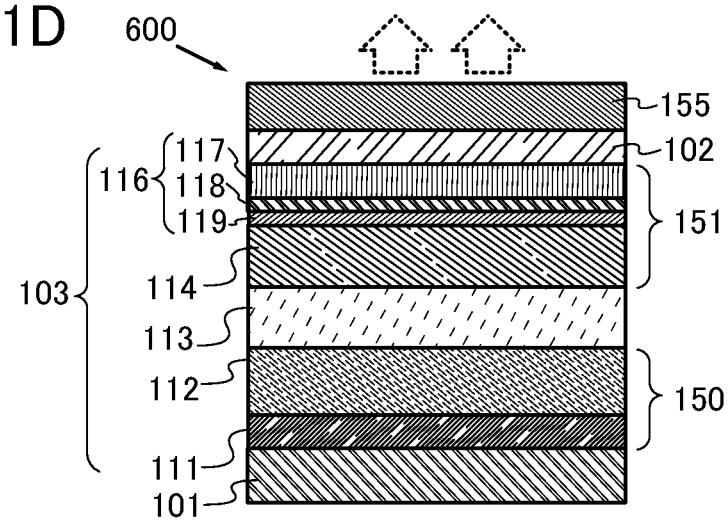

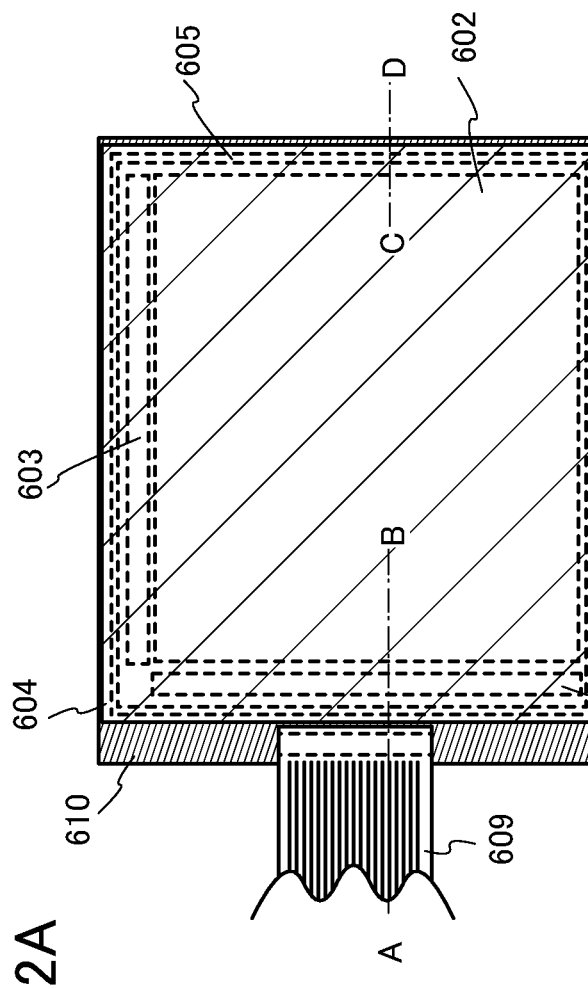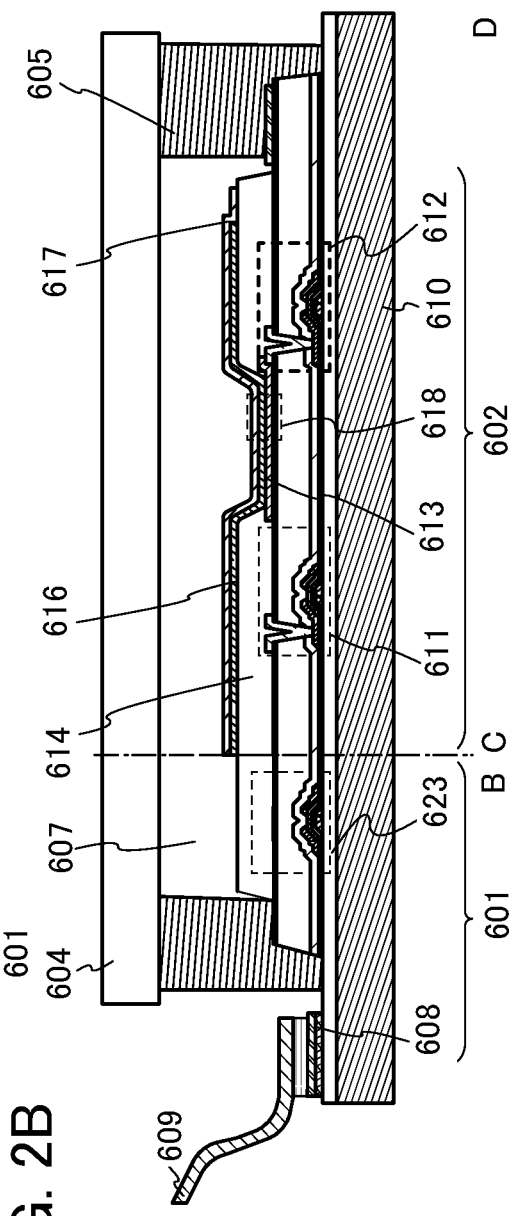

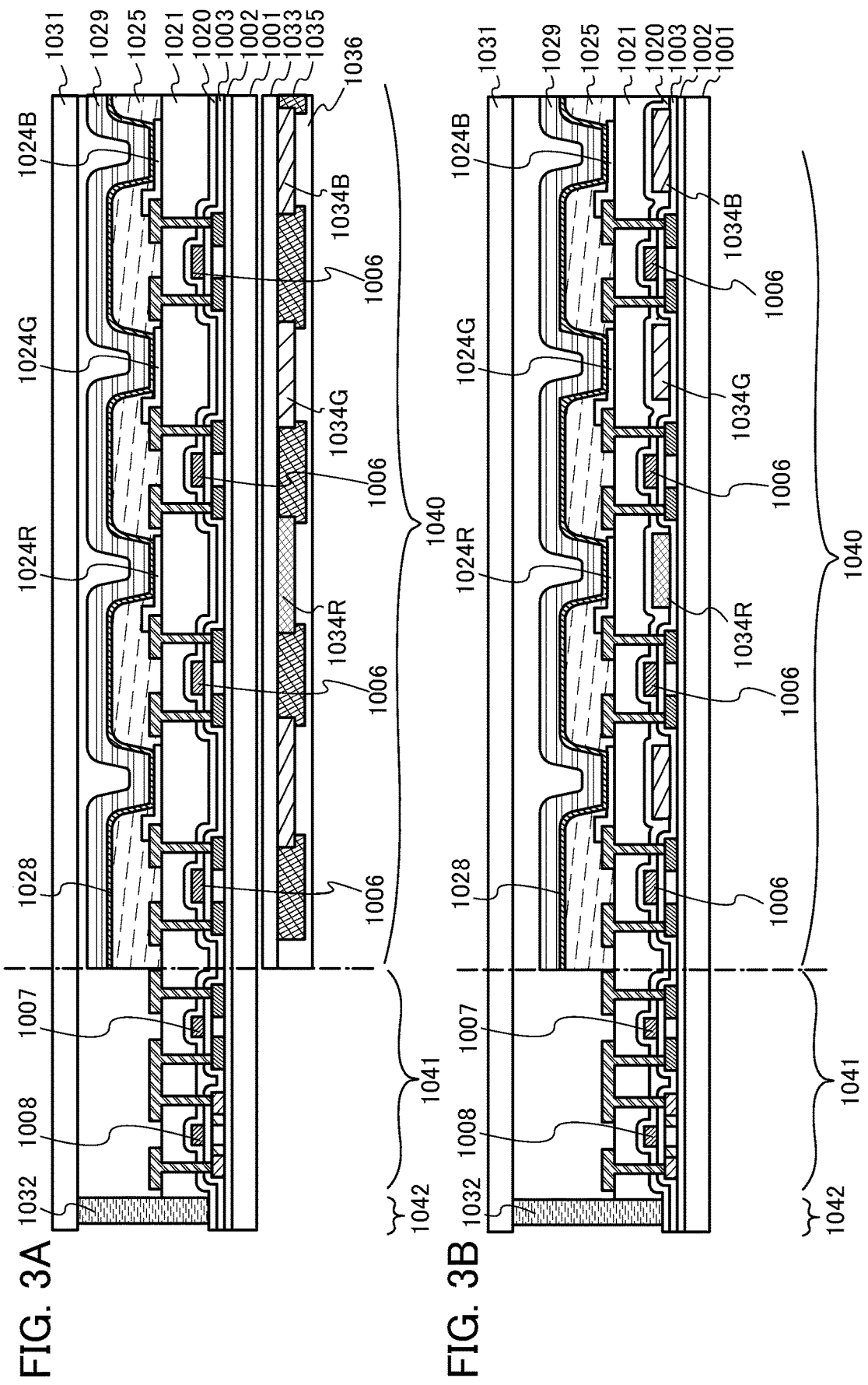

FIG. 7A
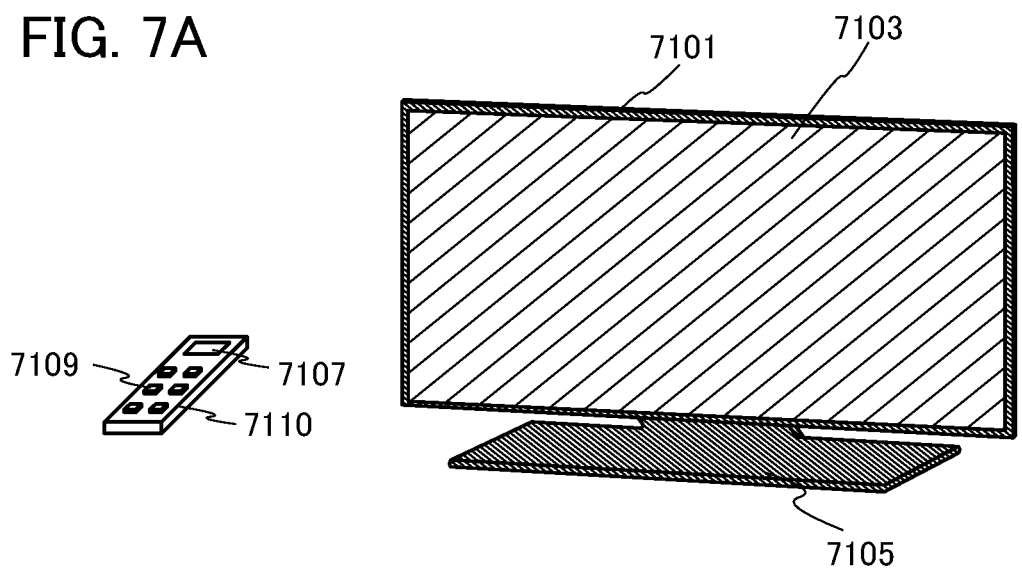
FIG. 7B1
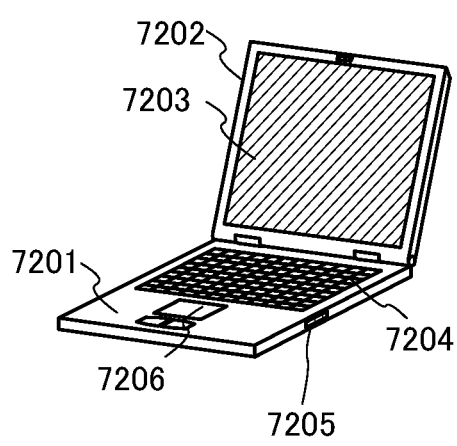
FIG. 7B2
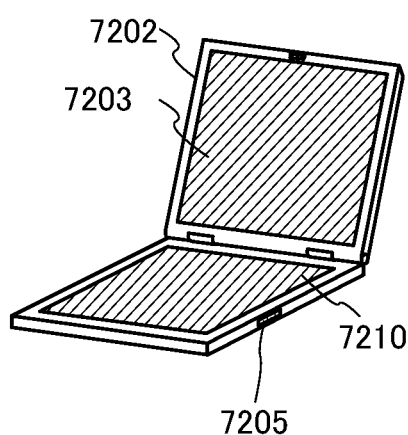
FIG. 7C
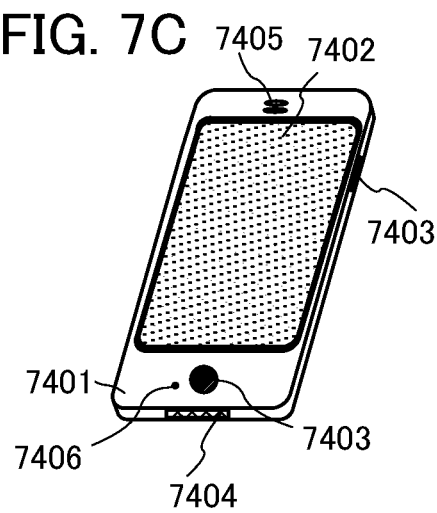

FIG. 18
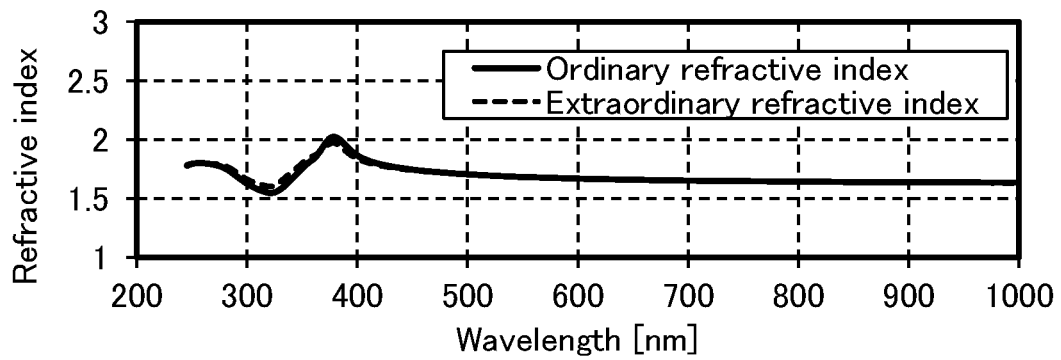
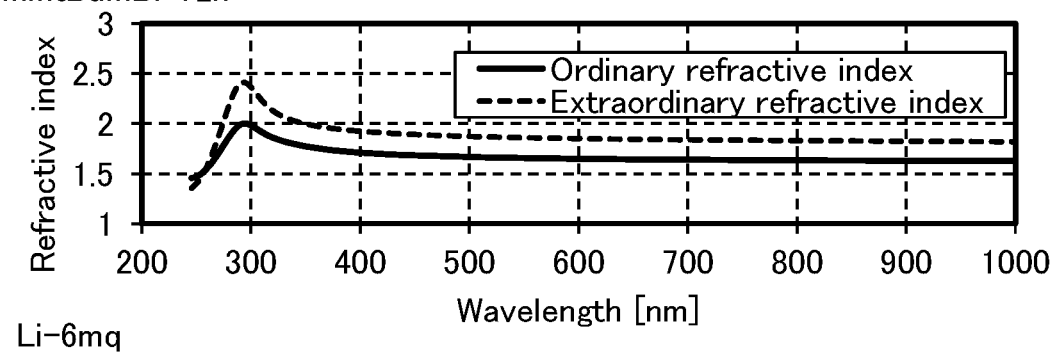
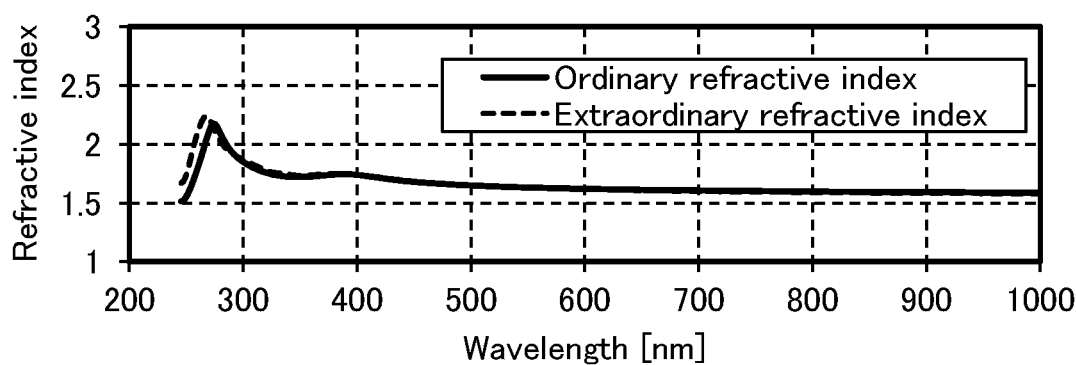

FIG. 28
mmtBumTPoFBi-04
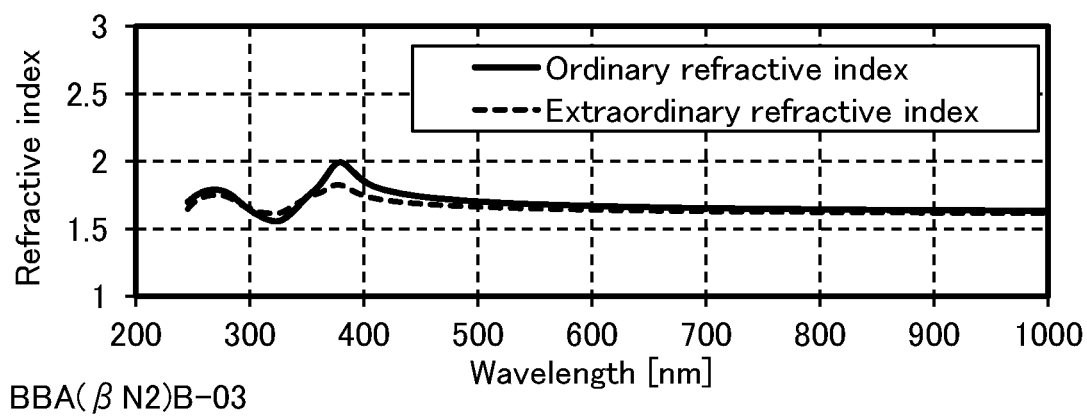
BBA(βN2)B-03
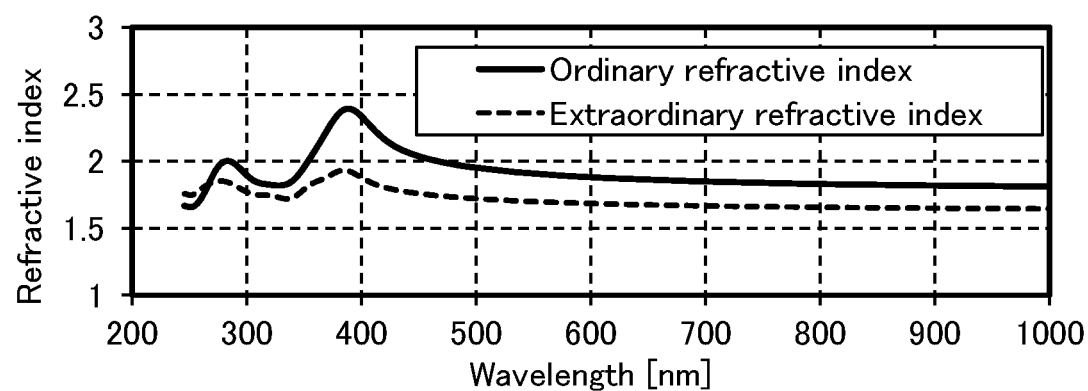

LIGHT-EMITTING DEVICE, DISPLAY DEVICE, LIGHT-EMITTING APPARATUS, ELECTRONIC DEVICE, AND LIGHTING DEVICE

BACKGROUND OF THE INVENTION

1. Field of the Invention

One embodiment of the present invention relates to an organic compound, a light-emitting element, a light-emitting device, a display module, a lighting module, a display device, a light-emitting apparatus, an electronic device, a lighting device, and an electronic appliance. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

2. Description of the Related Art

Light-emitting devices (organic EL devices) including organic compounds and utilizing electroluminescence (EL) have been put to more practical use. In the basic structure of such light-emitting devices, an organic compound layer containing a light-emitting material (an EL layer) is sandwiched between a pair of electrodes. Carriers are injected by application of a voltage to the device, and recombination energy of the carriers is used, whereby light emission can be obtained from the light-emitting material.

Such light-emitting devices are of self-luminous type and thus have advantages over liquid crystal displays, such as high visibility and no need for a backlight when used as pixels of a display, and are particularly suitable for flat panel displays. Displays including such light-emitting devices are also highly advantageous in that they can be thin and lightweight. Moreover, such light-emitting devices also have a feature that the response speed is extremely fast.

Since light-emitting layers of such light-emitting devices can be successively formed two-dimensionally, planar light emission can be achieved. This feature is difficult to realize with point light sources typified by incandescent lamps or LEDs or linear light sources typified by fluorescent lamps; thus, such light-emitting devices also have a great potential as planar light sources which can be applied to lighting devices and the like.

Displays or lighting devices including light-emitting devices are suitable for a variety of electronic devices as described above, and research and development of light-emitting devices have progressed for more favorable characteristics.

Low outcoupling efficiency is often a problem in an organic EL device. In order to improve the outcoupling efficiency, a structure including a layer formed using a low refractive index material in an EL layer (see Patent Document 1, for example) has been proposed.

REFERENCE

Patent Document

[Patent Document 1] United States Patent Application Publication No. 2020/0176692

SUMMARY OF THE INVENTION

An object of one embodiment of the present invention is to provide a light-emitting device with high emission efficiency. Another object of one embodiment of the present invention is to provide any of a light-emitting device, a light-emitting apparatus, an electronic device, a display device, and an electronic appliance each having low power consumption.

It is only necessary that at least one of the above-described objects be achieved in the present invention.

One embodiment of the present invention is a material for a cap layer of a light-emitting device, which has an ordinary refractive index of higher than or equal to 1.90 and lower than or equal to 2.40 and an ordinary extinction coefficient of higher than or equal to 0 and lower than or equal to 0.01, at any wavelength in the range from 455 nm to 465 nm.

Another embodiment of the present invention is a material for a cap layer of a light-emitting device, which has an ordinary refractive index of higher than or equal to 1.90 and lower than or equal to 2.40 and an ordinary extinction coefficient of higher than or equal to 0 and lower than or equal to 0.01, in the entire wavelength range from 455 nm to 465 nm.

In any of the above-described embodiments of the present invention, the ordinary refractive index is preferably higher than or equal to 1.95 and lower than or equal to 2.40.

Another embodiment of the present invention is a material for a cap layer of a light-emitting device, which has an ordinary refractive index of higher than or equal to 1.85 and lower than or equal to 2.40 and an ordinary extinction coefficient of higher than or equal to 0 and lower than or equal to 0.01, at any wavelength in the range from 500 nm to 650 nm.

Another embodiment of the present invention is a material for a cap layer of a light-emitting device, which has an ordinary refractive index of higher than or equal to 1.85 and lower than or equal to 2.40 and an ordinary extinction coefficient of higher than or equal to 0 and lower than or equal to 0.01, in the entire wavelength range from 500 nm to 650 nm.

In any of the above-described embodiments of the present invention, the ordinary refractive index is preferably higher than or equal to 1.90 and lower than or equal to 2.40.

In any of the above-described embodiments of the present invention, the material preferably includes a condensed ring skeleton having four or more rings.

In any of the above-described embodiments of the present invention, the material preferably includes a condensed ring skeleton having five or more rings.

In any of the above-described embodiments of the present invention, the material preferably includes a sulfur atom.

In any of the above-described embodiments of the present invention, an evaporated film of the material preferably has large anisotropy.

In any of the above-described embodiments of the present invention, an alignment order parameter of an evaporated film of the material, which is calculated from an ordinary extinction coefficient peak positioned on the longest wavelength side, is preferably less than or equal to −0.1.

Another embodiment of the present invention is a cap layer of a light-emitting device. The light-emitting device includes an EL layer between a pair of electrodes including a light-transmitting electrode. The cap layer is in contact with a surface of the light-transmitting electrode on the side opposite to the EL layer. The cap layer includes a material having an ordinary refractive index of higher than or equal to 1.90 and lower than or equal to 2.40 and an ordinary extinction coefficient of higher than or equal to 0 and lower than or equal to 0.01, at any wavelength in the range from 455 nm to 465 nm.

Another embodiment of the present invention is a cap layer of a light-emitting device. The light-emitting device includes an EL layer between a pair of electrodes including a light-transmitting electrode. The cap layer is in contact with a surface of the light-transmitting electrode on the side opposite to the EL layer. The cap layer includes a material having an ordinary refractive index of higher than or equal to 1.90 and lower than or equal to 2.40 and an ordinary extinction coefficient of higher than or equal to 0 and lower than or equal to 0.01, in the entire wavelength range from 455 nm to 465 nm.

Another embodiment of the present invention is a cap layer of a light-emitting device. The light-emitting device includes an EL layer between a pair of electrodes including a light-transmitting electrode. The cap layer is in contact with a surface of the light-transmitting electrode on the side opposite to the EL layer. Light emitted by the light-emitting device has a peak wavelength of higher than or equal to 455 nm and lower than or equal to 465 nm. The cap layer includes a material having an ordinary refractive index of higher than or equal to 1.90 and lower than or equal to 2.40 and an ordinary extinction coefficient of higher than or equal to 0 and lower than or equal to 0.01, at the peak wavelength.

In any of the above-described embodiments of the present invention, the material preferably has an ordinary extinction coefficient of higher than 0.05 at any wavelength in the range from 370 nm to 700 nm.

In any of the above-described embodiments of the present invention, the ordinary refractive index of the material is preferably higher than or equal to 1.95 and lower than or equal to 2.40.

Another embodiment of the present invention is a cap layer of a light-emitting device. The light-emitting device includes an EL layer between a pair of electrodes including a light-transmitting electrode. The cap layer is in contact with a surface of the light-transmitting electrode on the side opposite to the EL layer. The cap layer includes a material having an ordinary refractive index of higher than or equal to 1.85 and lower than or equal to 2.40 and an ordinary extinction coefficient of higher than or equal to 0 and lower than or equal to 0.01, at any wavelength in the range from 500 nm to 650 nm.

Another embodiment of the present invention is a cap layer of a light-emitting device. The light-emitting device includes an EL layer between a pair of electrodes including a light-transmitting electrode. The cap layer is in contact with a surface of the light-transmitting electrode on the side opposite to the EL layer. The cap layer includes a material having an ordinary refractive index of higher than or equal to 1.85 and lower than or equal to 2.40 and an ordinary extinction coefficient of higher than or equal to 0 and lower than or equal to 0.01, in the entire wavelength range from 500 nm to 650 nm.

Another embodiment of the present invention is a cap layer of a light-emitting device. The light-emitting device includes an EL layer between a pair of electrodes including a light-transmitting electrode. The cap layer is in contact with a surface of the light-transmitting electrode on the side opposite to the EL layer. Light emitted by the light-emitting device has a peak wavelength of higher than or equal to 500 nm and lower than or equal to 650 nm. The cap layer includes a material having an ordinary refractive index of higher than or equal to 1.85 and lower than or equal to 2.40 and an ordinary extinction coefficient of higher than or equal to 0 and lower than or equal to 0.01, at the peak wavelength.

In any of the above-described embodiments of the present invention, the material preferably has an ordinary extinction coefficient of higher than 0.05 at any wavelength in the range from 370 nm to 700 nm.

In any of the above-described embodiments of the present invention, the ordinary refractive index of the material is preferably higher than or equal to 1.90 and lower than or equal to 2.40.

In any of the above-described embodiments of the present invention, the material preferably includes a condensed ring skeleton having four or more rings.

In any of the above-described embodiments of the present invention, the material preferably includes a condensed ring skeleton having five or more rings.

In any of the above-described embodiments of the present invention, the material preferably includes a sulfur atom.

In any of the above-described embodiments of the present invention, an evaporated film of the material preferably has large anisotropy.

In any of the above-described embodiments of the present invention, an alignment order parameter of an evaporated film of the material, which is calculated from an ordinary extinction coefficient peak positioned on the longest wavelength side, is preferably less than or equal to −0.1.

Another embodiment of the present invention is a light-emitting device including an EL layer between a pair of electrodes. One of the pair of electrodes is a light-transmitting electrode. The EL layer includes at least a light-emitting layer and a low refractive index layer. A cap layer is in contact with a surface of the light-transmitting electrode on the side opposite to the EL layer. The cap layer includes a high refractive index material having an ordinary refractive index of higher than or equal to 1.90 and lower than or equal to 2.40 and an ordinary extinction coefficient of higher than or equal to 0 and lower than or equal to 0.01 at any wavelength in the range from 455 nm to 465 nm. The low refractive index layer includes a low refractive index material having an ordinary refractive index of higher than or equal to 1.50 and lower than or equal to 1.75 at any wavelength in the range from 455 nm to 465 nm.

Another embodiment of the present invention is a light-emitting device including an EL layer between a pair of electrodes. One of the pair of electrodes is a light-transmitting electrode. The EL layer includes at least a light-emitting layer and a low refractive index layer. A cap layer is in contact with a surface of the light-transmitting electrode on the side opposite to the EL layer. The cap layer includes a high refractive index material having an ordinary refractive index of higher than or equal to 1.90 and lower than or equal to 2.40 and an ordinary extinction coefficient of higher than or equal to 0 and lower than or equal to 0.01 in the entire wavelength range from 455 nm to 465 nm. The low refractive index layer includes a low refractive index material having an ordinary refractive index of higher than or equal to 1.50 and lower than or equal to 1.75 at any wavelength in the range from 455 nm to 465 nm.

Another embodiment of the present invention is a light-emitting device including an EL layer between a pair of electrodes. One of the pair of electrodes is a light-transmitting electrode. The EL layer includes at least a light-emitting layer and a low refractive index layer. A cap layer is in contact with a surface of the light-transmitting electrode on the side opposite to the EL layer. Light emitted by the light-emitting device has a peak wavelength of higher than or equal to 455 nm and lower than or equal to 465 nm. The cap layer includes a high refractive index material having an ordinary refractive index of higher than or equal to 1.90 and lower than or equal to 2.40 and an ordinary extinction coefficient of higher than or equal to 0 and lower than or equal to 0.01 at the peak wavelength. The low refractive index layer includes a low refractive index material having an ordinary refractive index of higher than or equal to 1.50 and lower than or equal to 1.75 at the peak wavelength.

In any of the above-described embodiments of the present invention, the low refractive index layer is preferably positioned between the light-emitting layer and the light-transmitting electrode.

In any of the above-described embodiments of the present invention, the high refractive index material preferably has an ordinary extinction coefficient of higher than 0.01 at wavelengths of lower than or equal to 390 nm.

In any of the above-described embodiments of the present invention, the ordinary refractive index of the high refractive index material is preferably higher than or equal to 1.95 and lower than or equal to 2.40.

Another embodiment of the present invention is a light-emitting device including an EL layer between a pair of electrodes. One of the pair of electrodes is a light-transmitting electrode. The EL layer includes at least a light-emitting layer and a low refractive index layer. The low refractive index layer is positioned between the light-emitting layer and the light-transmitting electrode. A cap layer is in contact with a surface of the light-transmitting electrode on the side opposite to the EL layer. The cap layer includes a high refractive index material having an ordinary refractive index of higher than or equal to 1.85 and lower than or equal to 2.40 and an ordinary extinction coefficient of higher than or equal to 0 and lower than or equal to 0.01 at any wavelength in the range from 500 nm to 650 nm. The low refractive index layer includes a low refractive index material having an ordinary refractive index of higher than or equal to 1.45 and lower than or equal to 1.70 in the entire wavelength range from 500 nm to 650 nm.

Another embodiment of the present invention is a light-emitting device including an EL layer between a pair of electrodes. One of the pair of electrodes is a light-transmitting electrode. The EL layer includes at least a light-emitting layer and a low refractive index layer. The low refractive index layer is positioned between the light-emitting layer and the light-transmitting electrode. A cap layer is in contact with a surface of the light-transmitting electrode on the side opposite to the EL layer. The cap layer includes a high refractive index material having an ordinary refractive index of higher than or equal to 1.85 and lower than or equal to 2.40 and an ordinary extinction coefficient of higher than or equal to 0 and lower than or equal to 0.01 in the entire wavelength range from 500 nm to 650 nm. The low refractive index layer includes a low refractive index material having an ordinary refractive index of higher than or equal to 1.45 and lower than or equal to 1.70 in the entire wavelength range from 500 nm to 650 nm.

Another embodiment of the present invention is a light-emitting device including an EL layer between a pair of electrodes. One of the pair of electrodes is a light-transmitting electrode. The EL layer includes at least a light-emitting layer and a low refractive index layer. The low refractive index layer is positioned between the light-emitting layer and the light-transmitting electrode. Light emitted by the light-emitting device has a peak wavelength of higher than or equal to 500 nm and lower than or equal to 650 nm. A cap layer is in contact with a surface of the light-transmitting electrode on the side opposite to the EL layer. The cap layer includes a high refractive index material having an ordinary refractive index of higher than or equal to 1.85 and lower than or equal to 2.40 and an ordinary extinction coefficient of higher than or equal to 0 and lower than or equal to 0.01 at the peak wavelength. The low refractive index layer includes a low refractive index material having an ordinary refractive index of higher than or equal to 1.45 and lower than or equal to 1.70 at the peak wavelength.

In any of the above-described embodiments of the present invention, the high refractive index material preferably has an ordinary extinction coefficient of higher than 0.05 at any wavelength in the range from 370 nm to 700 nm.

In any of the above-described embodiments of the present invention, the ordinary refractive index of the high refractive index material is preferably higher than or equal to 1.90 and lower than or equal to 2.40.

In any of the above-described embodiments of the present invention, the light-transmitting electrode is preferably a cathode.

In any of the above-described embodiments of the present invention, the low refractive index layer is preferably in an electron-transport region.

In any of the above-described embodiments of the present invention, the low refractive index layer is preferably an electron-transport layer.

In any of the above-described embodiments of the present invention, the low refractive index material is preferably a material having an electron-transport property.

In any of the above-described embodiments of the present invention, the low refractive index material is preferably a mixed material of a material having an electron-transport property and a metal complex.

In any of the above-described embodiments of the present invention, the other of the pair of electrodes is preferably a reflective electrode, the EL layer preferably includes a second low refractive index layer between the light-emitting layer and the reflective electrode, and the second low refractive index layer preferably includes a second low refractive index material having an ordinary refractive index of higher than or equal to 1.50 and lower than or equal to 1.75 at a peak wavelength of light emitted by the light-emitting device.

In the above-described embodiment of the present invention, the second low refractive index layer is preferably in a hole-transport region.

In any of the above-described embodiments of the present invention, the second low refractive index layer is preferably a hole-transport layer.

In any of the above-described embodiments of the present invention, the second low refractive index material is preferably a material having a hole-transport property.

In any of the above-described embodiments of the present invention, the high refractive index material preferably includes a condensed ring skeleton having four or more rings.

In any of the above-described embodiments of the present invention, the high refractive index material preferably includes a condensed ring skeleton having five or more rings.

In any of the above-described embodiments of the present invention, the high refractive index material preferably includes a sulfur atom.

In any of the above-described embodiments of the present invention, an evaporated film of the high refractive index material preferably has large anisotropy.

In any of the above-described embodiments of the present invention, an alignment order parameter of an evaporated film of the high refractive index material, which is calculated from an ordinary extinction coefficient peak positioned on the longest wavelength side, is preferably less than or equal to −0.1.

Another embodiment of the present invention is an electronic device including any of the above-described light-emitting devices, a sensor, an operation button, and a speaker or a microphone.

Another embodiment of the present invention is a light-emitting apparatus including any of the above-described light-emitting devices, and a transistor or a substrate.

Another embodiment of the present invention is a display device including any of the above-described light-emitting devices, and a transistor or a substrate.

Another embodiment of the present invention is a lighting device including any of the above-described light-emitting devices and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

With one embodiment of the present invention, a light-emitting device with high emission efficiency can be provided. With one embodiment of the present invention, any of a light-emitting device, a light-emitting apparatus, an electronic device, a display device, and an electronic appliance each having low power consumption can be provided.

Note that the description of these effects does not preclude the existence of other effects. One embodiment of the present invention does not need to have all these effects. Other effects will be apparent from and can be derived from the description of the specification, the drawings, the claims, and the like.

BRIEF DESCRIPTION OF THE DRAWINGS

In the accompanying drawings:

FIG. TA to FIG. 1D each schematically illustrate a light-emitting device;

FIGS. 2A and 2B illustrate an active matrix light-emitting apparatus;

FIGS. 3A and 3B each illustrate an active matrix light-emitting apparatus;

FIGS. 7A, 7B1, 7B2, and 7C illustrate electronic devices;

FIG. 18 shows ordinary and extraordinary refractive indexes of mmtBuBioFBi, mmtBumBPTzn, and Li-6mq;

FIG. 28 shows ordinary and extraordinary refractive indexes of mmtBumTPoFBi-04 and BBA(βN2)B-03;

DETAILED DESCRIPTION OF THE INVENTION

Figure 4:
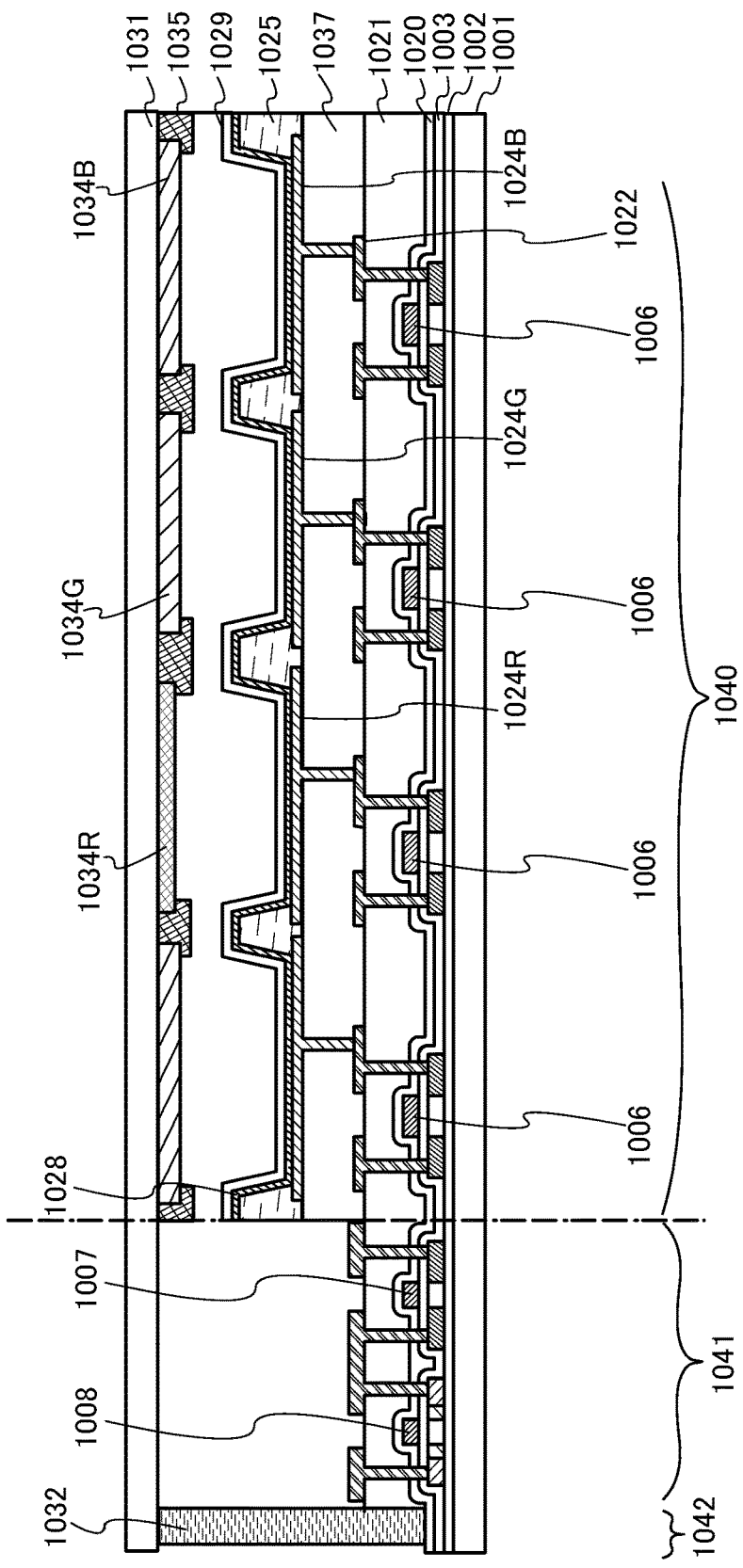
FIG. 4 illustrates an active matrix light-emitting apparatus.

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in the case where light is incident on a material having optical anisotropy, light with a plane of vibration parallel to the optical axis is referred to as extraordinary light (rays) and light with a plane of vibration perpendicular to the optical axis is referred to as ordinary light (rays); the refractive index of the material with respect to ordinary light might differ from that with respect to extraordinary light. In such a case, the ordinary refractive index and the extraordinary refractive index can be separately calculated by anisotropy analysis. Note that in the case where the measured material has both the ordinary refractive index and the extraordinary refractive index, the ordinary refractive index is used as an index in this specification. Furthermore, when simply mentioning a refractive index, the refractive index refers to the average value of the ordinary refractive index and the extraordinary refractive index.

As is the case with the refractive index, the extinction coefficient with respect to ordinary light might differ from that with respect to extraordinary light, and the ordinary extinction coefficient and the extraordinary extinction coefficient can be separately calculated by anisotropy analysis. In the case where the measured material has both the ordinary extinction coefficient and the extraordinary extinction coefficient, the ordinary extinction coefficient is used as an index in this specification. Furthermore, when simply mentioning an extinction coefficient, the extinction coefficient refers to the average value of the ordinary extinction coefficient and the extraordinary extinction coefficient.

Furthermore, an evaporated film in this specification refers to a film deposited by an evaporation method in the state where a substrate is at room temperature.

Embodiment 1

FIG. TA illustrates a light-emitting device 600 of one embodiment of the present invention. Light-emitting devices illustrated in FIGS. 1A to 1D each include a first electrode 101, a second electrode 102, an EL layer 103, and a cap layer 155. The EL layer 103 includes at least a light-emitting layer 113 and preferably further includes a low refractive index layer 156.

The second electrode 102 is a light-transmitting electrode, and the light-emitting device 600 emits light from the second electrode 102 side.

In the EL layer 103, a region between the light-emitting layer 113 and the first electrode 101 is referred to as a carrier-transport region 150, and a region between the light-emitting layer 113 and the second electrode 102 is referred to as a carrier-transport region 151; one of the regions is a hole-transport region and the other is an electron-transport region. The low refractive index layer 156 is preferably provided in the carrier-transport region 151.

The second electrode 102 is provided in contact with and sandwiched between the EL layer 103 and the cap layer 155.

The cap layer 155 has a high refractive index. Specifically, the ordinary refractive index of the cap layer 155 at any wavelength in the range from 455 nm to 465 nm, preferably in the entire wavelength range from 455 nm to 465 nm, is preferably higher than or equal to 1.90 and lower than or equal to 2.40, further preferably higher than or equal to 1.95 and lower than or equal to 2.40. Furthermore, the ordinary extinction coefficient of the cap layer at any wavelength in the range from 455 nm to 465 nm, preferably in the entire wavelength range from 455 nm to 465 nm, is preferably higher than or equal to 0 and lower than or equal to 0.01.

Alternatively, the ordinary refractive index of the cap layer 155 at any wavelength in the range from 500 nm to 650 nm, preferably in the entire wavelength range from 500 nm to 650 nm, is preferably higher than or equal to 1.85 and lower than or equal to 2.40, further preferably higher than or equal to 1.90 and lower than or equal to 2.40. Furthermore, the ordinary extinction coefficient of the cap layer at any wavelength in the range from 500 nm to 650 nm, preferably in the entire wavelength range from 500 nm to 650 nm, is preferably higher than or equal to 0 and lower than or equal to 0.01.

In the case where the light-emitting device 600 emits light having a peak wavelength of $\lambda$ nm, the above-described ordinary refractive index and ordinary extinction coefficient with respect to the light of $\lambda$ nm are preferably within the above-described numerical ranges. Moreover, the ordinary extinction coefficient of the cap layer 155 at a wavelength that is shorter than the peak wavelength $\lambda$ nm by 100 nm or more is preferably higher than 0.01 for a reduced loss due to light absorption and a higher refractive index at the wavelength $\lambda$ nm. Furthermore, the ordinary extinction coefficient at any wavelength in the range from 370 nm to 700 nm is preferably higher than 0.05 for an increased refractive index in a visible light region.

Such a cap layer 155 can be obtained by being formed using a material having the above-described properties (such a material is referred to as a high refractive index material in this specification). In other words, a layer containing a material having the above-described properties (also referred to as a high refractive index material) is formed as the cap layer 155.

The high refractive index material preferably has a condensed ring skeleton having four or more rings, preferably five or more rings because larger polarization of a molecule causes a higher refractive index. Furthermore, the high refractive index material achieves the high refractive index by employing an element with a large atomic number having high atomic refraction. In particular, the high refractive index material preferably contains a sulfur atom.

Moreover, the high refractive index material is preferably an organic compound having any of a plurality of naphthalene skeletons, a plurality of dibenzoquinoxaline skeletons, a plurality of benzonaphthofuran skeletons, and a plurality of benzofuropyrimidine skeletons. Note that the organic compound preferably further has a carbazole skeleton or an aryl amine skeleton.

Furthermore, an evaporated film preferably has large anisotropy because large anisotropy increases the film density and thus increases the refractive index. In addition, large anisotropy tends to increase the ordinary refractive index, and a higher ordinary refractive index improves the outcoupling efficiency of s-polarized light more; thus, an evaporated film of the high refractive index material preferably has large anisotropy. Specifically, the alignment order parameter S of the evaporated film, which is calculated from the ordinary extinction coefficient peak positioned on the longest wavelength side, is preferably less than or equal to −0.1, further preferably less than or equal to −0.15, and still further preferably less than or equal to −0.2.

Note that the alignment order parameter S is expressed by $S=(k_e-k_o)/(k_e+2k_o)$, where $k_o$ represents an extinction coefficient with respect to light perpendicular to the optical axis and $k_e$ represents an extinction coefficient with respect to light parallel to the optical axis. The alignment order parameter S is used as an index indicating the alignment state of a material. The alignment order parameter S falls within the range from −0.5 to +1; it is −0.5 in the case of completely parallel alignment with respect to the substrate, +1 in the case of completely perpendicular alignment with respect to the substrate, and 0 in the case of random alignment.

As the above-described high refractive index material, any of the following organic compounds can be used, for example.

The examples include 5,5'-diphenyl-2,2'-di-5H-[1]benzothieno[3,2-c]carbazole (abbreviation: BisBTc), 3-{4-(triphenylen-2-yl)phenyl}-9-(triphenylen-2-yl)-9H-carbazole (abbreviation: TpPCzTp), 3,6-bis[4-(2-naphthyl)phenyl]-9-(2-naphthyl)-9H-carbazole (abbreviation: PNP2βNC), 9-[4-(2,2'-binaphthalen-6-yl)phenyl]-3-[4-(2-naphthyl)phenyl]-9H-carbazole (abbreviation: (βN2)PCPβN), 2-{4-[2-(N-phenyl-9H-carbazol-3-yl)-9H-carbazol-9-yl]phenyl}dibenzo[f,h]quinoxaline (abbreviation: 2PCCzPDBq-02), N,N-bis[4-(6-phenylbenzo[b]naphtho[1,2-d]furan-8-yl)phenyl]-4-amino-p-terphenyl (abbreviation: BnfBB1TP), 9-[4-(9'-phenyl-3,3'-bi-9H-carbazol-9-yl)phenyl]naphtho[1',2':4,5]furo[2,3-b]pyrazine (abbreviation: 9pPCCzPNfpr), and 4,8-bis[3-(triphenylen-2-yl)phenyl]-[1]benzofuro[3,2-d]pyrimidine (abbreviation: 4,8mTpP2Bfpm).

The material having the above-described properties is extremely suitable as a material included in the cap layer 155.

The low refractive index layer 156 can be formed using a material having a carrier-transport property whose ordinary refractive index at any wavelength in the range from 455 nm to 465 nm, preferably in the entire wavelength range from 455 nm to 465 nm is higher than or equal to 1.50 and lower than or equal to 1.75. Alternatively, the low refractive index layer 156 can be formed using a material having a carrier-transport property whose ordinary refractive index at any wavelength in the range from 500 nm to 650 nm, preferably in the entire wavelength range from 500 nm to 650 nm is higher than or equal to 1.45 and lower than or equal to 1.70. In the case where the low refractive index layer 156 is formed in the electron-transport region, the low refractive index layer 156 is formed as a layer containing a material having an electron-transport property. In the case where the low refractive index layer 156 is formed in the hole-transport region, the low refractive index layer 156 is formed as a layer containing a material having a hole-transport property.

It is preferable to provide the low refractive index layer 156 in the carrier-transport region 151, which is a region between the light-emitting layer 113 and the second electrode 102, because the effect of improving emission efficiency in this case is larger than that in the case where a low refractive index layer is provided in the carrier-transport region 150, which is a region between the light-emitting layer 113 and the first electrode 101.

Note that the structure where the first electrode 101 is an anode and the second electrode 102 is a cathode is preferable to increase emission efficiency of the case where a high refractive index cap layer and a low refractive index electron-transport layer are employed. This is because the second electrode 102 can be formed using Ag or the like having a low work function and reflectivity. In such a case, the carrier-transport region 150 serves as the hole-transport region, the carrier-transport region 151 serves as the electron-transport region, and the low refractive index layer 156 is provided in the electron-transport region.

In the case where the low refractive index layer 156 is provided in the electron-transport region, the low refractive index layer 156 is formed as a layer containing a low refractive index material having an electron-transport property. The following substances can be given as examples of the low refractive index material having an electron-transport property and a refractive index in the above-described range. Note that substances other than those described below can also be used similarly as long as they are substances which a film with an electron mobility of $1 \times 10^{-7}$ cm$^2$/Vs or higher and a refractive index in the above-described range can be formed of.

As the low refractive index material having an electron-transport property, an organic compound which includes at least one six-membered heteroaromatic ring having 1 to 3 nitrogen atoms, a plurality of aromatic hydrocarbon rings each of which has 6 to 14 carbon atoms forming a ring and at least two of which are benzene rings, and a plurality of hydrocarbon groups forming a bond by sp$^3$ hybrid orbitals can be given.

In the above organic compound, carbon atoms forming a bond by sp$^3$ hybrid orbitals preferably account for higher than or equal to 10% and lower than or equal to 60%, further preferably higher than or equal to 10% and lower than or equal to 50% of total carbon atoms in molecules of the organic compound. Alternatively, when the above organic compound is subjected to $^1$H-NMR measurement, the integral value of signals at lower than 4 ppm is preferably ½ or more of the integral value of signals at 4 ppm or higher.

The molecular weight of the organic compound having an electron-transport property is preferably greater than or equal to 500 and less than or equal to 2000. It is preferable that all the hydrocarbon groups forming a bond by sp$^3$ hybrid orbitals in the above organic compound be bonded to the aromatic hydrocarbon rings each having 6 to 14 carbon atoms forming a ring.

The organic compound having an electron-transport property is preferably an organic compound represented by General Formula ($G_{e1}$1) or ($G_{e1}$1-1).

[Chemical Formula 1]

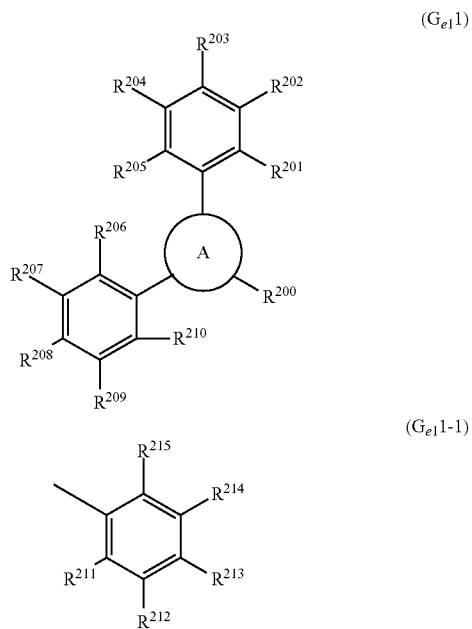

In the formula, A represents a six-membered heteroaromatic ring having 1 to 3 nitrogen atoms, and is preferably any of a pyridine ring, a pyrimidine ring, a pyrazine ring, a pyridazine ring, and a triazine ring.

Furthermore, $R^{200}$ represents any of hydrogen, an alkyl group having 1 to 6 carbon atoms, an alicyclic group having 3 to 10 carbon atoms, and a substituent represented by General Formula ($G_{e1}$1-1).

At least one of $R^{201}$ to $R^{215}$ represents a phenyl group having a substituent and the others each independently represent any of hydrogen, an alkyl group having 1 to 6 carbon atoms, an alicyclic group having 3 to 10 carbon atoms, a substituted or unsubstituted aromatic hydrocarbon group having 6 to 14 carbon atoms in a ring, and a substituted or unsubstituted pyridyl group. Note that $R^{201}$, $R^{203}$, $R^{205}$, $R^{206}$, $R^{208}$, $R^{210}$, $R^{211}$, $R^{213}$, and $R^{215}$ are preferably hydrogen. The phenyl group having a substituent has one or two substituents, which each independently represent any of an alkyl group having 1 to 6 carbon atoms, an alicyclic group having 3 to 10 carbon atoms, and a substituted or unsubstituted aromatic hydrocarbon group having 6 to 14 carbon atoms in a ring.

The organic compound represented by General Formula ($G_{e1}$1) has a plurality of hydrocarbon groups selected from an alkyl group having 1 to 6 carbon atoms and an alicyclic group having 3 to 10 carbon atoms, and carbon atoms forming a bond by sp³ hybrid orbitals account for higher than or equal to 10% and lower than or equal to 60% of total carbon atoms in molecules of the organic compound.

The organic compound having an electron-transport property is preferably an organic compound represented by General Formula ($G_{e1}$2).

[Chemical Formula 2]

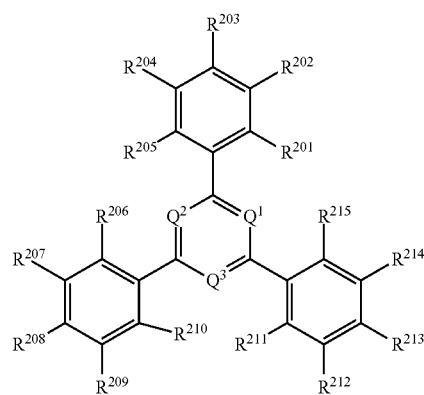

($G_{e1}$2)

In the formula, two or three of $Q^1$ to $Q^3$ represent N; in the case where two of $Q^1$ to $Q^3$ are N, the rest represents CH.

At least any one of $R^{201}$ to $R^{215}$ represents a phenyl group having a substituent and the others each independently represent any of hydrogen, an alkyl group having 1 to 6 carbon atoms, an alicyclic group having 3 to 10 carbon atoms, a substituted or unsubstituted aromatic hydrocarbon group having 6 to 14 carbon atoms in a ring, and a substituted or unsubstituted pyridyl group. Note that $R^{201}$, $R^{203}$, $R^{205}$, $R^{206}$, $R^{208}$, $R^{210}$, $R^{21}$, $R^{213}$, and $R^{215}$ are preferably hydrogen. The phenyl group having a substituent has one or two substituents, which each independently represent any of an alkyl group having 1 to 6 carbon atoms, an alicyclic group having 3 to 10 carbon atoms, and a substituted or unsubstituted aromatic hydrocarbon group having 6 to 14 carbon atoms in a ring.

The organic compound represented by General Formula ($G_{e1}$2) has a plurality of hydrocarbon groups selected from an alkyl group having 1 to 6 carbon atoms and an alicyclic group having 3 to 10 carbon atoms, and carbon atoms forming a bond by sp³ hybrid orbitals account for higher than or equal to 10% and lower than or equal to 60% of total carbon atoms in molecules of the organic compound.

In the organic compound represented by General Formula ($G_{e1}$1) or ($G_{e1}$2), the phenyl group having a substituent is preferably a group represented by Formula ($G_{e1}$1-2).

[Chemical Formula 3]

($G_{e1}$1-2)

In the formula, α represents a substituted or unsubstituted phenylene group and is preferably a meta-substituted phenylene group. In the case where the meta-substituted phenylene group has a substituent, the substituent is also preferably meta-substituted. The substituent is preferably an alkyl group having 1 to 6 carbon atoms or an alicyclic group having 3 to 10 carbon atoms, further preferably an alkyl group having 1 to 6 carbon atoms, and still further preferably a t-butyl group.

$R^{220}$ represents an alkyl group having 1 to 6 carbon atoms, an alicyclic group having 3 to 10 carbon atoms, or a substituted or unsubstituted aromatic hydrocarbon group having 6 to 14 carbon atoms in a ring.

In addition, j and k each represent 1 or 2. In the case where j is 2, a plurality of α may be the same or different from each other. In the case where k is 2, a plurality of $R^{220}$ may be the same or different from each other. $R^{220}$ is preferably a phenyl group, further preferably a phenyl group that has an alkyl group having 1 to 6 carbon atoms or an alicyclic group having 3 to 10 carbon atoms at one or both of the two meta-positons. The substituent at one or both of the two meta-positons of the phenyl group is preferably an alkyl group having 1 to 6 carbon atoms, further preferably a t-butyl group.

Note that in the low refractive index layer 156, a mixed material of the organic compound and a metal complex of an alkali metal or an alkaline earth metal is preferably used as the low refractive index material having an electron-transport property. A heterocyclic compound having a diazine skeleton, a heterocyclic compound having a triazine skeleton, and a heterocyclic compound having a pyridine skeleton are preferable in terms of driving lifetime because they are likely to form an exciplex with an organometallic complex of an alkali metal with stable energy (the emission wavelength of the exciplex easily becomes longer). In particular, the heterocyclic compound having a diazine skeleton or the heterocyclic compound having a triazine skeleton has a deep LUMO level and thus is preferred for stabilization of energy of an exciplex.

Note that the organometallic complex of an alkali metal is preferably a metal complex of sodium or lithium. Alternatively, the organometallic complex of an alkali metal preferably has a ligand having a quinolinol skeleton. Further preferably, the organometallic complex of an alkali metal is preferably a lithium complex having an 8-quinolinolato structure or a derivative thereof. The derivative of a lithium complex having an 8-quinolinolato structure is preferably a lithium complex having an 8-quinolinolato structure having an alkyl group, and further preferably has a methyl group.

It is possible that 8-quinolinolato-lithium having an alkyl group be a metal complex with a low refractive index. Specifically, the ordinary refractive index of the metal complex in a thin film state with respect to light with a wavelength in the range from 455 nm to 465 nm can be higher than or equal to 1.45 and lower than or equal to 1.70, and the ordinary refractive index thereof with respect to light with a wavelength of 633 nm can be higher than or equal to 1.40 and lower than or equal to 1.65.

Specific examples of the metal complex include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product, a 5-methyl-substituted product, or 6-methyl-substituted product) thereof is also preferably used, for example. In particular, the use of an alkali metal complex having an 8-quinolinolato structure having an alkyl group at the 6 position results in lowering the driving voltage of a light-emitting device.

The structure where the first electrode 101 is a cathode and the second electrode 102 is an anode may also be employed. In such a case, the carrier-transport region 150 serves as the electron-transport region, the carrier-transport region 151 serves as the hole-transport region, and the low refractive index layer 156 is provided in the hole-transport region.

In the case where the low refractive index layer 156 is provided in the hole-transport region, the low refractive index layer 156 is formed as a layer containing a low refractive index material having a hole-transport property. The following substances can be given as examples of the low refractive index material having a hole-transport property and a refractive index in the above-described range. Note that substances other than those described below can also be used similarly as long as they are substances which a film with a hole mobility of $1\times10^{-7}$ cm$^2$/Vs or higher and a refractive index in the above-described range can be formed of.

Thus, an example of the low refractive index material having a hole-transport property is a monoamine compound including a first aromatic group, a second aromatic group, and a third aromatic group, in which the first aromatic group, the second aromatic group, and the third aromatic group are bonded to the same nitrogen atom.

In the monoamine compound, the proportion of carbon atoms each forming a bond by the sp$^3$ hybrid orbitals to the total number of carbon atoms in the molecule is preferably higher than or equal to 23% and lower than or equal to 55%. In addition, it is preferable that the integral value of signals at lower than 4 ppm exceed the integral value of signals at 4 ppm or higher in the results of $^1$H-NMR measurement conducted on the monoamine compound.

The monoamine compound preferably has at least one fluorene skeleton. One or more of the first aromatic group, the second aromatic group, and the third aromatic group are preferably a fluorene skeleton. Since fluorenylamine has an effect of increasing the HOMO level, bonding of three fluorenes to nitrogen of the monoamine compound possibly increases the HOMO level significantly. In that case, a difference in HOMO level between the monoamine compound and peripheral materials becomes large, which might affect driving voltage, reliability, and the like. Thus, any one or two of the first to third aromatic groups are further preferably fluorene skeletons.

Examples of the above-described material include organic compounds having structures represented by General Formulae ($G_{h1}$1) to ($G_{h1}$4) shown below.

[Chemical Formula 4]

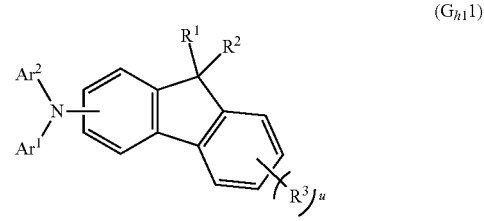

($G_{h1}$1)

In General Formula ($G_{h1}$1), Ar$^1$ and Ar$^2$ each independently represent a substituent with a benzene ring or a substituent in which two or three benzene rings are bonded to each other. Note that one or both of Ar$^1$ and Ar$^2$ have one or more hydrocarbon groups each having 1 to 12 carbon atoms each forming a bond only by the sp$^3$ hybrid orbitals. The total number of carbon atoms contained in all of the hydrocarbon groups bonded to Ar$^1$ and Ar$^2$ is 8 or more and the total number of carbon atoms contained in all of the hydrocarbon groups bonded to Ar$^1$ or Ar$^2$ is 6 or more. Note that in the case where a plurality of straight-chain alkyl groups each having one or two carbon atoms are bonded to Ar$^1$ or Ar$^2$ as the hydrocarbon groups, the straight-chain alkyl groups may be bonded to each other to form a ring.

[Chemical Formula 5]

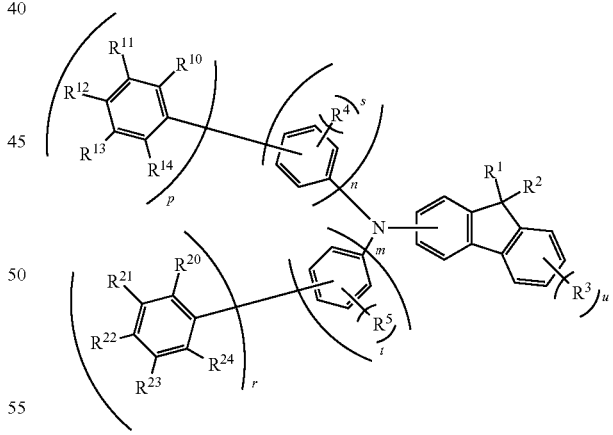

($G_{h1}$2)

In General Formula ($G_{h1}$2), m and r each independently represent 1 or 2 and m+r is 2 or 3. Furthermore, t represents an integer of 0 to 4 and is preferably 0. R$^5$ represents hydrogen or a hydrocarbon group having 1 to 3 carbon atoms. When m is 2, the kind and number of substituents and the position of bonds included in one phenylene group may be the same as or different from those of the other phenylene group; and when r is 2, the kind and number of substituents and the position of bonds included in one phenyl group may be the same as or different from those of the other phenyl group. In the case where t is an integer of 2 to 4, $R^5$s may be the same as or different from each other; and adjacent groups (adjacent $R^5$s) may be bonded to each other to form a ring.

[Chemical Formula 6]

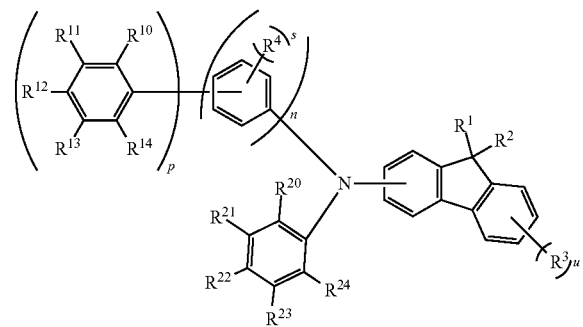

($G_{h1}3$)

In General Formulae ($G_{h1}2$) and ($G_{h1}3$), n and p each independently represent 1 or 2 and n+p is 2 or 3. In addition, s represents an integer of 0 to 4 and is preferably 0. $R^4$ represents hydrogen or a hydrocarbon group having 1 to 3 carbon atoms. When n is 2, the kind and number of substituents and the position of bonds in one phenylene group may be the same as or different from those of the other phenylene group; and when p is 2, the kind and number of substituents and the position of bonds in one phenyl group may be the same as or different from those of the other phenyl group. In the case where s is an integer of 2 to 4, $R^4$s may be the same as or different from each other.

[Chemical Formula 7]

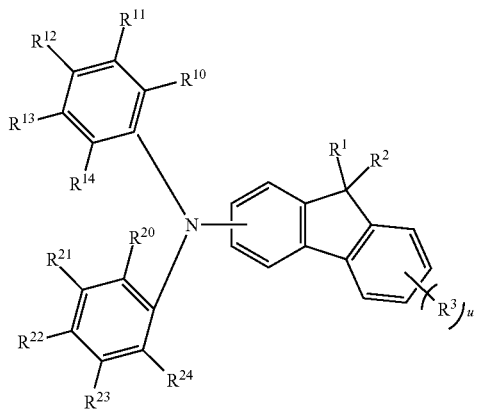

($G_{h1}4$)

In General Formulae ($G_{h1}2$) to ($G_{h1}4$), $R^{10}$ to $R^{14}$ and $R^{20}$ to $R^{24}$ each independently represent hydrogen or a hydrocarbon group having 1 to 12 carbon atoms each forming a bond only by the sp$^3$ hybrid orbitals. Note that at least three of $R^{10}$ to $R^{14}$ and at least three of $R^{20}$ to $R^{24}$ are preferably hydrogen. As the hydrocarbon group having 1 to 12 carbon atoms each forming a bond only by the sp$^3$ hybrid orbitals, a tert-butyl group and a cyclohexyl group are preferable. The total number of carbon atoms contained in $R^{10}$ to $R^{14}$ and $R^{20}$ to $R^{24}$ is 8 or more and the total number of carbon atoms contained in either $R^{10}$ to $R^{14}$ or $R^{20}$ to $R^{24}$ is 6 or more. Note that adjacent groups of $R^4$, $R^{10}$ to $R^{14}$ and $R^{20}$ to $R^{24}$ may be bonded to each other to form a ring.

In General Formulae ($G_{h1}1$) to ($G_{h1}4$), each u independently represents an integer of 0 to 4 and is preferably 0. Note that in the case where u is an integer of 2 to 4, $R^3$s may be the same as or different from each other. In addition, $R^1$, $R^2$, and $R^3$ each independently represent an alkyl group having 1 to 4 carbon atoms and $R^1$ and $R^2$ may be bonded to each other to form a ring.

An arylamine compound that has at least one aromatic group having first to third benzene rings and at least three alkyl groups can also be given as the low refractive index material having a hole-transport property. Note that the first to third benzene rings are bonded in this order and the first benzene ring is directly bonded to nitrogen of amine.

The first benzene ring may further include a substituted or unsubstituted phenyl group and preferably includes an unsubstituted phenyl group. Furthermore, the second benzene ring or the third benzene ring may include a phenyl group substituted by an alkyl group.

Note that hydrogen is not directly bonded to carbon atoms at 1- and 3-positions in two or more of, preferably all of the first to third benzene rings, and the carbon atoms are bonded to any of the first to third benzene rings, the phenyl group substituted by the alkyl group, the at least three alkyl groups, and the nitrogen of the amine.

It is preferable that the arylamine compound further include a second aromatic group. It is preferable that the second aromatic group have an unsubstituted monocyclic ring or a substituted or unsubstituted bicyclic or tricyclic condensed ring; in particular, it is further preferable that the second aromatic group be a group having a substituted or unsubstituted bicyclic or tricyclic condensed ring where the number of carbon atoms forming the ring is 6 to 13. It is still further preferable that the second aromatic group be a group including a fluorene ring. Note that a dimethylfluorenyl group is preferable as the second aromatic group.

It is preferable that the arylamine compound further include a third aromatic group. The third aromatic group is a group having 1 to 3 substituted or unsubstituted benzene rings.

It is preferable that the at least three alkyl groups and the alkyl group substituted for the phenyl group be each a chain alkyl group having 2 to 5 carbon atoms. In particular, as the alkyl group, a chain alkyl group having a branch formed of 3 to 5 carbon atoms is preferable, and a t-butyl group is further preferable.

Examples of the above-described material having a hole-transport property include organic compounds having structures represented by General Formulae ($G_{h2}1$) to ($G_{h2}3$) shown below.

[Chemical Formula 8]

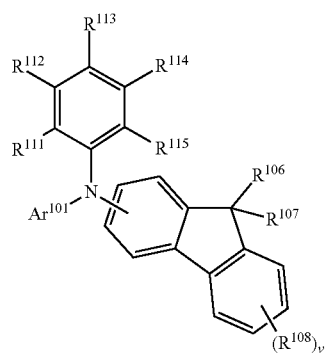

($G_{h2}1$)

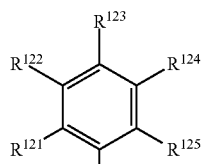

(g1)

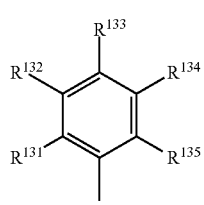

(g2)

Note that in General Formula (G$_{h2}$1), Ar$^{1'}$ represents a substituted or unsubstituted benzene ring or a substituent in which two or three substituted or unsubstituted benzene rings are bonded to one another.

[Chemical Formula 9]

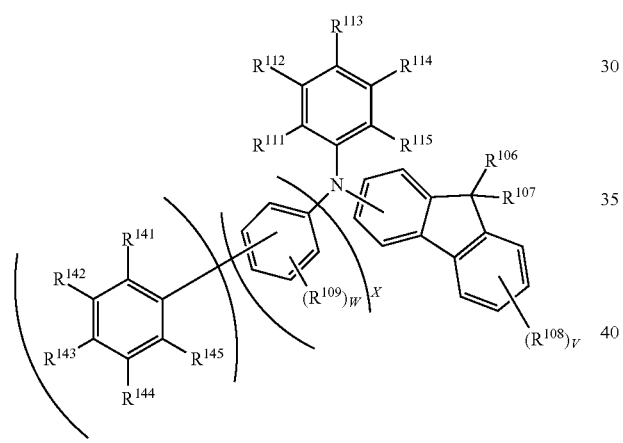

(G$_{h2}$2)

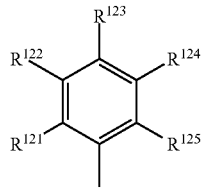

(g1)

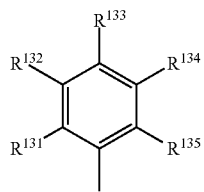

(g2)

Note that in General Formula (G$_{h2}$2), x and y each independently represent 1 or 2 and x+y is 2 or 3. Furthermore, R$^{109}$ represents an alkyl group having 1 to 4 carbon atoms, and w represents an integer of 0 to 4. R$^{141}$ to R$^{145}$ each independently represent any one of hydrogen, an alkyl group having 1 to 6 carbon atoms, and a cycloalkyl group having 5 to 12 carbon atoms. When w is an integer of 2 or more, R$^{109}$s may be the same as or different from each other. When x is 2, the kind and number of substituents and the position of bonds included in one phenylene group may be the same as or different from those of the other phenylene group. When y is 2, the kind and number of substituents and the position of bonds included in one phenyl group including R$^{141}$ to R$^{145}$ may be the same as or different from those of the other phenyl group including R$^{141}$ to R$^{145}$.

[Chemical Formula 10]

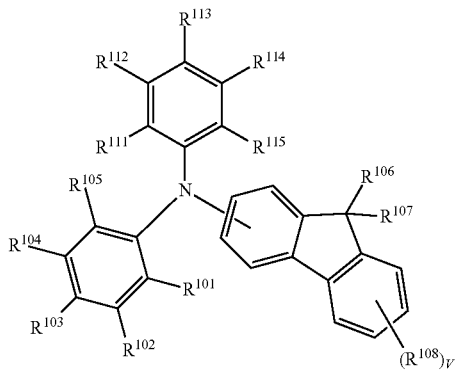

(G$_{h2}$3)

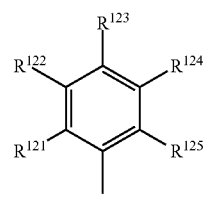

(g1)

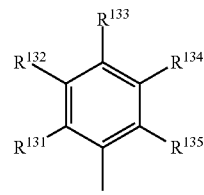

(g2)

In General Formula (G$_{h2}$3), R$^{101}$ to R$^{105}$ each independently represent any one of hydrogen, an alkyl group having 1 to 6 carbon atoms, a cycloalkyl group having 6 to 12 carbon atoms, and a substituted or unsubstituted phenyl group.

In General Formulae (G$_{h2}$1) to (G$_{h2}$3), R$^{106}$, R$^{107}$, and R$^{108}$ each independently represent an alkyl group having 1 to 4 carbon atoms, and v represents an integer of 0 to 4. Note that when v is 2 or more, R$^{108}$s may be the same as or different from each other. One of R$^{111}$ to R$^{115}$ represents a substituent represented by General Formula (g1), and the others each independently represent any one of hydrogen, an alkyl group having 1 to 6 carbon atoms, and a substituted or unsubstituted phenyl group. In General Formula (g1), one of R$^{121}$ to R$^{125}$ represents a substituent represented by General Formula (g2), and the others each independently represent any one of hydrogen, an alkyl group having 1 to 6 carbon atoms, and a phenyl group substituted by an alkyl group having 1 to 6 carbon atoms. In General Formula (g2), R$^{131}$ to R$^{135}$ each independently represent any one of hydrogen, an alkyl group having 1 to 6 carbon atoms, and a phenyl group substituted by an alkyl group having 1 to 6 carbon atoms. Note that at least three of $R^{111}$ to $R^{115}$, $R^{121}$ to $R^{125}$, and $R^{131}$ to $R^{135}$ are each an alkyl group having 1 to 6 carbon atoms; the number of substituted or unsubstituted phenyl groups in $R^{11}$ to $R^{115}$ is one or less; and the number of phenyl groups substituted by an alkyl group having 1 to 6 carbon atoms in $R^{121}$ to $R^{125}$ and $R^{131}$ to $R^{135}$ is one or less. In at least two combinations of the three combinations $R^{112}$ and $R^{114}$, $R^{122}$ and $R^{124}$, and $R^{132}$ and $R^{134}$, at least one R represents any of the substituents other than hydrogen.

Note that the light-emitting device 600 preferably includes a second low refractive index layer 157 in the carrier-transport region 150, which is a region between the light-emitting layer 113 and the first electrode 101, as illustrated in FIG. 1B. The existence of the second low refractive index layer 157 enables the light-emitting device to have higher emission efficiency. In the case where the carrier-transport region 150 is the hole-transport region, the second low refractive index layer 157 is formed using the low refractive index material having a hole-transport property. In the case where the carrier-transport region 150 is the electron-transport region, the second low refractive index layer 157 is formed using the low refractive index material having an electron-transport property.

Here, in blue light-emitting devices using the cap layer 155, a change in blue index (BI) depending on the presence or absence of the low refractive index layer 156 and the second low refractive index layer 157 with a varying refractive index of the cap layer 155 was calculated.

Note that the blue index (BI) is a value obtained by dividing current efficiency (cd/A) by chromaticity y, which is calculated with the CIE1931 color system, and is one of the indicators of characteristics of blue light emission. As the chromaticity y is smaller, the color purity of blue light emission tends to be higher. With high color purity, a wide range of blue can be expressed even with a small number of luminance components; hence, using blue light emission with high color purity reduces the luminance needed for expressing blue, leading to lower power consumption. Thus, BI that is based on chromaticity y, which is one of the indicators of color purity of blue, is suitably used as a means for showing efficiency of blue light emission. The light-emitting device with higher BI can be regarded as a blue light-emitting device having higher efficiency for a display.

The calculation was performed using an organic device simulator (a semiconducting emissive thin film optics simulator: setfos, produced by Cybernet Systems Co., Ltd.). A light-emitting region was fixed to the center of the light-emitting layer, a light-emitting material was assumed to have no alignment, and the exciton generation efficiency and the internal quantum efficiency were assumed to be 100%. Note that quenching due to the Purcell effect was taken into consideration in the calculation. The following table shows the stacked structures of the light-emitting devices used for the calculation and the values of ordinary refractive index and thickness used for the calculation. As shown in the table, a light-emitting device 02 and a light-emitting device 04 have a device structure including the low refractive index layer in the carrier-transport region 151, and a light-emitting device 03 and the light-emitting device 04 have a device structure including the second low refractive index layer in the carrier-transport region 150.

TABLE 1

| | | Light-emitting device 01 | Light-emitting device 02 | Light-emitting device 03 | Light-emitting device 04 |
|---|---|---|---|---|---|
| Cap layer | | sweep | | | |
| Second electrode | Transflective electrode | AgMg (15 nm) | | | |
| | Electron-transport layer | 1.96 | 1.68 | 1.96 | 1.68 |
| | Hole-blocking layer | 1.89 (10 nm) | | | |
| | Light-emitting layer | 1.97 (25 nm) | | | |
| | Electron-blocking layer | 2.00 (10 nm) | | | |
| | Hole-transport layer | 1.94 | 1.94 | 1.71 | 1.71 |
| First electrode | Transparent electrode | ITSO (10 nm) | | | |
| | Reflective electrode | Ag (100 nm) | | | |

As the emission spectrum of the light-emitting devices, a PL spectrum of a sample was employed; the sample was formed by co-evaporation of 9-(1-naphthyl)-10-[4-(2-naphthyl)phenyl]anthracene (abbreviation: αN-βNPAnth) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) to a thickness of 50 nm in a weight ratio of αN-βNPAnth to 3,10PCA2Nbf(IV)-02 of 1:0.015 on a quartz substrate. The emission peak wavelength λ was set to 458 nm.

The thicknesses of the cap layer, the electron-transport layer, and the hole-transport layer were optimized such that the BI in each condition was maximized. Note that the thickness of the hole-transport layer was optimized such that the hole-transport layer was positioned in the vicinity of ¾λ from the surface on the EL layer side of the reflective electrode, and the thickness of the electron-transport layer was optimized such that the electron-transport layer was positioned in the vicinity of ¼λ from the surface on the EL layer side of the transflective electrode.

Figure 17A:
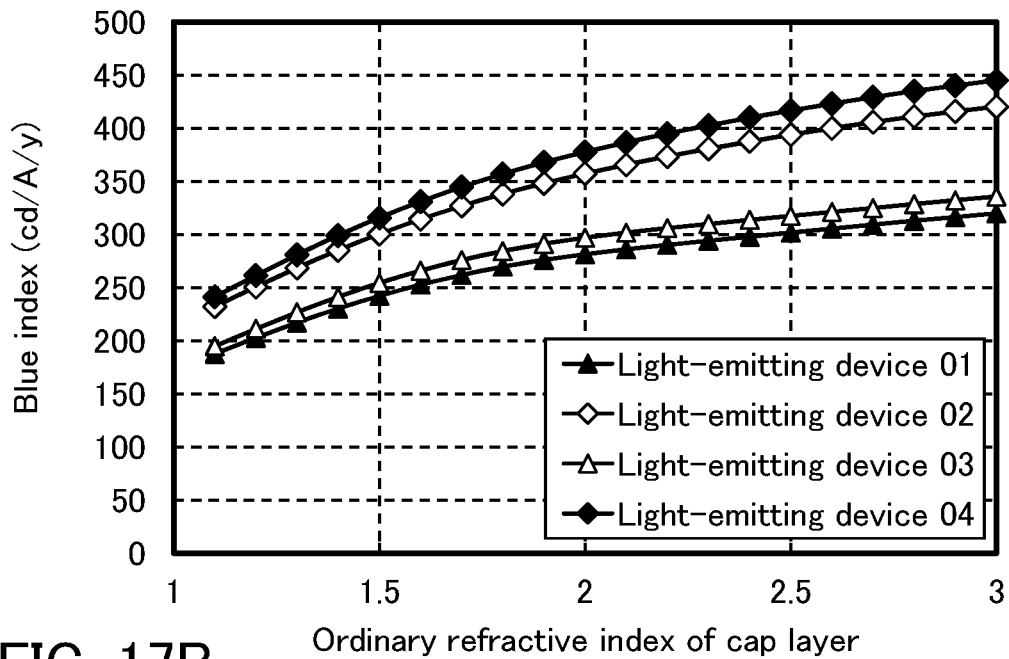
FIGS. 17A and 17B show a change in blue index (BI) depending on the presence or absence of low refractive index layers in blue light-emitting devices with a varying ordinary refractive index of a cap layer.
Figure 17B:
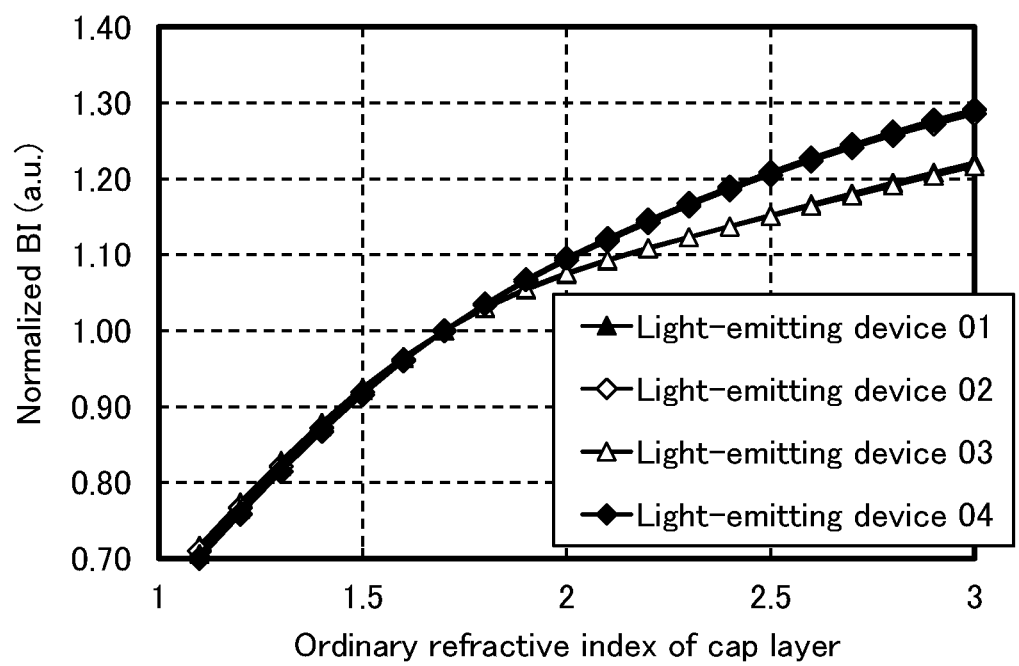

FIG. 17A shows the calculation results. FIG. 17B is a graph where the BI when the ordinary refractive index of the cap layer is 1.70 is set to 1.

In FIGS. 17A and 17B, the BI is improved in each light-emitting device including the low refractive index layer and/or the second low refractive index layer. In particular, the light-emitting device 02 and the light-emitting device 04, which include the low refractive index layer in the carrier-transport region 151 between the light-emitting layer 113 and the second electrode 102, show significant improvement rates. In addition, FIG. 17B demonstrates that the light-emitting device 02 and the light-emitting device 04 including the low refractive index layer in the carrier-transport region 151 have apparently high improvement rates in BI in a region where the refractive index of the cap layer is high. In other words, a significant effect can be obtained by the combinational use of the structure provided with the low refractive index layer in the carrier-transport region 151 and the cap layer containing the high refractive index material.

Note that the high refractive index material is contained in the cap layer at 80% or more, and the low refractive index material is contained in the low refractive index layer and the second low refractive index layer at 80% or more. In the case where the layers are formed of a mixed material containing a plurality of materials, materials having ordinary refractive indexes in the predetermined range account for 80% or more in total in each of the layers.

A layer containing a material with a predetermined ordinary refractive index or ordinary extinction coefficient can be read as a layer having the predetermined ordinary refractive index or ordinary extinction coefficient.

In the case of calculating the refractive index and extinction coefficient of a layer formed of a mixed material, they may be directly measured or they may be calculated by multiplying the ordinary refractive indexes of films that are formed of only the individual materials by their respective percentages in the mixed material and summing up the products. Note that in the case where precise percentages cannot be obtained, a value obtained by dividing each of the ordinary refractive indexes by the number of compositional components and summing up the quotients may be used.

Next, examples of other structures and materials of the light-emitting device 600 of one embodiment of the present invention will be described. The light-emitting device of one embodiment of the present invention includes, as described above, the EL layer 103 including a plurality of layers between the first electrode 101 and the light-transmitting second electrode 102, and the EL layer 103 includes at least the light-emitting layer 113 containing a light-emitting material and the low refractive index layer. The low refractive index layer is preferably positioned between the light-emitting layer 113 and the second electrode.

One of the first electrode 101 and the second electrode 102 serves as an anode and the other serves as a cathode. The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, indium oxide containing tungsten oxide and zinc oxide (IWZO) can be deposited by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used as a material of the first electrode 101. Graphene can also be used as a material of the anode. Note that when a composite material described later is used for a layer that is in contact with the anode in the EL layer 103 (the layer is typically a hole-injection layer 111), an electrode material can be selected regardless of the work function.

As a substance of the cathode, any of metals, alloys, and electrically conductive compounds with a low work function (specifically, lower than or equal to 3.8 eV), mixtures thereof, and the like is preferably used. Specific examples of such a cathode material include elements belonging to Group 1 and Group 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode and the electron-transport layer, any of a variety of conductive materials such as Al, Ag, ITO, or indium oxide-tin oxide containing silicon or silicon oxide can be used for the cathode regardless of the work function.

Since the second electrode 102 is the light-transmitting electrode in one embodiment of the present invention, a layer having reflectivity with respect to light emitted by the light-emitting device 600 is preferably included in the first electrode 101. Stacked layers of the layer having reflectivity and a layer formed using a light-transmitting material among the materials given above as preferable materials for the anode or cathode may be used as well.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

It is preferable that the EL layer 103 have a stacked-layer structure. Except for the above-described light-emitting layer 113, there is no particular limitation on the stacked-layer structure, and various functional layers such as a hole-injection layer, a hole-transport layer, an electron-transport layer, an electron-injection layer, a carrier-blocking layer (e.g., a hole-blocking layer and an electron-blocking layer), an exciton-blocking layer, an intermediate layer, and a charge-generation layer can be used. It should be noted that any of the layers or part of any of the layers is a low refractive index layer in one embodiment of the present invention. Furthermore, some of the layers may be low refractive index layers.

In this embodiment, a structure in which the hole-injection layer 111, a hole-transport layer 112, the light-emitting layer 113, an electron-transport layer 114, and an electron-injection layer 115 are stacked from the first electrode 101 (anode) side as illustrated in FIG. 1C is described. Although a case where the second electrode 102 is a cathode is described as an example in FIG. 1C, the second electrode 102 may be an anode. In such a case, the stacking order of the EL layer 103 is reversed from that of FIG. 1C, that is, the electron-injection layer 115, the electron-transport layer 114, the light-emitting layer 113, the hole-transport layer 112, and the hole-injection layer 111 are stacked from the first electrode 101 side.

Note that in FIG. 1C, the carrier-transport region 150 is the hole-transport region and includes the hole-injection layer 111 and the hole-transport layer 112. Other than these, an electron-blocking layer or the like may be included in the hole-transport region. Furthermore, in FIG. 1C, the carrier-transport region 151 is the electron-transport region and includes the electron-transport layer 114 and the electron-injection layer 115. Other than these, a hole-blocking layer or the like may be included in the electron-transport region.

The hole-injection layer 111 is provided in contact with the anode and has a function of facilitating injection of holes into the EL layer 103. The hole-injection layer can be formed using a phthalocyanine-based complex compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or 4,4'-bis(N-{4-[N'-(3-methylphenyl)-N'-phenylamino]phenyl}-N-phenylamino)biphenyl (abbreviation: DNTPD), or a high molecular compound such as poly(3,4-ethylenedioxythiophene)/poly(styrenesulfonic acid) (PEDOT/PSS).

The hole-injection layer may be formed using a substance having an acceptor property. Examples of the substance having an acceptor property include an organic compound having an electron-withdrawing group (a halogen group or a cyano group), such as 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), or 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can also be used, other than the above-described organic compounds. The substance having an acceptor property can extract electrons from an adjacent hole-transport layer (or hole-transport material) by the application of voltage between the electrodes.

The hole-injection layer may be formed using a composite material containing any of the aforementioned materials having an acceptor property and a material having a hole-transport property. As the material having a hole-transport property that is used in the composite material, any of a variety of organic compounds such as aromatic amine compounds, heteroaromatic compounds, aromatic hydrocarbons, and high molecular compounds (e.g., oligomers, dendrimers, or polymers) can be used. Note that the material having a hole-transport property that is used in the composite material preferably has a hole mobility of 1×10$^{-6}$ cm$^2$Vs or higher. The material having a hole-transport property that is used in the composite material is preferably a compound having a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further condensed to the carbazole ring or the dibenzothiophene ring is preferable.

The material having a hole-transport property further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the material having a hole-transport property preferably has an N,N-bis(4-biphenyl) amino group because a light-emitting device having a long lifetime can be fabricated. Specific examples of the material having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9- dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

As the material having a hole-transport property, the following aromatic amine compounds can also be used: N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

As the material having a hole-transport property, any of the above-described low refractive index materials having a hole-transport property can be used as well. In this case, the hole-injection layer can be a low refractive index layer.

Further preferably, the material having a hole-transport property that is used in the composite material has a relatively deep HOMO level higher than or equal to −5.7 eV and lower than or equal to −5.4 eV. When the material having a hole-transport property that is used in the composite material has a relatively deep HOMO level, holes can be easily injected into the hole-transport layer 112 to easily provide a light-emitting device having a long lifetime. In addition, when the material having a hole-transport property that is used in the composite material has a relatively deep HOMO level, induction of holes can be inhibited properly so that the light-emitting device can have a longer lifetime.

Note that mixing the above composite material with a fluoride of an alkali metal or an alkaline earth metal (the proportion of fluorine atoms in a layer using the mixed material is preferably higher than or equal to 20%) can lower the refractive index of the layer. Also in this case, the hole-injection layer can be a low refractive index layer.

The formation of the hole-injection layer 111 can improve the hole-injection property, offering the light-emitting device with a low driving voltage.

Among substances having an acceptor property, the organic compound having an acceptor property is easy to use because it is easily deposited by vapor deposition.

The hole-transport layer 112 is formed using a material having a hole-transport property. The material having a hole-transport property preferably has a hole mobility higher than or equal to $1\times10^{-6}$ cm$^2$/Vs. The hole-transport layer 112 can be formed of a single layer or a plurality of layers using any of the aforementioned materials having a hole-transport property that can be used in the composite material of the hole-injection layer. As the material having a hole-transport property, any of the above-described low refractive index materials having a hole-transport property can be used as well. In this case, the hole-transport layer can be a low refractive index layer.

An electron-blocking layer may be provided between the hole-transport layer 112 and the light-emitting layer 113. For the electron-blocking layer, a substance having a LUMO level higher than a host material of the light-emitting layer 113 by 0.25 eV or more among the above-described materials that can be used as the material having a hole-transport property in the hole-transport layer is preferably used.

The light-emitting layer 113 preferably includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used. Note that one embodiment of the present invention is more suitably used in the case where the light-emitting layer 113 is a layer that exhibits fluorescence, specifically, blue fluorescence.

Examples of the material that can be used as a fluorescent substance in the light-emitting layer 113 are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N'-bis[4-(9-phenyl-9H-fluoren-9-yl)phenyl]pyrene-1,6-diamine (abbreviation: 1,6FLPAPm), N,N-bis(3-methylphenyl)-N,N'-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N- diphenyl-N,N'-(1,6-pyrene-diyl)bis[(6-phenylbenzo[b] naphtho[1,2-d]furan)-8-amine] (abbreviation:1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). Condensed aromatic diamine compounds typified by pyrenediamine compounds such as 1,6FLPAPrn, 1,6mMemFLPAPm, and 1,6BnfAPrn-03 are particularly preferable because of their high hole-trapping properties, high emission efficiency, or high reliability.

Examples of the material that can be used when a phosphorescent substance is used as the light-emitting substance in the light-emitting layer 113 are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium (III) (abbreviation: [Ir(Mptz)$_3$]), or tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato] iridium(III) (abbreviation: [Ir(Mptz1-mp)$_3$]) or tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium (III) (abbreviation: [Ir(iPrpmi)$_3$]) or tris[3-(2,6-dimethylphenyl)-7-methylimidazo[1,2-f]phenanthridinato]iridium (III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^2$']iridium (III) tetrakis(1-pyrazolyl)borate (abbreviation: FIr6), bis[2-(4',6'-difluorophenyl)pyridinato-N,C$^2$]iridium(III) picolinate (abbreviation: FIrpic), bis{2-[3',5'-bis(trifluoromethyl) phenyl]pyridinato-N,C$^{2'}$}iridium(III) picolinate (abbreviation: [Ir(CF$_3$ppy)$_2$(pic)]), or bis[2-(4',6'-difluorophenyl)pyridinato-N,C$^{2'}$]iridium(III) acetylacetonate (abbreviation: FIr(acac)). These compounds exhibit blue phosphorescence and have an emission peak in the wavelength range from 440 nm to 520 nm.

Other examples include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato) bis(4,6-diphenylpyrimidinato)iridium(III) (abbreviation: [Ir (dppm)$_2$(acac)]); an organometallic iridium complex having a pyrazine skeleton, such as (acetylacetonato)bis(3,5-dimethyl-2-phenylpyrazinato)iridium(III) (abbreviation: [Ir (mppr-Me)$_2$(acac)]) or (acetylacetonato)bis(5-isopropyl-3-methyl-2-phenylpyrazinato)iridium(III) (abbreviation: [Ir (mppr-iPr)$_2$(acac)]); an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), [2-d3-methyl-8-(2-pyridinyl-κN)benzofuro[2,3-b]pyridine-κC]bis [2-(5-d3-methyl-2-pyridinyl-κN2)phenyl-κC]iridium(III) (abbreviation: [Ir(5mppy-d3)$_2$(mbfpypy-d3)]), [2-(methyl-d3)-8-[4-(1-methylethyl-1-d)-2-pyridinyl-κN]benzofuro[2, 3-b]pyridin-7-yl-κC]bis[5-(methyl-d3)-2-[5-(methyl-d3)-2-pyridinyl-κN]phenyl-κC]iridium(III) (abbreviation: Ir(5mtpy-d6)$_2$(mbfpypy-iPr-d4)), [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$ (mbfpypy-d3)]), or [2-(4-methyl-5-phenyl-2-pyridinyl-N) phenyl-κC]bis[2-(2-pyridinyl-N)phenyl-κC]iridium(III) (abbreviation: [Ir(ppy)$_2$(mdppy)]); and a rare earth metal complex such as tris(acetylacetonato) (monophenanthroline)terbium(III) (abbreviation: [Tb(acac)$_3$(Phen)]). These are mainly compounds that exhibit green phosphorescence and have an emission peak in the wavelength range from 500 nm to 600 nm. Note that organometallic iridium complexes having a pyrimidine skeleton have distinctively high reliability or emission efficiency and thus are particularly preferable.

Other examples include an organometallic iridium complex having a pyrimidine skeleton, such as (diisobutyryl-methanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), or bis[4, 6-di(naphthalen-1-yl)pyrimidinato](dipivaloylmethanato) iridium(III) (abbreviation: [Ir(d1npm)$_2$(dpm)]); an organometallic iridium complex having a pyrazine skeleton, such as (acetylacetonato)bis(2,3,5-triphenylpyrazinato) iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir (Fdpq)$_2$(acac)]); an organometallic iridium complex having a pyridine skeleton, such as tris(1-phenylisoquinolinato-N, C$^{2'}$)iridium(III) (abbreviation: [Ir(piq)$_3$]) or bis(1-phenylisoquinolinato-N,C$^{2'}$)iridium(III) acetylacetonate (abbreviation: [Ir(piq)$_2$(acac)]); a platinum complex such as 2,3,7,8, 12,13,17,18-octaethyl-21H,23H-porphyrinplatinum(II) (abbreviation: PtOEP); and a rare earth metal complex such as tris(1,3-diphenyl-1,3-propanedionato)(monophenanthroline)europium(III) (abbreviation: [Eu(DBM)$_3$(Phen)]) or tris [1-(2-thenoyl)-3,3,3-trifluoroacetonato](monophenanthroline)europium(III) (abbreviation: [Eu(TTA)$_3$(Phen)]). These compounds exhibit red phosphorescence and have an emission peak in the wavelength range from 600 nm to 700 nm. Organometallic iridium complexes having a pyrazine skeleton can provide red light emission with favorable chromaticity.

Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formula 11]

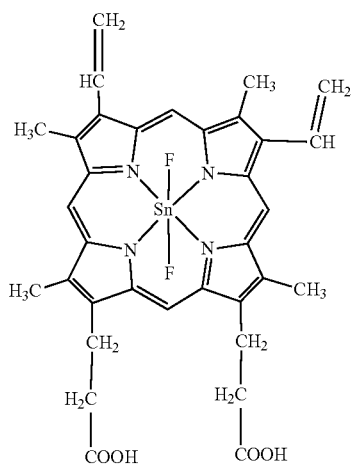

SnF$_2$(Proto IX)

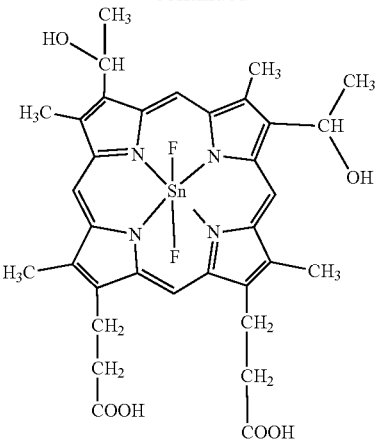

SnF$_2$(Hemato IX)

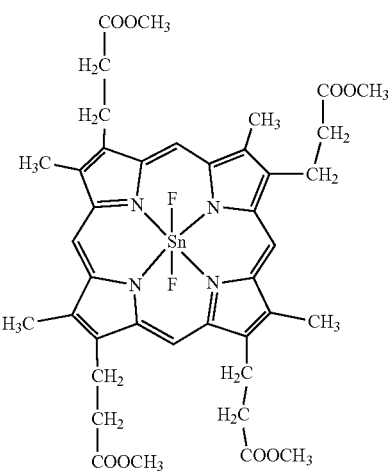

SnF$_2$(Copro III-4Me)

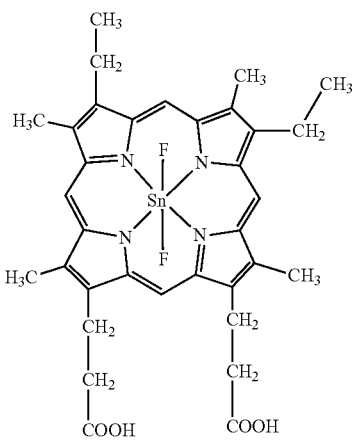

SnF$_2$(Meso IX)

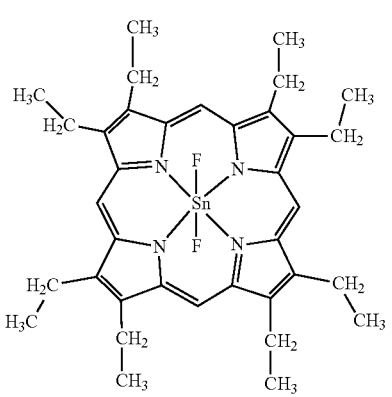

SnF$_2$(OEP)

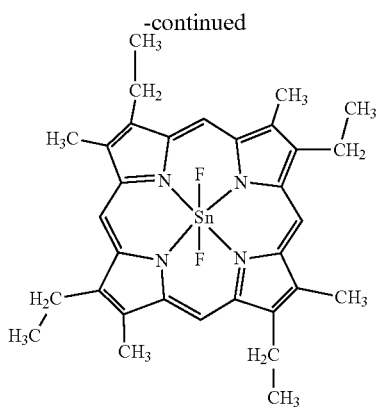

SnF$_2$(Etio I)

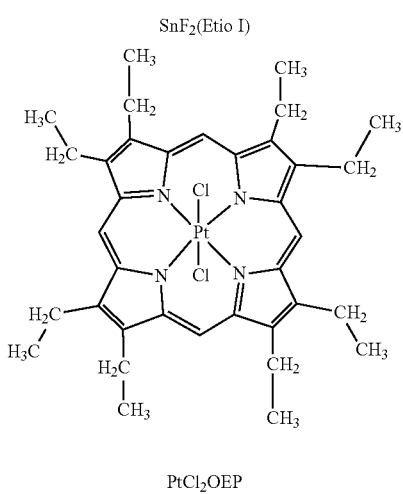

PtCl$_2$OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 12]

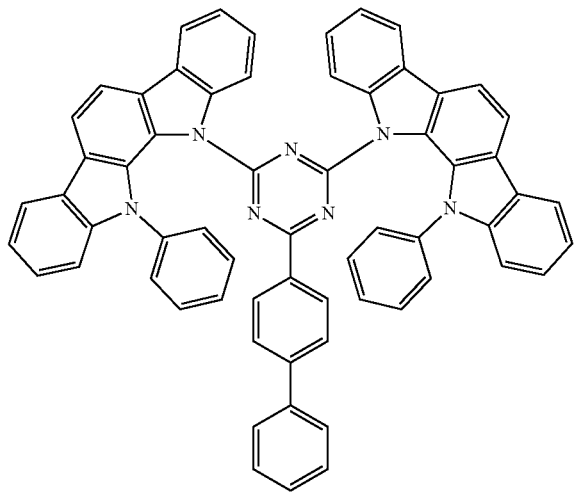

PIC-TRZ

-continued

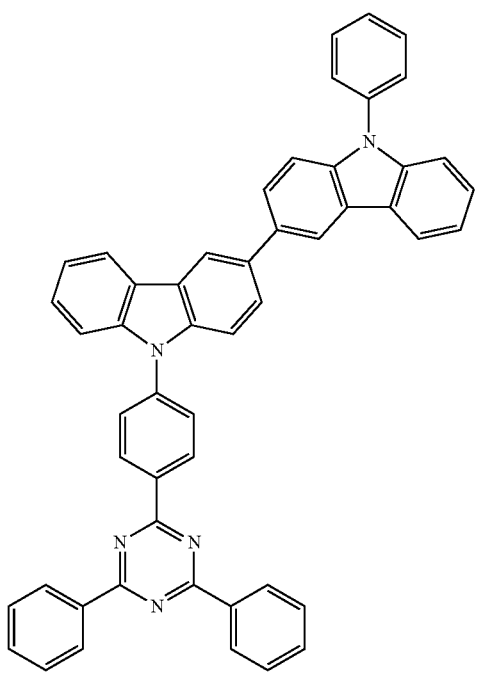

PCCzPTzn

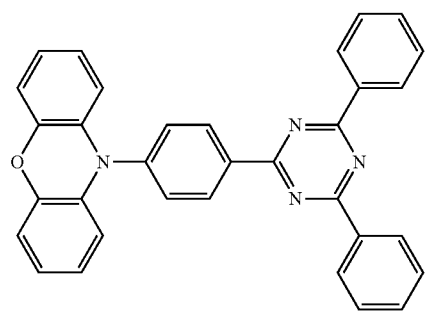

PXZ-TRZ

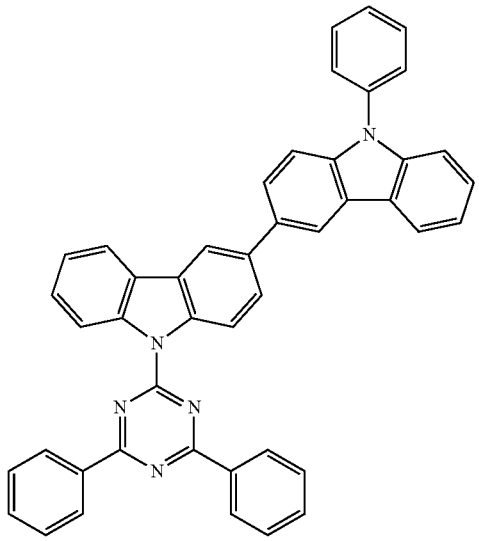

PCCzTzn

-continued

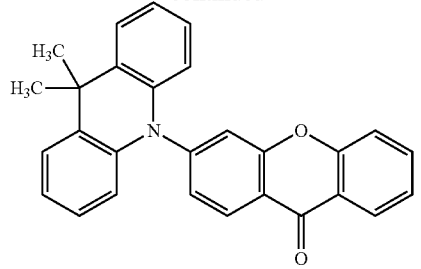

ACRXTN

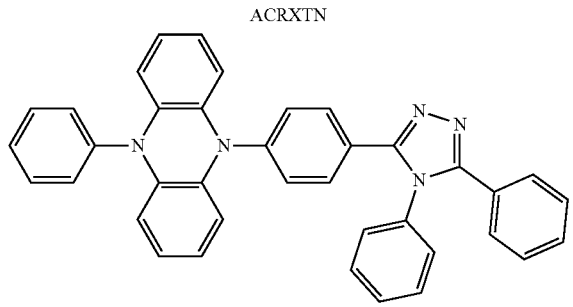

PPZ-3TPT

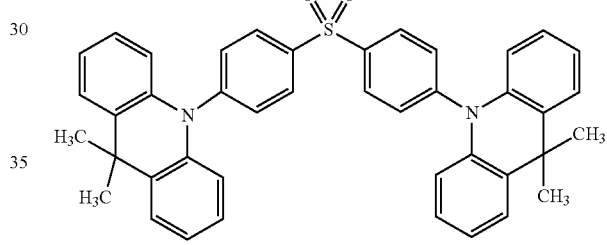

DMAC-DPS

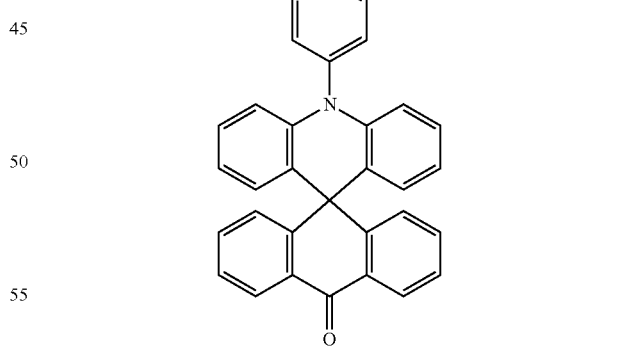

ACRSA

Alternatively, a TADF material whose singlet excited state and triplet excited state are in a thermal equilibrium state may be used. Such a TADF material has a short emission lifetime (excitation lifetime), which allows inhibition of a decrease in efficiency in a high-luminance region of a light-emitting element. Specifically, a material having the following molecular structure can be used.

[Chemical Formula 13]

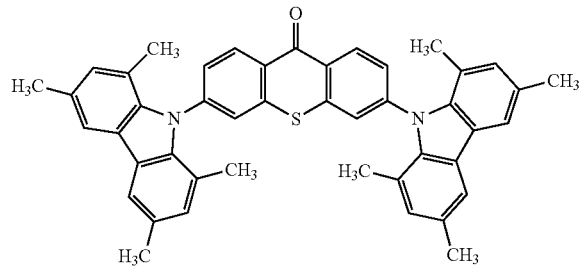

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton or a π-electron rich heteroaromatic ring skeleton, for example. Examples of the material include a compound having an aromatic amine skeleton, such as 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(i-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]-9,9'-spirobi[9H-fluoren]-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the material having a hole-transport property that can be used for the hole-transport layer 112 can also be used.

As the material having an electron-transport property, for example, a metal complex such as bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring is preferable. Examples of the organic compound having a π-electron deficient heteroaromatic ring include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs); an organic compound having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), or 2,9-bis(naphthalen-2-yl)-4,7-diphenyl-1,10-phenanthroline (abbreviation: NBPhen), an organic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[(3'-dibenzothiophen-4-yl)biphenyl-3-yl]naphtho[1',2':4,5]furo[2,3-b]pyrazine (abbreviation: 9mDBtBPNfpr), 9-[3'-dibenzothiophen-4-yl)bipheny-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2':4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazol (abbreviation: PC-cgDBCzQz); and an organic compound having a heteroaromatic ring having a triazine skeleton, such as 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)-1,1'-biphenyl-3-yl]-4,6-diphenyl-1,3,5-triazine (abbreviation: mTpBPTzn), 9-[4-(4,6-diphenyl-1,3,5-triazin-2-yl)-2-dibenzothiophenyl]-2-phenyl-9H-carbazole (abbreviation: PCDBfTzn), or 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn). Among the above materials, the organic compound having a heteroaromatic ring having a diazine skeleton, the organic compound having a heteroaromatic ring having a pyridine skeleton, and the organic compound having a heteroaromatic ring having a triazine skeleton have high reliability and thus are preferable. In particular, the organic compound having a heteroaromatic ring having a diazine (pyrimidine or pyrazine) skeleton and the organic compound having a heteroaromatic ring having a triazine skeleton have a high electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength of a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-βNPAnth), 9-(1-naphthyl)-10-(2-naphthyl)anthracene (abbreviation: α,β-ADN), 2-(10-phenylanthracen-9-yl) dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), and 1-[4-(10-[1,1'-biphenyl]-4-yl-9-anthracenyl)phenyl]-2-ethyl-1H-benzimidazole (abbreviation: EtBImPBPhA). In particular, CzPA, cgDBCzPA, 2mBnfPPA, and PCzPA exhibit excellent properties and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps with the wavelength of a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The electron-transport layer 114 is provided between the light-emitting layer 113 and the cathode and contains a material having an electron-transport property. The substance having an electron-transport property preferably has an electron mobility higher than or equal to $1\times10^{-6}$ cm$^2$/Vs in the case where the square root of the electric field strength [V/cm] is 600. Note that any other substance can also be used as long as the substance has an electron-transport property higher than a hole-transport property. An organic compound having a π-electron deficient heteroaromatic ring is preferable as the above organic compound. The organic compound having a π-electron deficient heteroaromatic ring is preferably one or more of an organic compound having a heteroaromatic ring having a polyazole skeleton, an organic compound having a heteroaromatic ring having a pyridine skeleton, an organic compound having a heteroaromatic ring having a diazine skeleton, and an organic compound having a heteroaromatic ring having a triazine skeleton.

Specific examples of the material having an electron-transport property that can be used for the above electron-transport layer include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs); an organic compound having a heteroaromatic ring having a pyridine skeleton, such as 3,5-bis[3-(9H-carbazol-9-yl)phenyl]pyridine (abbreviation: 35DCzPPy) 1,3,5-tri[3-(3-pyridyl)phenyl]benzene (abbreviation: TmPyPB), bathophenanthroline (abbreviation: BPhen), bathocuproine (abbreviation: BCP), or 2,9-bis(naphthalen-2-yl)-4,7-diphenyl-1,10-phenanthroline (abbreviation: NBPhen), an organic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[(3'-dibenzothiophen-4-yl)biphenyl-3-yl]naphtho[1',2':4,5]furo[2,3-b]pyrazine (abbreviation: 9mDBtBPNfpr), 9-[3'-dibenzothiophen-4-yl)bipheny-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2':4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazol (abbreviation: PC-cgDBCzQz); and an organic compound having a triazine skeleton, such as 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)-1,1'-biphenyl-3-yl]-4,6-diphenyl-1,3,5-triazine (abbreviation: mTpBPTzn), 9-[4-(4,6-diphenyl-1,3,5-triazin-2-yl)-2-dibenzothiophenyl]-2-phenyl-9H-carbazole (abbreviation: PCDBfTzn), or 2-[1,1'-biphenyl]-3-yl-4-phenyl-6-(8-[1,1':4',1''-terphenyl-4-yl-1-dibenzofuranyl)-1,3,5-triazine (abbreviation: mBP-TPDBfTzn). Among the above materials, the organic compound having a heteroaromatic ring having a diazine skeleton, the organic compound having a heteroaromatic ring having a pyridine skeleton, and the organic compound having a heteroaromatic ring having a triazine skeleton have high reliability and thus are preferable. In particular, the organic compound having a heteroaromatic ring having a diazine (pyrimidine or pyrazine) skeleton and the organic compound having a heteroaromatic ring having a triazine skeleton have a high electron-transport property to contribute to a reduction in driving voltage.

Note that a mixed material of the material having an electron-transport property and a metal complex of an alkali metal or an alkaline earth metal is preferably used as the electron-transport layer. A heterocyclic compound having a diazine skeleton, a heterocyclic compound having a triazine skeleton, and a heterocyclic compound having a pyridine skeleton are preferable in terms of driving lifetime because they are likely to form an exciplex with an organometallic complex of an alkali metal with stable energy (the emission wavelength of the exciplex easily becomes longer). In particular, the heterocyclic compound having a diazine skeleton or the heterocyclic compound having a triazine skeleton has a deep LUMO level and thus is preferred for stabilization of energy of an exciplex.

Note that the organometallic complex of an alkali metal is preferably a metal complex of sodium or lithium. Alternatively, the organometallic complex of an alkali metal preferably has a ligand having a quinolinol skeleton. Further preferably, the organometallic complex of an alkali metal is preferably a lithium complex having an 8-quinolinolato structure or a derivative thereof. The derivative of a lithium complex having an 8-quinolinolato structure is preferably a lithium complex having an 8-quinolinolato structure having an alkyl group, and further preferably has a methyl group.

Specific examples of the metal complex include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product, a 5-methyl-substituted product, or 6-methyl-substituted product) thereof is also preferably used, for example. In particular, the use of an alkali metal complex having an 8-quinolinolato structure having an alkyl group at the 6 position results in lowering the driving voltage of a light-emitting device.

As the material having an electron-transport property, any of the above-described low refractive index materials having an electron-transport property can be used as well. In this case, the electron-transport layer 114 can be a low refractive index layer.

The electron mobility of the electron-transport layer 114 in the case where the square root of the electric field strength [V/cm] is 600 is preferably higher than or equal to $1\times10^{-7}$ cm$^2$/Vs and lower than or equal to $5\times10^{-5}$ cm$^2$/Vs. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively deep HOMO level of −5.7 eV or higher and −5.4 eV or lower, in which case a long lifetime can be achieved. In this case, the material having an electron-transport property preferably has a HOMO level of −6.0 eV or higher.

A layer including an alkali metal, an alkaline earth metal, a compound thereof, or a complex thereof such as lithium fluoride (LiF), cesium fluoride (CsF), calcium fluoride (CaF$_2$), or 8-hydroxyquinolinato-lithium (Liq) may be provided as the electron-injection layer 115 between the electron-transport layer 114 and the second electrode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer including a substance that has an electron-transport property (preferably an organic compound having a bipyridine skeleton) and includes a fluoride of the alkali metal or the alkaline earth metal at a concentration higher than that at which the electron-injection layer 115 becomes in a microcrystalline state (50 wt % or higher). Since the layer has a low refractive index, the electron-injection layer can be a low refractive index layer; thus, a light-emitting device including the layer can have high external quantum efficiency.

Instead of the electron-injection layer 115 in FIG. 1C, a charge-generation layer 116 may be provided (FIG. 1D). The charge-generation layer 116 refers to a layer capable of injecting holes into a layer in contact with the cathode side of the charge-generation layer and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film including the above-described acceptor material as a material included in the composite material and a film including a hole-transport material. When a potential is applied to the p-type layer 117, electrons are injected into the electron-transport layer 114 and holes are injected into the second electrode 102 which is the cathode; thus, the light-emitting device operates.

Note that the charge-generation layer 116 preferably includes one or both of an electron-relay layer 118 and an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property included in the electron-relay layer 118 is preferably between the LUMO level of the acceptor substance in the p-type layer 117 and the LUMO level of a substance included in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

The electron-injection buffer layer 119 can be formed using a substance having a high electron-injection property, e.g., an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)).

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)).

As the substance having an electron-transport property, a material similar to the above-described material for the electron-transport layer 114 can be used. Since the above-described material is an organic compound having a low refractive index, the use of the material for the electron-injection buffer layer 119 can offer a light-emitting device with high external quantum efficiency.

Any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so as to inhibit quenching due to the proximity of the light-emitting region and a metal used for electrodes or carrier-injection layers.

Furthermore, in order that transfer of energy from an exciton generated in the light-emitting layer can be inhibited, preferably, the hole-transport layer or the electron-transport layer, which is in contact with the light-emitting layer 113, particularly a carrier-transport layer closer to the recombination region in the light-emitting layer 113, is preferably formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem device) is described. This light-emitting device includes a plurality of light-emitting units between an anode and a cathode. One light-emitting unit has substantially the same structure as the EL layer 103 illustrated in FIG. 1C. In other words, the light-emitting device illustrated in FIG. 1C includes a single light-emitting unit, and the tandem device includes a plurality of light-emitting units.

In the tandem device, a first light-emitting unit and a second light-emitting unit are stacked between an anode and a cathode, and a charge-generation layer is provided between the first light-emitting unit and the second light-emitting unit. The first light-emitting unit and the second light-emitting unit may have the same structure or different structures.

The charge-generation layer in the tandem device has a function of injecting electrons into one of the light-emitting units and injecting holes into the other of the light-emitting units when voltage is applied between the anode and the cathode. That is, the charge-generation layer injects electrons into the first light-emitting unit and holes into the second light-emitting unit when voltage is applied such that the potential of the anode becomes higher than the potential of the cathode.

The charge-generation layer preferably has a structure similar to that of the charge-generation layer 116 described with reference to FIG. 1D. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer, the charge-generation layer can also function as a hole-injection layer of the light-emitting unit; therefore, a hole-injection layer is not necessarily provided in the light-emitting unit.

In the case where the charge-generation layer of the tandem device includes the electron-injection buffer layer 119, the electron-injection buffer layer 119 functions as the electron-injection layer in the light-emitting unit on the anode side; thus, an electron-injection layer is not necessarily formed in the light-emitting unit on the anode side.

The tandem device having two light-emitting units is described above; one embodiment of the present invention can also be applied to a tandem device in which three or more light-emitting units are stacked. With a plurality of light-emitting units partitioned by the charge-generation layer between a pair of electrodes, it is possible to provide a long-life device that can emit light with high luminance at a low current density. A light-emitting apparatus that can be driven at a low voltage and has low power consumption can be provided.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as a whole.

The above-described layers or electrodes such as the EL layer 103, the first light-emitting unit, the second light-emitting unit, and the charge-generation layer can be formed by a method such as an evaporation method (including a vacuum evaporation method), a droplet discharge method (also referred to as an ink-jet method), a coating method, or a gravure printing method, for example. A low molecular material, a middle molecular material (including an oligomer and a dendrimer), or a high molecular material may be included in the layers or electrodes.

This embodiment can be freely combined with any of the other embodiments.

Embodiment 2

In this embodiment, a light-emitting apparatus including the light-emitting device described in Embodiment 1 is described.

In this embodiment, a light-emitting apparatus manufactured using the light-emitting device described in Embodiment 1 is described with reference to FIGS. 2A and 2B. Note that FIG. 2A is a top view of the light-emitting apparatus and FIG. 2B is a cross-sectional view taken along the dashed-dotted lines A-B and C-D in FIG. 2A. This light-emitting apparatus includes a driver circuit portion (source line driver circuit) 601, a pixel portion 602, and a driver circuit portion (gate line driver circuit) 603, which are to control light emission of a light-emitting device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 2B. The driver circuit portions and the pixel portion are formed over an element substrate 610; here, the source line driver circuit 601, which is a driver circuit portion, and one pixel in the pixel portion 602 are illustrated.

The element substrate 610 may be a substrate containing glass, quartz, an organic resin, a metal, an alloy, a semiconductor, or the like or a plastic substrate formed of fiber reinforced plastic (FRP), poly(vinyl fluoride) (PVF), polyester, acrylic resin, or the like.

The structure of transistors used in pixels or driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

Here, an oxide semiconductor is preferably used for semiconductor devices such as the transistors provided in the pixels or driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, the first electrode 613 serves as an anode. A material having a high work function is preferably used as a material of the anode. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of any of these films and a film containing silver as its main component, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1.

As a material used for the second electrode 617, which is formed over the EL layer 616, a material having a low work function (e.g., Al, Mg, Li, and Ca, or an alloy or a compound thereof, such as MgAg, MgIn, and AlLi) is preferably used. In the case where light generated in the EL layer 616 passes through the second electrode 617, a stack of a thin metal or alloy film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting device is formed with the first electrode 613, the EL layer 616, and the second electrode 617. The light-emitting device is the light-emitting device described in Embodiment 1. In the light-emitting apparatus of this embodiment, the pixel portion, which includes a plurality of light-emitting devices, may include both the light-emitting device described in Embodiment 1 and a light-emitting device having a different structure. In that case, in the light-emitting apparatus of one embodiment of the present invention, a common hole-transport layer can be used for light-emitting devices that emit light with different wavelengths, allowing the light-emitting apparatus to be manufactured in a simple process at low costs.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be inhibited.

An epoxy-based resin or glass frit is preferably used for the sealing material 605. It is preferable that such a material transmit moisture or oxygen as little as possible. As the sealing substrate 604, a glass substrate, a quartz substrate, or a plastic substrate formed of fiber reinforced plastic (FRP), poly(vinyl fluoride) (PVF), polyester, acrylic resin, or the like can be used.

Although not illustrated in FIGS. 2A and 2B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus manufactured using the light-emitting device described in Embodiment 1 can be obtained.

The light-emitting apparatus in this embodiment is manufactured using the light-emitting device described in Embodiment 1 and thus can have favorable characteristics. Specifically, since the light-emitting device described in Embodiment 1 has high emission efficiency, the light-emitting apparatus can achieve low power consumption.

FIGS. 3A and 3B each illustrate an example of a light-emitting apparatus that includes coloring layers (color filters) and the like to improve color purity. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of light-emitting devices, a partition 1025, an EL layer 1028, a second electrode 1029 of the light-emitting devices, a sealing substrate 1031, a sealing material 1032, and the like.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036.

FIG. 3B shows an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

The above-described light-emitting apparatus has a structure in which light is extracted from the substrate 1001 side where FETs are formed (a bottom emission structure), but may have a structure in which light is extracted from the sealing substrate 1031 side (atop emission structure). FIG. 4 is a cross-sectional view of a light-emitting apparatus having atop emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover the electrode 1022. This insulating film may have a planarization function. The third interlayer insulating film 1037 can be formed using a material similar to that of the second interlayer insulating film 1021, and can alternatively be formed using any of other known materials.

The first electrodes 1024R, 1024G, and 1024B of the light-emitting devices each serve as an anode here, but may serve as a cathode. Furthermore, in the case of a light-emitting apparatus having a top emission structure as illustrated in FIG. 4, the anodes are preferably reflective electrodes. The EL layer 1028 is formed to have a structure similar to the structure of the EL layer 103 described in Embodiment 1.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) or the black matrix 1035 may be covered with the overcoat layer 1036. Note that a light-transmitting substrate is used as the sealing substrate 1031.

In the light-emitting apparatus having a top emission structure, a microcavity structure can be favorably employed. A light-emitting device with a microcavity structure is formed with the use of an electrode including a reflective electrode as one of the electrodes and a transflective electrode as the other electrode. At least an EL layer is positioned between the reflective electrode and the transflective electrode, and the EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, or the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided with a charge-generation layer provided therebetween, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiment 1 and thus can have favorable characteristics. Specifically, since the light-emitting device described in Embodiment 1 has high emission efficiency, the light-emitting apparatus can achieve low power consumption.

Figure 5A:
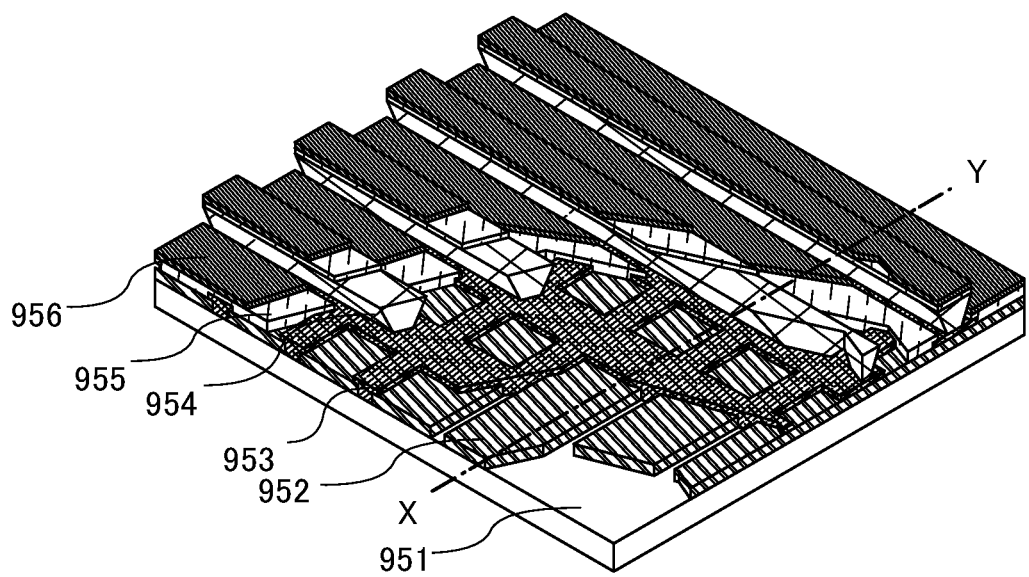
FIGS. 5A and 5B illustrate a passive matrix light-emitting apparatus.
Figure 5B:
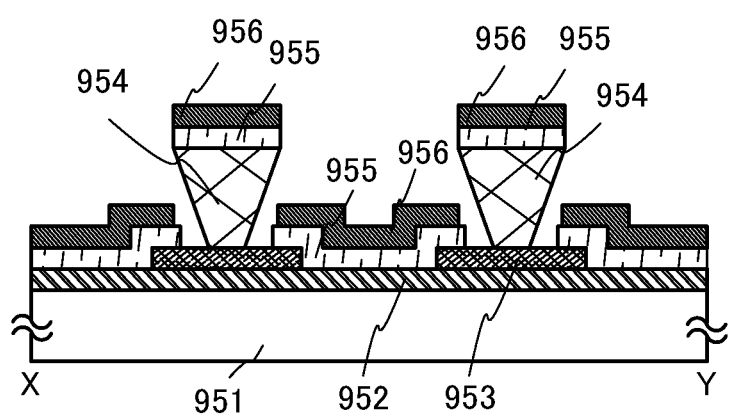

The active matrix light-emitting apparatus is described above, whereas a passive matrix light-emitting apparatus is described below. FIGS. 5A and 5B illustrate a passive matrix light-emitting apparatus manufactured using the present invention. Note that FIG. 5A is a perspective view of the light-emitting apparatus, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or others. The passive matrix light-emitting apparatus also includes the light-emitting device described in Embodiment 1; thus, the light-emitting apparatus can have high reliability or low power consumption.

In the light-emitting apparatus described above, many minute light-emitting devices arranged in a matrix can each be controlled; thus, the light-emitting apparatus can be suitably used as a display device for displaying images.

This embodiment can be freely combined with any of the other embodiments.

Embodiment 3

[Light-Emitting Apparatus]

Another example of the light-emitting apparatus of one embodiment of the present invention using the above-described light-emitting device and a manufacturing method thereof are described below.

In this specification and the like, a device fabricated using a metal mask or a fine metal mask (FMM, a high-resolution metal mask) is referred to as a device having a metal mask (MM) structure in some cases. In this specification and the like, a device formed without using a metal mask or an FMM is referred to as a device having a metal maskless (MML) structure in some cases.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that white light-emitting devices that are combined with coloring layers (e.g., color filters) can be a light-emitting apparatus of full-color display.

Structures of light-emitting devices can be classified roughly into a single structure and a tandem structure. A light-emitting device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A light-emitting device having a tandem structure includes two or more light-emitting units between a pair of electrode, and each light-emitting unit preferably includes one or more light-emitting layers. To obtain white light emission, the structure is made so that the combination of light from light-emitting layers of the plurality of light-emitting units forms white light. Note that a structure for obtaining white light emission is similar to that in the case of a single structure. In the light-emitting device having a tandem structure, it is preferable that an intermediate layer such as a charge-generation layer be provided between the plurality of light-emitting units.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Figure 14A:
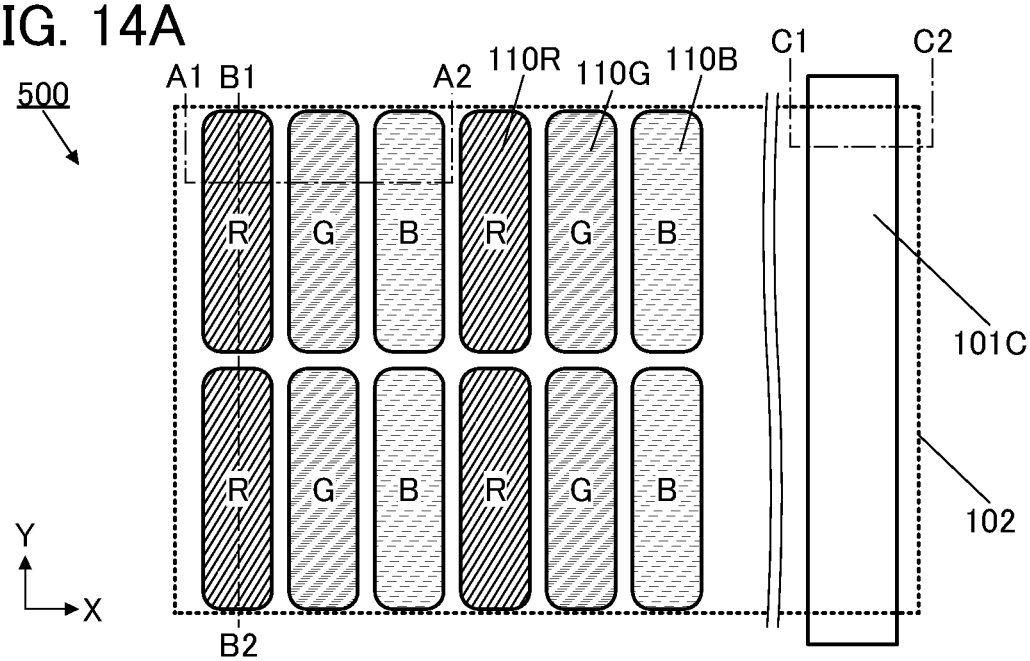
FIGS. 14A to 14D illustrate a structure example of a display device.

FIG. 14A illustrates a schematic top view of a light-emitting apparatus 500 of one embodiment of the present invention. The light-emitting apparatus 500 includes a plurality of light-emitting devices 110R emitting red light, a plurality of light-emitting devices 110G emitting green light, and a plurality of light-emitting devices 110B emitting blue light. In FIG. 14A, light-emitting regions of the light-emitting devices are denoted by R, G, and B to easily differentiate the light-emitting devices.

The light-emitting devices 110R, the light-emitting devices 110G, and the light-emitting devices 110B are arranged in a matrix. FIG. 14A shows what is called a stripe arrangement, in which the light-emitting devices of the same color are arranged in one direction. Note that the arrangement of the light-emitting devices is not limited thereto; another arrangement such as a delta, zigzag, or PenTile pattern may also be used.

The light-emitting device 110R, the light-emitting device 110G, and the light-emitting device 1101B are arranged in the X direction. The light-emitting devices of the same color are arranged in the Y direction intersecting with the X direction.

The light-emitting device 110R, the light-emitting device 110G, and the light-emitting device 110B have the above structure.

Figure 14B:
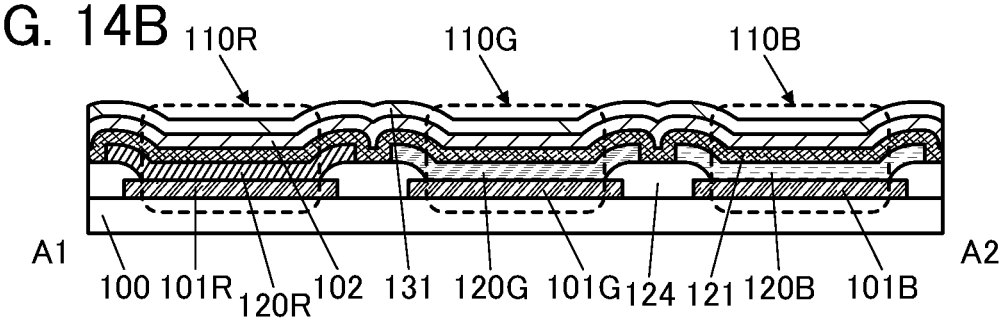
Figure 14C:
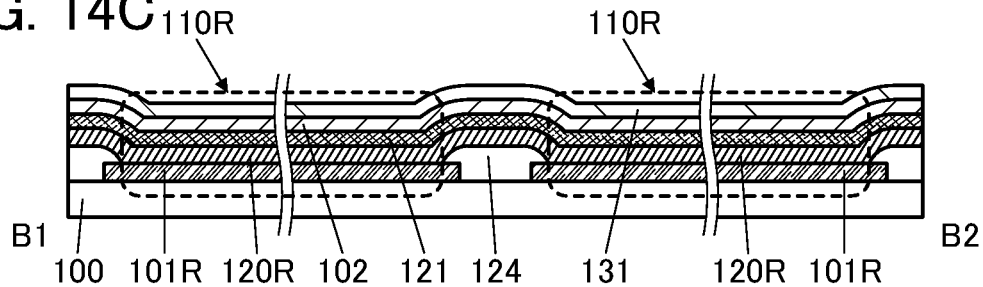

FIG. 14B is a cross-sectional schematic view taken along the dashed-dotted line A1-A2 in FIG. 14A. FIG. 14C is a cross-sectional schematic view taken along the dashed-dotted line B1-B2 in FIG. 14A.

FIG. 14B shows cross sections of the light-emitting device 110R, the light-emitting device 110G, and the light-emitting device 1101B. The light-emitting device 110R includes a first electrode 101R, an EL layer 120R, an EL layer 121, and the second electrode 102. The light-emitting device 110G includes a first electrode 101G, an EL layer 120G, the EL layer (electron-injection layer) 115, and the second electrode 102. The light-emitting device 110B includes a first electrode 101B, an EL layer 120B, the EL layer 121, and the second electrode 102. The EL layer 121 and the second electrode 102 are provided in common to the light-emitting device 110R, the light-emitting device 110G, and the light-emitting device 1101B. The EL layer 121 can also be referred to as a common layer.

The EL layer 120R included in the light-emitting device 110R contains a light-emitting organic compound that emits light with intensity at least in a red wavelength range. The EL layer 120G included in the light-emitting device 110G contains a light-emitting organic compound that emits light with intensity at least in a green wavelength range. The EL layer 120B included in the light-emitting device 1101B contains a light-emitting organic compound that emits light with intensity at least in a blue wavelength range. At least one of the light-emitting device 110R, the light-emitting device 110G, and the light-emitting device 1101B is preferably the light-emitting device of one embodiment of the present invention, and the light-emitting device of one embodiment of the present invention is preferably the light-emitting device 110B.

Each of the EL layer 120R, the EL layer 120G, and the EL layer 120B includes at least a light-emitting layer and a hole-transport layer, and may further include one or more of an electron-injection layer, an electron-transport layer, a hole-injection layer, a carrier-blocking layer, an exciton-blocking layer, and the like. The EL layer 121 does not necessarily include the light-emitting layer. The EL layer 121 is preferably the electron-injection layer. In the case where the electron-transport layer also serves as the electron-injection layer, the EL layer 121 may be omitted.

The first electrode 101R, the first electrode 101G, and the first electrode 101B are provided for the respective light-emitting devices. The second electrode 102 and the EL layer 121 are each provided as a layer common to the light-emitting devices. The hole-transport layers in the EL layers 120, which are separated between the light-emitting devices with different emission colors, preferably have the same structure.

A conductive film that transmits visible light is used for either the first electrode 101 or the second electrode 102, and a reflective conductive film is used for the other. When the first electrode 101 is alight-transmitting electrode and the second electrode 102 is a reflective electrode, a bottom-emission display device is obtained. When the first electrode 101 is a reflective electrode and the second electrode 102 is a light-transmitting electrode, a top-emission display device is obtained. Note that when both the first electrode 101 and the second electrode 102 transmit light, a dual-emission display device can be obtained. The light-emitting device of one embodiment of the present invention is suitable for a top-emission light-emitting device.

An insulating layer 124 is provided to cover end portions of the first electrode 101R, the first electrode 101G, and the first electrode 101B. The end portions of the insulating layer 124 are preferably tapered. Note that the insulating layer 124 is not necessarily provided.

The EL layer 120R, the EL layer 120G, and the EL layer 120B each include a region in contact with a top surface of a pixel electrode and a region in contact with a surface of the insulating layer 124. End portions of the EL layer 120R, the EL layer 120G, and the EL layer 120B are positioned over the insulating layer 124.

As shown in FIG. 14B, there is a gap between the EL layers of two light-emitting devices with different colors. The EL layer 120R, the EL layer 120G, and the EL layer 120B are thus preferably provided so as not to be in contact with each other. This effectively prevents unintentional light emission from being caused by current flowing through two adjacent EL layers. As a result, the contrast can be increased to achieve a display device with high display quality.

FIG. 14C shows an example in which the EL layer 120R is formed in a band shape so as to be continuous in the Y direction. When the EL layer 120R and the like are formed in a band shape, no space for dividing the layer is needed to reduce a non-light-emitting area between the light-emitting devices, resulting in a higher aperture ratio. FIG. 14C shows the cross section of the light-emitting device 110R as an example; the light-emitting device 110G and the light-emitting device 110B can have a similar shape. Note that the EL layer may be divided for the light-emitting devices in the Y direction.

A protective layer 131 is provided over the second electrode 102 so as to cover the light-emitting device 110R, the light-emitting device 110G, and the light-emitting device 110B. The protective layer 131 has a function of preventing diffusion of impurities such as water into each light-emitting device from the above.

The protective layer 131 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 131.

As the protective layer 131, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, the top surface of the organic insulating film can be flat, and accordingly, coverage with the inorganic insulating film over the organic insulating film is improved, leading to an improvement in barrier properties. Moreover, since the top surface of the protective layer 131 is flat, in the case where a component (e.g., a color filter, an electrode of a touch sensor, a lens array, or the like) is provided above the protective layer 131, the component is less affected by an uneven shape caused by the lower structure, which is preferable.

FIG. 14A also illustrates a connection electrode 101C that is electrically connected to the second electrode 102. The connection electrode 101C is supplied with a potential (e.g., an anode potential or a cathode potential) that is to be supplied to the second electrode 102. The connection electrode 101C is provided outside a display region where the light-emitting devices 110R and the like are arranged. In FIG. 14A, the second electrode 102 is denoted by a dashed line.

The connection electrode 101C can be provided along the outer periphery of the display region. For example, the connection electrode 101C may be provided along one side of the outer periphery of the display region or two or more sides of the outer periphery of the display region. That is, in the case where the display region has a rectangular top surface, the top surface of the connection electrode 101C can have a band shape, an L shape, a square bracket shape, a quadrangular shape, or the like.

Figure 14D:
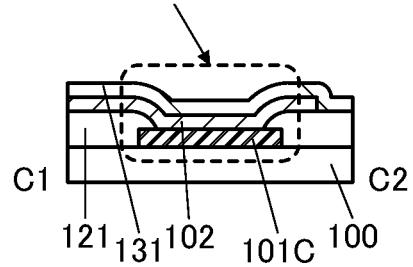

FIG. 14D is a cross-sectional schematic view taken along the dashed-dotted line C1-C2 in FIG. 14A. FIG. 14D illustrates a connection portion 130 at which the connection electrode 101C is electrically connected to the second electrode 102. In the connection portion 130, the second electrode 102 is provided on and in contact with the connection electrode 101C and the protective layer 131 is provided to cover the second electrode 102. In addition, the insulating layer 124 is provided to cover end portions of the connection electrode 101C.

Manufacturing Method Example

Figure 15A:
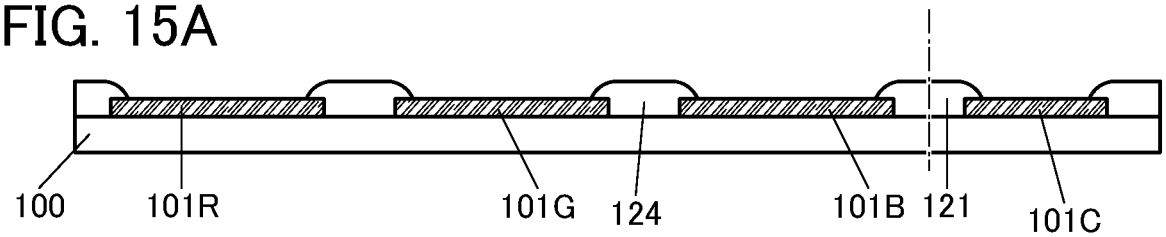
FIGS. 15A to 15F illustrate an example of a manufacturing method of a display device.

An example of a method for manufacturing the display device of one embodiment of the present invention is described below with reference to the drawings. Here, description is made with use of the light-emitting apparatus 500 shown in the above structure example. FIGS. 15A to 15F are cross-sectional schematic views of steps in a manufacturing method of a display device described below. In FIG. 15A and the like, the cross-sectional schematic views of the connection portion 130 and the periphery thereof are also illustrated on the right side.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

Alternatively, thin films included in the display device (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Thin films included in the display device can be processed by a photolithography method or the like. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

[Preparation for Substrate 100]

A substrate that has heat resistance high enough to withstand at least heat treatment performed later can be used as the substrate 100. When an insulating substrate is used as the substrate 100, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 100, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of First Electrodes 101R, 101G, and 101B, and Connection Electrode 101C]

Next, the first electrodes 101R, 101G, and 101B, and the connection electrode 101C are formed over the substrate 100. First, a conductive film to be an anode (a pixel electrode) is formed, a resist mask is formed by a photolithography method, and an unnecessary portion of the conductive film is removed by etching. After that, the resist mask is removed to form the first electrodes 101R, 101G, and 101B.

In the case where a conductive film that reflects visible light is used as each pixel electrode, it is preferable to use a material (e.g., silver or aluminum) having high reflectance in the whole wavelength range of visible light. This can increase both light extraction efficiency of the light-emitting devices and color reproducibility. In the case where a conductive film that reflects visible light is used as each pixel electrode, what is called a top-emission light-emitting apparatus in which light is extracted in the direction opposite to the substrate can be obtained. In the case where a conductive film that transmits light is used as each pixel electrode, what is called a bottom-emission light-emitting apparatus in which light is extracted in the direction of the substrate can be obtained.

[Formation of Insulating Layer 124]

Then, the insulating layer 124 is provided to cover end portions of the first electrode 101R, the first electrode 101G, and the first electrode 101B (FIG. 15A). An organic insulating film or an inorganic insulating film can be used as the insulating layer 124. The end portions of the insulating layer 124 are preferably tapered to improve step coverage with an EL film to be formed later. In particular, when an organic insulating film is used, a photosensitive material is preferably used so that the shape of the end portions can be easily controlled by the conditions of light exposure and development. In the case where the insulating layer 124 is not provided, the distance between the light-emitting devices can be further reduced to offer a light-emitting apparatus with higher resolution.

[Formation of EL Layer 120Rb]

Subsequently, the EL layer 120Rb, which is to be the EL layer 120R, is formed over the first electrode 101R, the first electrode 101G, the first electrode 101B, and the insulating layer 124.

The EL layer 120Rb includes at least a light-emitting layer containing a light-emitting material and a hole-transport layer. The EL layer 120Rb may have a structure in which one or more films functioning as an electron-injection layer, an electron-transport layer, a charge-generation layer, and a hole-injection layer are further stacked. The EL layer 120Rb can be formed by, for example, an evaporation method, a sputtering method, an inkjet method, or the like. Without limitation to this, the above-described film formation method can be used as appropriate.

For example, the EL layer 120Rb is preferably a stacked film in which a hole-injection layer, a hole-transport layer, a light-emitting layer, and an electron-transport layer are stacked in this order. In that case, a film including the electron-injection layer 115 can be used as the EL layer formed later. In the light-emitting apparatus of one embodiment of the present invention, the electron-transport layer is provided to cover the light-emitting layer, which can inhibit the light-emitting layer from being damaged by a subsequent photolithography step or the like, so that a highly reliable light-emitting device can be fabricated.

The EL layer 120Rb is preferably formed so as not to overlap with the connection electrode 101C. For example, in the case where the EL layer 120Rb is formed by an evaporation method (or a sputtering method), it is preferable that the EL layer 120Rb be formed using a shielding mask so as not to be formed over the connection electrode 101C, or the EL layer 120Rb be removed in a later etching step.

[Formation of Sacrificial Film 144a]

Then, the sacrificial film 144a is formed to cover the EL layer 120Rb. The sacrificial film 144a is provided in contact with a top surface of the connection electrode 101C.

As the sacrificial film 144a, it is possible to use a film highly resistant to etching treatment performed on various EL films such as the EL layer 120Rb, i.e., a film having high etching selectivity with respect to the EL film. Furthermore, as the sacrificial film 144a, it is possible to use a film having high etching selectivity with respect to a protective film such as a protective film 146a described later. Moreover, as the sacrificial film 144a, it is possible to use a film that can be removed by a wet etching method, which causes less damage to the EL film.

The sacrificial film 144a can be formed using an inorganic film such as a metal film, an alloy film, a metal oxide film, a semiconductor film, or an inorganic insulating film, for example. The sacrificial film 144a can be formed by any of a variety of film formation methods such as a sputtering method, an evaporation method, a CVD method, and an ALD method.

The sacrificial film 144a can be formed using a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material. It is particularly preferable to use a low-melting-point material such as aluminum or silver.

Alternatively, the sacrificial film 144a can be formed using a metal oxide such as an indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M(M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Alternatively, the sacrificial film 144a can be formed using an inorganic insulating material such as aluminum oxide, hafnium oxide, or silicon oxide.

The sacrificial film 144a is preferably formed using a material that can be dissolved in a solvent chemically stable with respect to at least the uppermost film of the EL layer 120Rb. Specifically, a material that will be dissolved in water or alcohol can be suitably used for the sacrificial film 144a. In formation of the sacrificial film 144a, it is preferable that application of such a material dissolved in a solvent such as water or alcohol be performed by a wet process and followed by heat treatment for evaporating the solvent. At this time, the heat treatment is preferably performed under a reduced-pressure atmosphere, in which case the solvent can be removed at a low temperature in a short time and thermal damage to the EL layer 120Rb can be accordingly minimized.

The sacrificial film 144a can be formed by spin coating, dipping, spray coating, ink-jetting, dispensing, screen printing, or offset printing, or with a doctor knife, a slit coater, a roll coater, a curtain coater, or a knife coater, for example.

The sacrificial film 144a can be formed using an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin.

[Formation of Protective Film 146a]

Figure 15B:
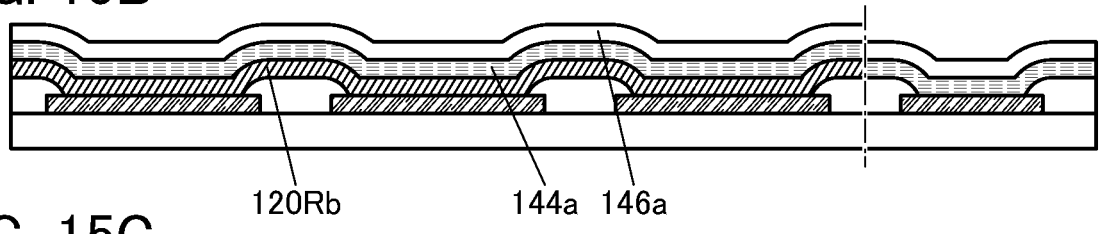

Next, the protective film 146a is formed over the sacrificial film 144a (FIG. 15B).

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is performed for the etching of the protective film 146a, the protective film 146a can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film using IGZO, ITO, or the like is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on etching conditions of the sacrificial film 144a and the protective film 146a. For example, any of the films that can be used for the sacrificial film 144a can be used.

As the protective film 146a, a nitride film can be used, for example. Specifically, a nitride such as silicon nitride, aluminum nitride, hafnium nitride, titanium nitride, tantalum nitride, tungsten nitride, gallium nitride, or germanium nitride can be used.

As the protective film 146a, an oxide film can also be used. Typically, it is possible to use a film of an oxide or an oxynitride such as silicon oxide, silicon oxynitride, aluminum oxide, aluminum oxynitride, hafnium oxide, or hafnium oxynitride.

Alternatively, as the protective film 146a, an organic film that can be used for the EL layer 120Rb or the like can be used. For example, the protective film 146a can be formed using the same film as the organic film that is used for the EL layer such as the EL layer 120Rb. Use of such an organic film is preferable because the same film formation apparatus can be used for formation of the EL layer 120Rb or the like.

[Formation of Resist Mask 143a]

Figure 15C:
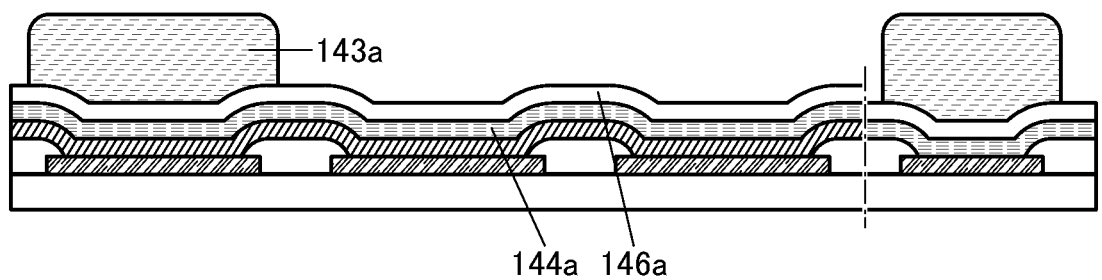

Then, the resist mask 143a is formed in positions over the protective film 146a that overlap with the first electrode 101R and the connection electrode 101C (FIG. 15C).

For the resist mask 143a, a resist material containing a photosensitive resin such as a positive type resist material or a negative type resist material can be used.

On the assumption that the resist mask 143a is formed over the sacrificial film 144a without the protective film 146a therebetween, there is a risk of dissolving the EL layer 120Rb due to a solvent of the resist material if a defect such as a pinhole exists in the sacrificial film 144a. Such a defect can be prevented by using the protective film 146a.

In the case where a film that is unlikely to cause a defect such as a pinhole is used as the sacrificial film 144a, the resist mask 143a may be formed directly on the sacrificial film 144a without the protective film 146a therebetween.

[Etching of Protective Film 146a]Next, part of the protective film 146a that is not covered with the resist mask 143a is removed by etching, so that a band-shaped protective layer 147a is formed. At that time, the protective layer 147a is formed also over the connection electrode 101C.

In the etching of the protective film 146a, an etching condition with high selectively is preferably employed so that the sacrificial film 144a is not removed by the etching. Either wet etching or dry etching can be performed for the etching of the protective film 146a. With use of dry etching, a reduction in a processing pattern of the protective film 146a can be inhibited.

[Removal of Resist Mask 143a]

Figure 15D:
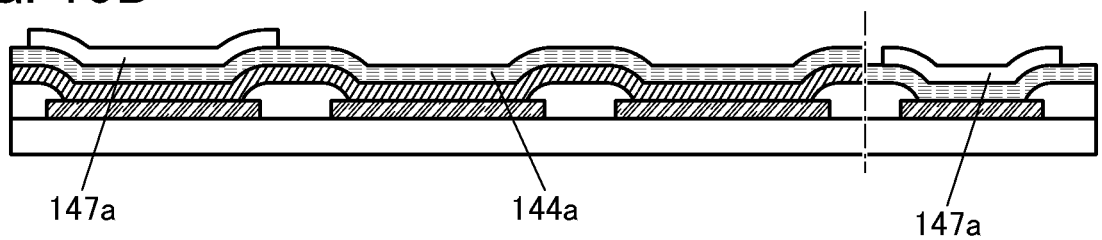

Then, the resist mask 143a is removed (FIG. 15D).

The removal of the resist mask 143a can be performed by wet etching or dry etching. It is particularly preferable to perform dry etching (also referred to as plasma ashing) using an oxygen gas as an etching gas to remove the resist mask 143a.

At this time, the removal of the resist mask 143a is performed in a state where the EL layer 120Rb is covered with the sacrificial film 144a; thus, the EL layer 120Rb is less likely to be affected by the removal. In particular, when the EL layer 120Rb is exposed to oxygen, the electrical characteristics of the light-emitting device are adversely affected in some cases. Therefore, it is preferable that the EL layer 120Rb be covered with the sacrificial film 144a when etching using an oxygen gas, such as plasma ashing, is performed.

[Etching of Sacrificial Film 144a]

Figure 15E:
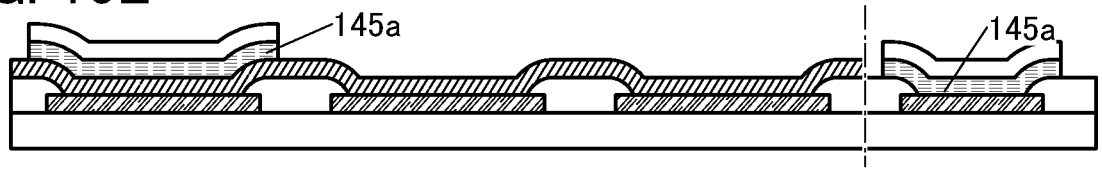

Next, part of the sacrificial film 144a that is not covered with the protective layer 147a is removed by etching with use of the protective layer 147a as a mask, so that a band-shaped sacrificial layer 145a is formed (FIG. 15E). At that time, the sacrificial layer 145a is formed also over the connection electrode 101C.

Either wet etching or dry etching can be performed for the etching of the sacrificial film 144a. With use of dry etching, a reduction in a processing pattern can be inhibited.

[Etching of EL Layer 120Rb and Protective Layer 147a]

Figure 15F:
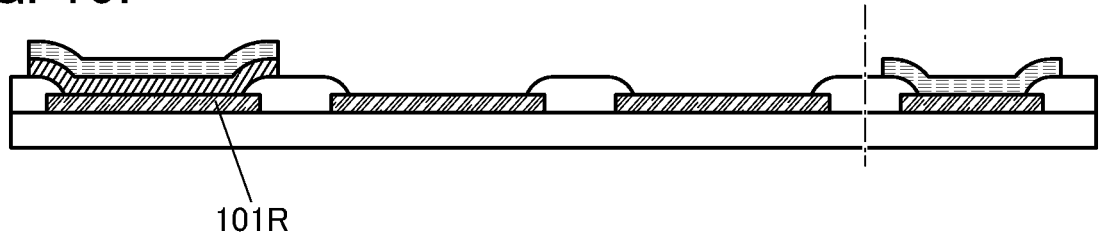

Next, the protective layer 147a and part of the EL layer 120Rb that is not covered with the sacrificial layer 145a are removed by etching at the same time, so that the band-shaped EL layer 120R is formed (FIG. 15F). At that time, the protective layer 147a over the connection electrode 101C is also removed.

The EL layer 120Rb and the protective layer 147a are preferably etched by the same treatment so that the process can be simplified to reduce the manufacturing cost of the display device.

For the etching of the EL layer 120Rb, it is particularly preferable to perform dry etching using an etching gas that does not contain oxygen as its main component. This is because the alteration of the EL layer 120Rb is inhibited, and a highly reliable display device can be achieved. Examples of the etching gas that does not contain oxygen as its main component include $CF_4$, $C_4F_8$, $SF_6$, $CHF_3$, $Cl_2$, $H_2O$, $BCl_3$, or a rare gas such as $H_2$ or He. Alternatively, a mixed gas of the above gas and a dilute gas that does not contain oxygen can be used the etching gas.

Note that the etching of the EL layer 120Rb and the etching of the protective layer 147a may be performed separately. In that case, either the etching of the EL layer 120Rb or the etching of the protective layer 147a may be performed first.

At this step, the EL layer 120R and the connection electrode 101C are covered with the sacrificial layer 145a.
[Formation of EL Layer 120Gb]Subsequently, the EL layer 120Gb, which is to be the EL layer 120G, is formed over the sacrificial layer 145a, the insulating layer 124, the first electrode 101G, and the first electrode 101B. In that case, similarly to the EL layer 120Rb, the EL layer 120Gb is preferably not provided over the connection electrode 101C.

For the formation method of the EL layer 120Gb, the above description of the EL layer 120Rb can be referred to.
[Formation of Sacrificial Film 144b]

Then, the sacrificial film 144b is formed over the EL layer 120Gb. The sacrificial film 144b can be formed in a manner similar to that for the sacrificial film 144a. In particular, the sacrificial film 144b and the sacrificial film 144a are preferably formed using the same material.

At that time, the sacrificial film 144a is formed also over the connection electrode 101C so as to cover the sacrificial layer 145a.
[Formation of Protective Film 146b]

Next, the protective film 146b is formed over the sacrificial film 144b. The protective film 146b can be formed in a manner similar to that for the protective film 146a. In particular, the protective film 146b and the protective film 146a are preferably formed using the same material.
[Formation of Resist Mask 143b]

Figure 16A:
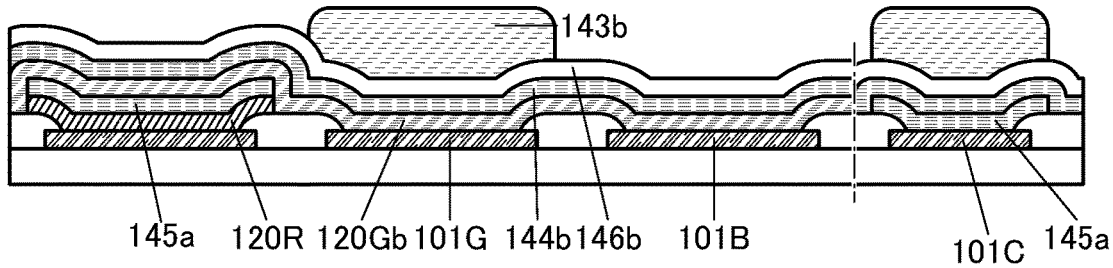
FIGS. 16A to 16F illustrate the example of the manufacturing method of the display device.

Then, the resist mask 143b is formed in positions over the protective film 146b that overlap with the first electrode 101G and the connection electrode 101C (FIG. 16A).

The resist mask 143b can be formed in a manner similar to that for the resist mask 143a.
[Etching of Protective Film 146b]

Figure 16B:
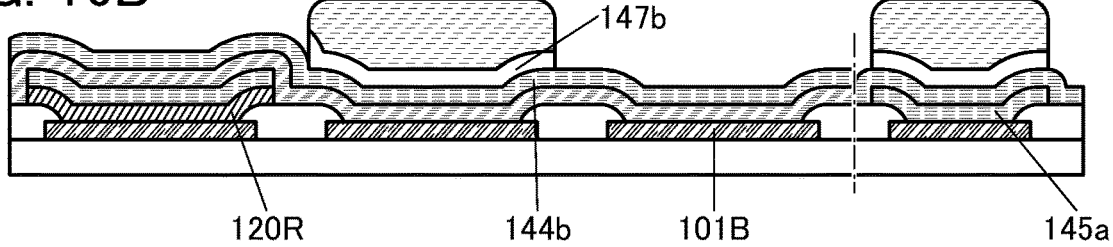

Next, part of the protective film 146b that is not covered with the resist mask 143b is removed by etching, so that a band-shaped protective layer 147b is formed (FIG. 16B). At that time, the protective layer 147b is formed also over the connection electrode 101C.

For the etching of the protective film 146b, the above description of the protective film 146a can be referred to.
[Removal of Resist Mask 143b]

Then, the resist mask 143b is removed. For the removal of resist mask 143b, the above description of the resist mask 143a can be referred to.
[Etching of Sacrificial Film 144b]

Next, part of the sacrificial film 144b that is not covered with the protective layer 147b is removed by etching with use of the protective layer 147b as a mask, so that a band-shaped sacrificial layer 145b is formed. At that time, the sacrificial layer 145b is formed also over the connection electrode 101C. The sacrificial layer 145a and the sacrificial layer 145b are stacked over the connection electrode 101C.

For the etching of the sacrificial film 144b, the above description of the sacrificial film 144a can be referred to.
[Etching of EL Layer 120Gb and Protective Layer 147b]

Figure 16C:
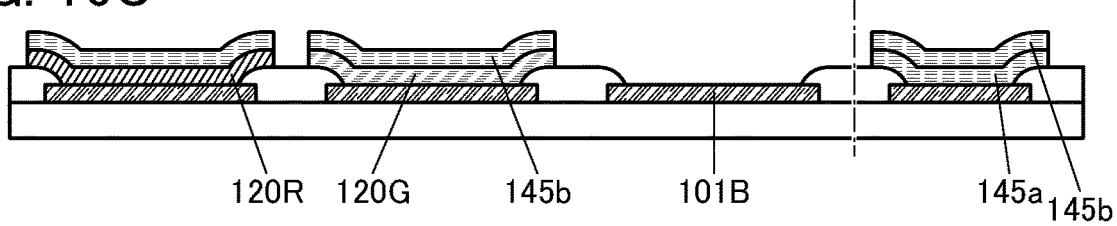

Next, the protective layer 147b and part of the EL layer 120Gb that is not covered with the sacrificial layer 145b are removed by etching at the same time, so that the band-shaped EL layer 120G is formed (FIG. 16C). At that time, the protective layer 147b over the connection electrode 101C is also removed.

For the etching of the EL layer 120Gb and the protective layer 147b, the above description of the EL layer 120Rb and the protective layer 147a can be referred to.

At this time, the EL layer 120R is protected by the sacrificial layer 145a, and thus can be prevented from being damaged in the etching step of the EL layer 120Gb.

In the above manner, the band-shaped EL layer 120R and the band-shaped EL layer 120G can be separately formed with high alignment accuracy.
[Formation of EL Layer 120B]

Figure 16D:
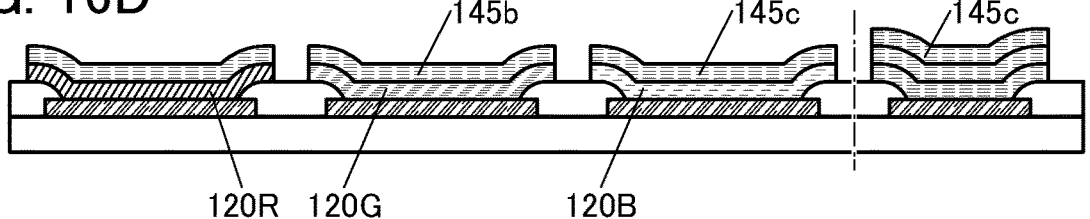

The above steps are performed on an EL layer 120Bb (not illustrated), whereby the island-shaped EL layer 120B and an island-shaped sacrificial layer 145c can be formed (FIG. 16D).

That is, after the formation of the EL layer 120G, the EL layer 120Bb, a sacrificial film 144c, a protective film 146c, and a resist mask 143c (each of which is not illustrated) are sequentially formed. After that, the protective film 146c is etched to form a protective layer 147c (not illustrated); then, the resist mask 143c is removed. Subsequently, the sacrificial film 144c is etched to form the sacrificial layer 145c. Then, the protective layer 147c and the EL layer 120Bb are etched to form the band-shaped EL layer 120B.

After the EL layer 120B is formed, the sacrificial layer 145c is also formed over the connection electrode 101C. The sacrificial layer 145a, the sacrificial layer 145b, and the sacrificial layer 145c are stacked over the connection electrode 101C.
[Removal of Sacrificial Layer]

Figure 16E:
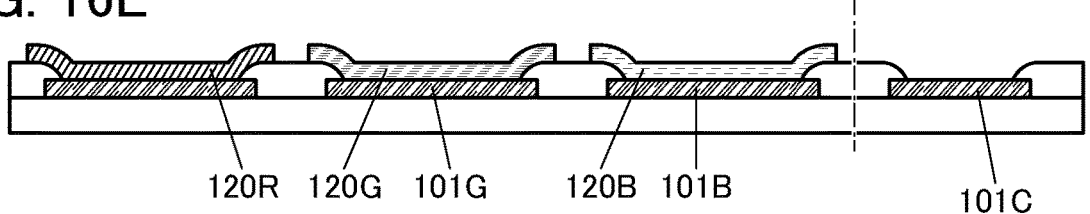

Next, the sacrificial layer 145a, the sacrificial layer 145b, and the sacrificial layer 145c are removed, whereby top surfaces of the EL layer 120R, the EL layer 120G, and the EL layer 120B are exposed (FIG. 16E). At that time, the top surface of the connection electrode 101C is also exposed.

The sacrificial layer 145a, the sacrificial layer 145b, and the sacrificial layer 145c can be removed by wet etching or dry etching. At this time, a method that causes as little damage as possible to the EL layer 120R, the EL layer 120G, and the EL layer 120B is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Alternatively, the sacrificial layer 145a, the sacrificial layer 145b, and the sacrificial layer 145c are preferably removed by being dissolved in a solvent such as water or alcohol. Examples of the alcohol in which the sacrificial layer 145a, the sacrificial layer 145b, and the sacrificial layer 145c can be dissolved include ethyl alcohol, methyl alcohol, isopropyl alcohol (IPA), and glycerin.

After the sacrificial layer 145a, the sacrificial layer 145b, and the sacrificial layer 145c are removed, drying treatment is preferably performed in order to remove water contained in the EL layer 120R, the EL layer 120G, and the EL layer 120B and water adsorbed on the surfaces of the EL layer 120R, the EL layer 120G, and the EL layer 120B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., and further preferably higher than or equal to 70° C. and lower than or equal to 120° C. The heat treatment is preferably performed in a reduced-pressure atmosphere because drying at a lower temperature is possible.

In the above manner, the EL layer 120R, the EL layer 120G, and the EL layer 120B can be separately formed.

[Formation of Electron-Injection Layer 115]

Then, the electron-injection layer 115 is formed to cover the EL layer 120R, the EL layer 120G, and the EL layer 120B.

The electron-injection layer 115 can be formed in a manner similar to that for the EL layer 120Rb or the like. In the case where the electron-injection layer 115 is formed by an evaporation method, the electron-injection layer 115 is preferably formed using a shielding mask so as not to be formed over the connection electrode 101C.

[Formation of Second Electrode 102]

Figure 16F:
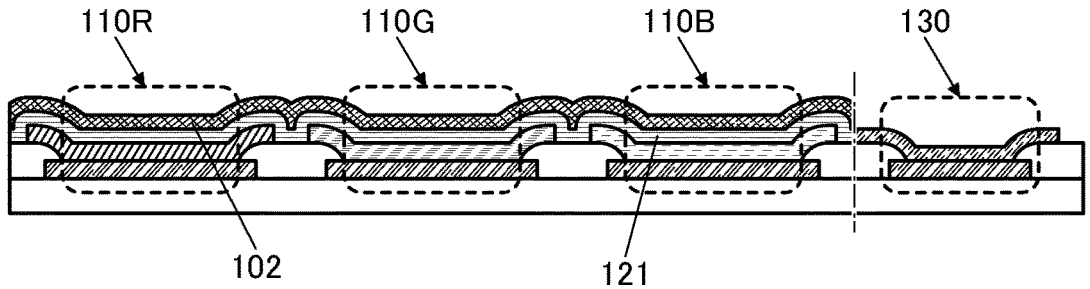

Then, the second electrode 102 is formed to cover the electron-injection layer 115 and the connection electrode 101C (FIG. 16F).

The second electrode 102 can be formed by a method such as an evaporation method or a sputtering method. Alternatively, a film formed by an evaporation method and a film formed by a sputtering method may be stacked. In that case, the second electrode 102 is preferably formed so as to cover a region where the electron-injection layer 115 is formed. That is, a structure in which end portions of the electron-injection layer 115 overlap with the second electrode 102 can be obtained. The second electrode 102 is preferably formed using a shielding mask.

The second electrode 102 is electrically connected to the connection electrode 101C outside a display region.

[Formation of Protective Layer]

Then, a protective layer is formed over the second electrode 102. An inorganic insulating film used for the protective layer is preferably formed by a sputtering method, a PECVD method, or an ALD method. In particular, an ALD method is preferable because a film deposited by ALD has good step coverage and is less likely to cause a defect such as a pinhole. An organic insulating film is preferably formed by an inkjet method because a uniform film can be formed in a desired area.

In the above manner, the light-emitting apparatus of one embodiment of the present invention can be manufactured.

Although the second electrode 102 and the electron-injection layer 115 are formed so as to have different top surface shapes, they may be formed in the same region.

Embodiment 4

Figure 6A:
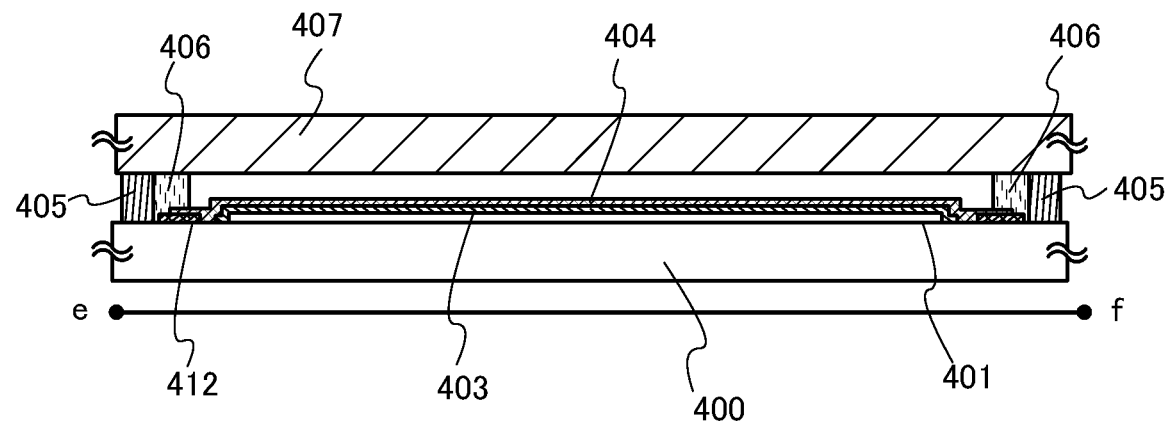
FIGS. 6A and 6B illustrate a lighting device.
Figure 6B:
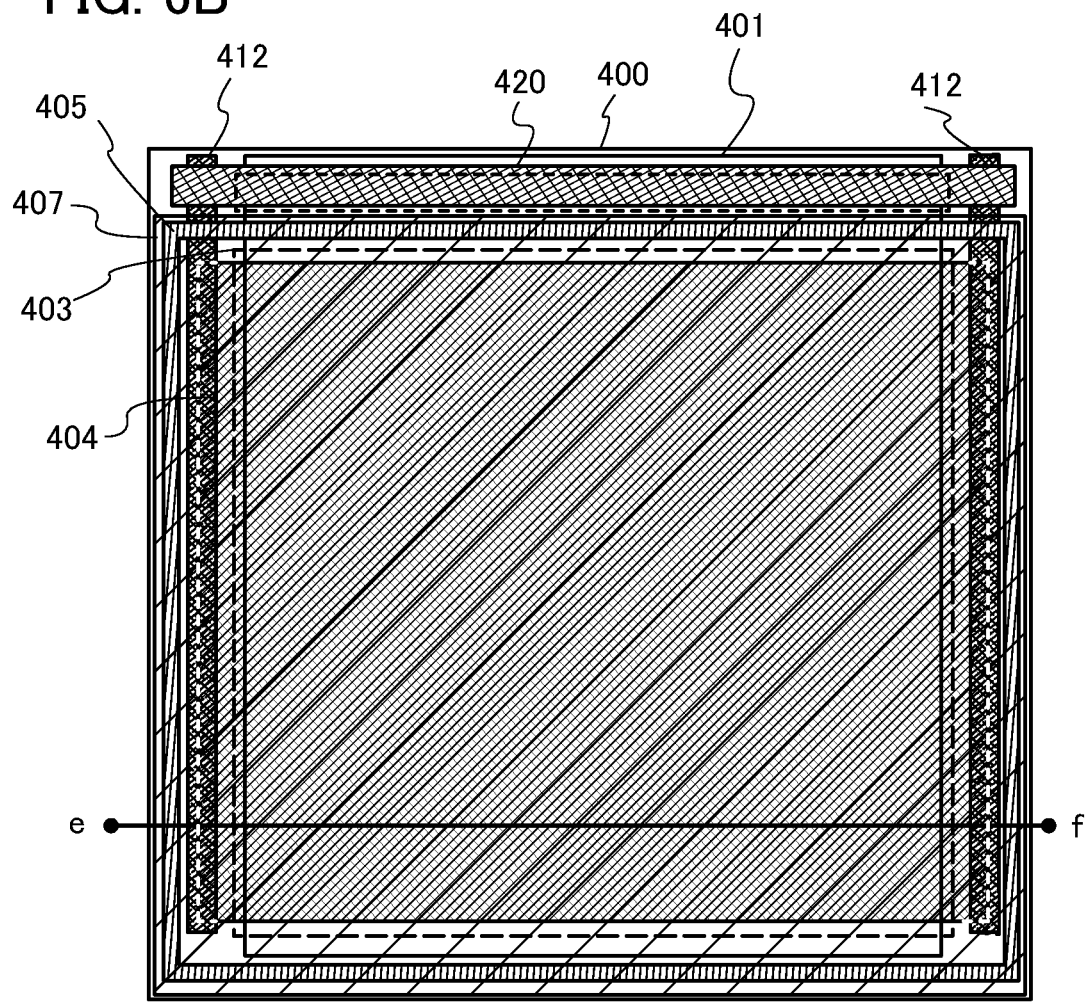

In this embodiment, an example in which the light-emitting device described in Embodiment 1 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, an anode 401 is formed over a substrate 400 which is a support with a light-transmitting property. The anode 401 corresponds to the first electrode 101 in Embodiment 1. When light is extracted through the anode 401, the anode 401 is formed using a material having a light-transmitting property.

A pad 412 for applying voltage to a cathode 404 is provided over the substrate 400.

An EL layer 403 is formed over the anode 401. The structure of the EL layer 403 corresponds to, for example, the structure of the EL layer 103 in Embodiment 1, or the structure in which the light-emitting units and the charge-generation layer are combined. Refer to the descriptions for the structure.

The cathode 404 is formed to cover the EL layer 403. The cathode 404 corresponds to the second electrode 102 in Embodiment 1. The cathode 404 is formed using a material having high reflectance when light is extracted through the anode 401. The cathode 404 is connected to the pad 412, thereby receiving voltage.

As described above, the lighting device described in this embodiment includes a light-emitting device including the anode 401, the EL layer 403, and the cathode 404. Since the light-emitting device is a light-emitting device with high emission efficiency, the lighting device in this embodiment can have low power consumption.

The substrate 400 provided with the light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not illustrated in FIG. 6B) can be mixed with a desiccant which enables moisture to be adsorbed, increasing reliability.

When parts of the pad 412 and the anode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting device described in Embodiment 1; thus, the lighting device can have low power consumption.

This embodiment can be freely combined with any of the other embodiments.

Embodiment 5

In this embodiment, examples of electronic devices each including the light-emitting device described in Embodiment 1 will be described. The light-emitting device described in Embodiment 1 has high emission efficiency and low power consumption. As a result, the electronic devices described in this embodiment can each include a light-emitting portion with low power consumption.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

FIG. 7A shows an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiment 1 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110. The light-emitting devices described in Embodiment 1 may also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiment 1 and arranged in a matrix in the display portion 7203. The computer illustrated in FIG. 7B1 may have a structure illustrated in FIG. 7B2. A computer illustrated in FIG. 7B2 is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 7C shows an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 in which the light-emitting devices described in Embodiment 1 are arranged in a matrix.

When the display portion 7402 of the portable terminal illustrated in FIG. 7C is touched with a finger or the like, data can be input to the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting apparatus including the light-emitting device described in Embodiment 1 or 2 is so wide that this light-emitting apparatus can be used in electronic devices in a variety of fields. By using the light-emitting device described in Embodiment 1 or 2, an electronic device with low power consumption can be obtained.

Figure 8A:
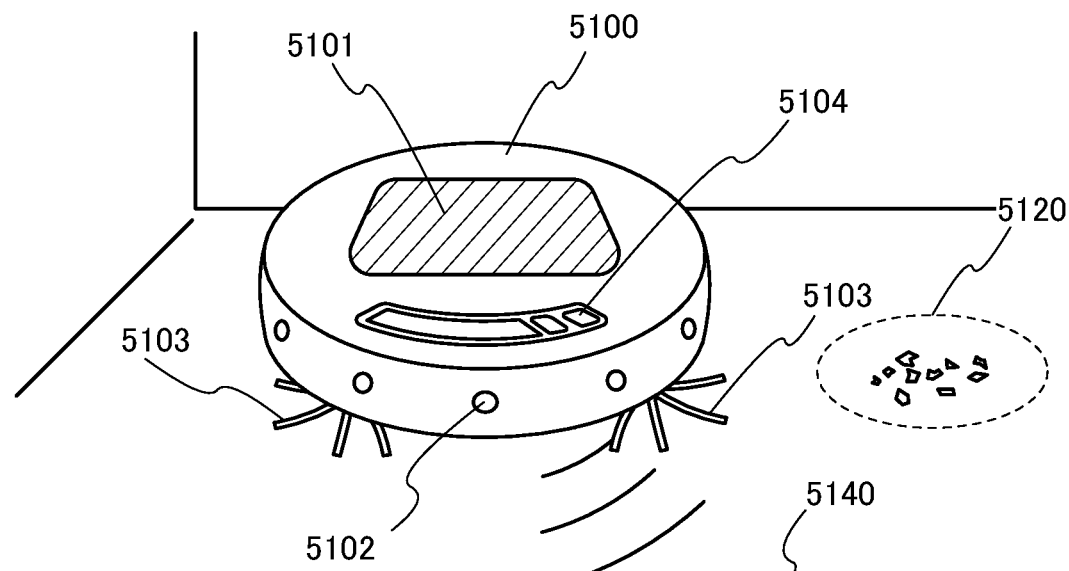
FIGS. 8A to 8C illustrate electronic devices.

FIG. 8A is a schematic view showing an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 8B:
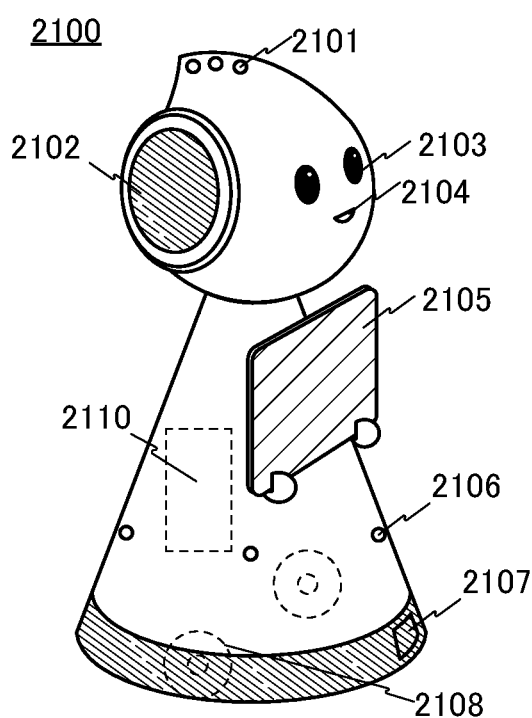

A robot 2100 illustrated in FIG. 8B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
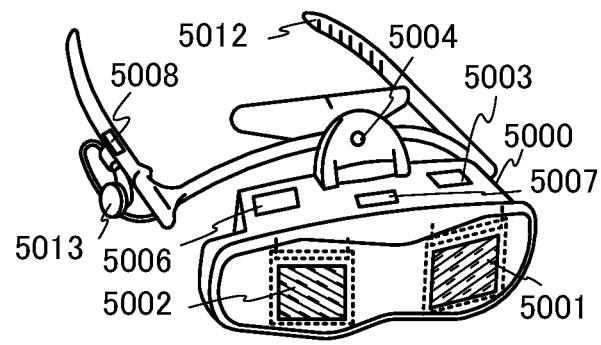

FIG. 8C shows an example of a goggle-type display. The goggle-type display includes, for example, a housing 5000, a display portion 5001, a speaker 5003, an LED lamp 5004 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 9:
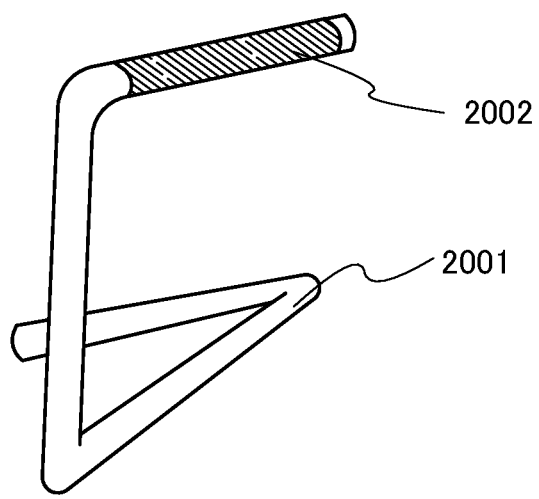
FIG. 9 illustrates a lighting device.

FIG. 9 shows an example in which the light-emitting device described in Embodiment 1 is used for a table lamp which is a lighting device. The table lamp illustrated in FIG. 9 includes a housing 2001 and a light source 2002, and the lighting device described in Embodiment 4 may be used for the light source 2002.

Figure 10:
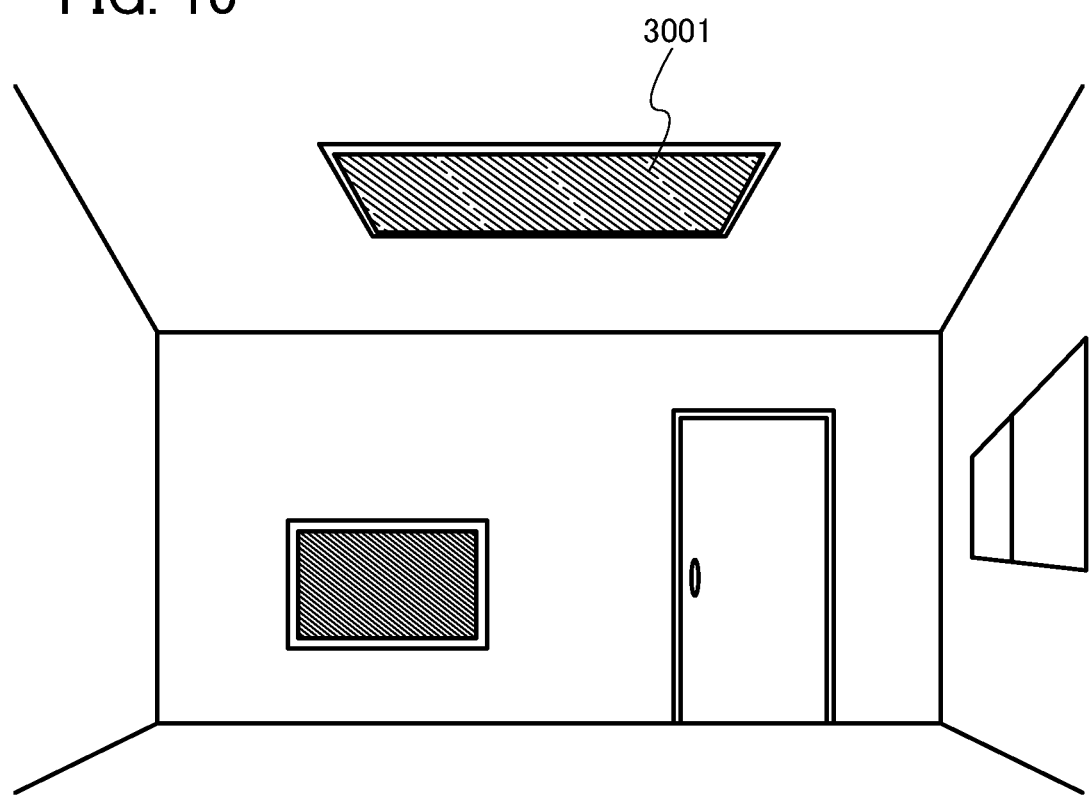
FIG. 10 illustrates a lighting device.

FIG. 10 shows an example in which the light-emitting device described in Embodiment 1 is used for an indoor lighting device 3001. Since the light-emitting device described in Embodiment 1 has high emission efficiency, the lighting device can have low power consumption. Furthermore, since the light-emitting device described in Embodiment 1 can have a large area, the light-emitting device can be used for a large-area lighting device. Furthermore, since the light-emitting device described in Embodiment 1 is thin, the light-emitting device can be used for a lighting device having a reduced thickness.

Figure 11:
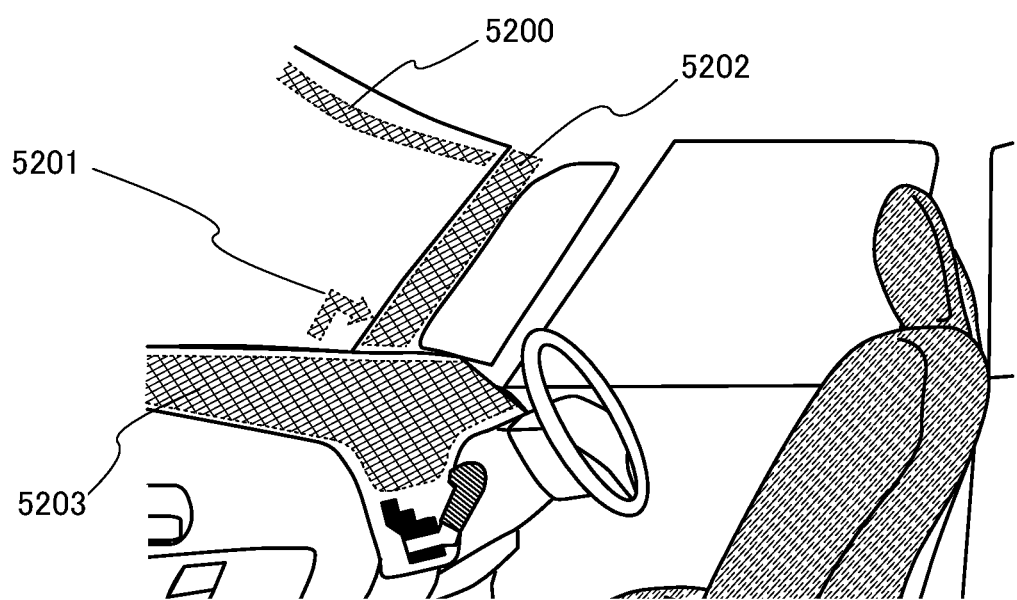
FIG. 11 illustrates in-vehicle display devices and lighting devices.

The light-emitting device described in Embodiment 1 can also be used for an automobile windshield or an automobile dashboard. FIG. 11 illustrates a mode in which the light-emitting devices described in Embodiment 1 are used for an automobile windshield and an automobile dashboard. Display regions 5200 to 5203 each include the light-emitting device described in Embodiment 1.

The display regions 5200 and 5201 are display devices which are provided in the automobile windshield and include the light-emitting device described in Embodiment 1. The light-emitting device described in Embodiment 1 can be formed into what is called a see-through display device, through which the opposite side can be seen, by including an anode and a cathode formed of light-transmitting electrodes. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and includes the light-emitting device described in Embodiment 1. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can provide a variety of kinds of information by displaying navigation data, the speed, the number of rotations, air-condition setting, and the like. The content or layout of the display can be changed as appropriate according to the user's preference. Note that such information can also be displayed on the display regions 5200 to 5202. The display regions 5200 to 5203 can also be used as lighting devices.

Figure 12A:
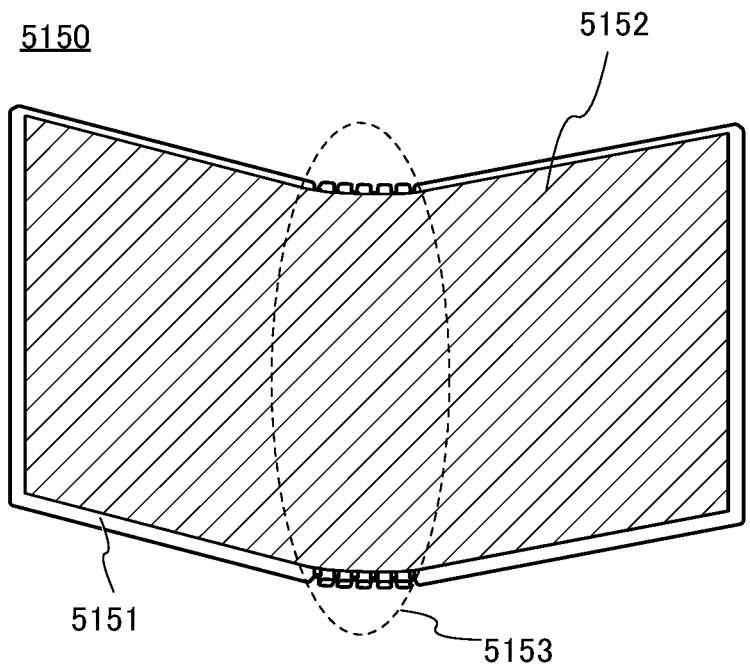
FIGS. 12A and 12B illustrate an electronic device.
Figure 12B:
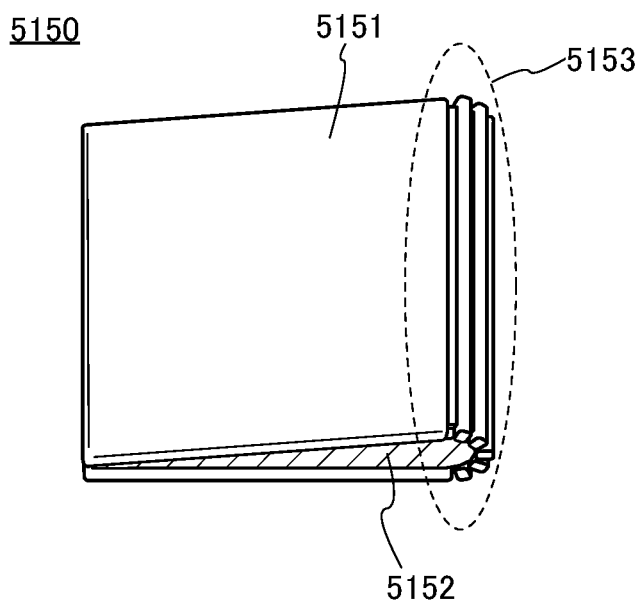

FIGS. 12A and 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands. The bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 13A:
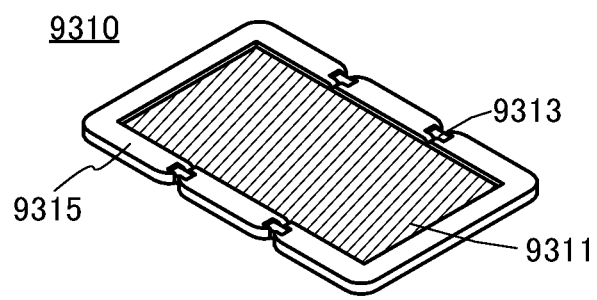
FIGS. 13A to 13C illustrate an electronic device.
Figure 13B:
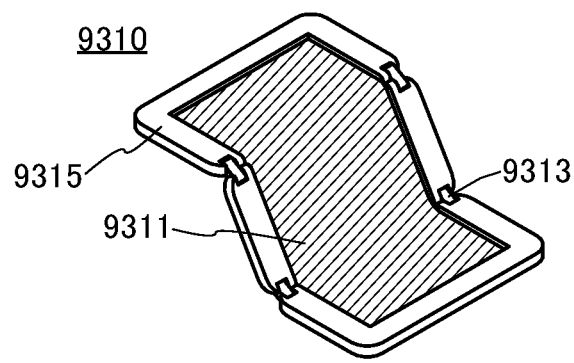
Figure 13C:
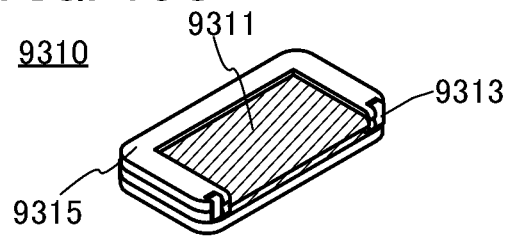

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

In this example, a light-emitting device 1, which is a light-emitting device of one embodiment of the present invention, and a comparative light-emitting device 1, which is a comparative light-emitting device, are described. Structural formulae of organic compounds used in this example are shown below.

[Chemical Formula 14]

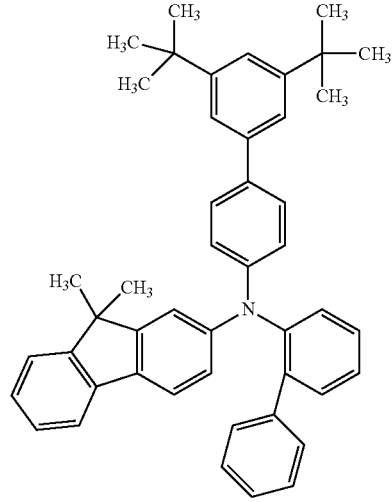

mmtBuBioFBi (i)

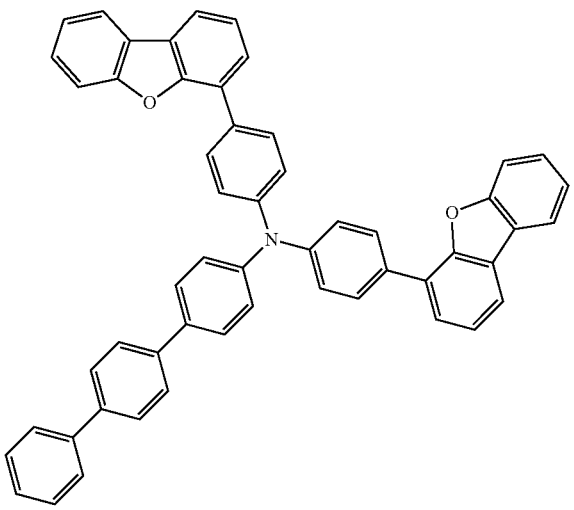

DBfBB1TP (ii)

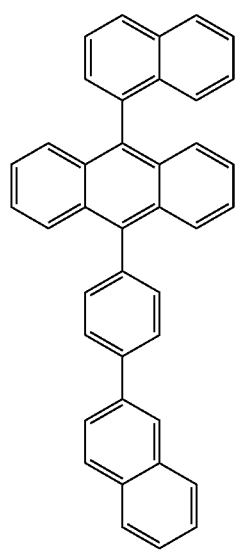

αN-βNPAnth (iii)

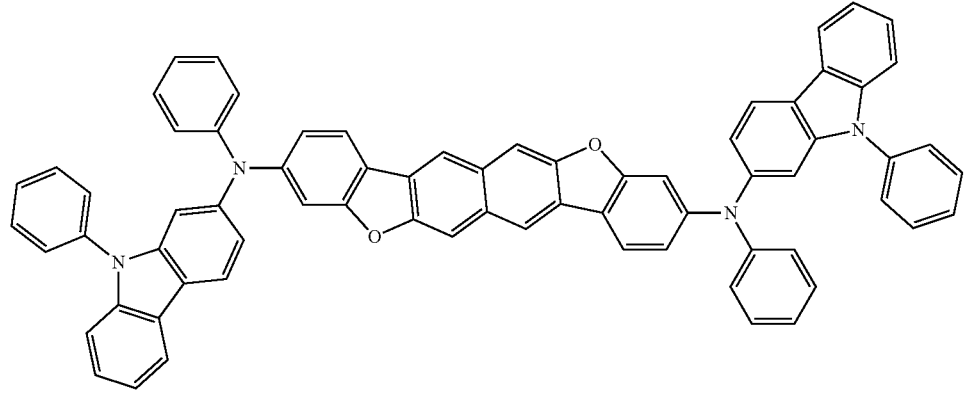
3,10PCA2Nbf(IV)-02
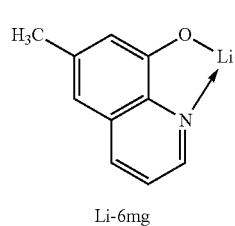
Li-6mg
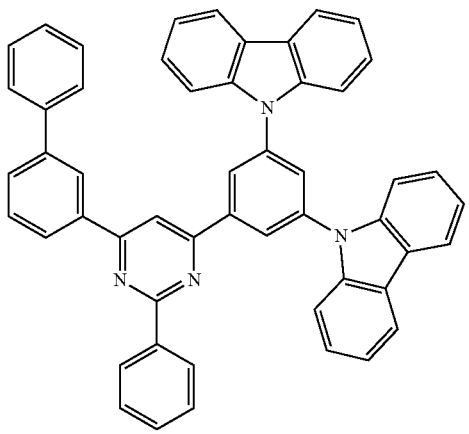
6mBP-4Cz2PPm
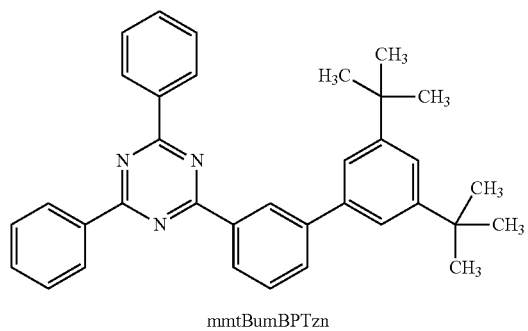
mmtBumBPTzn
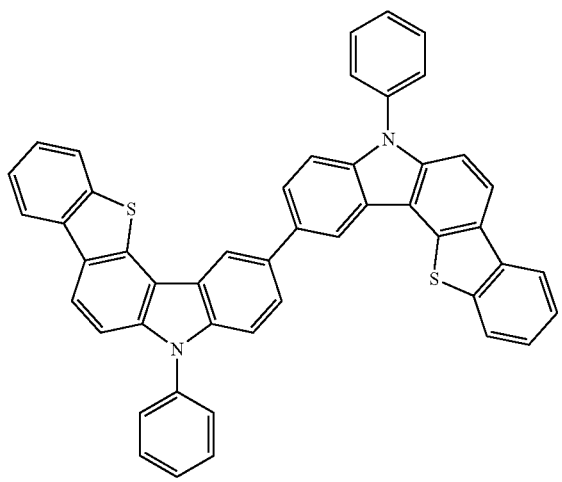
BisBTc

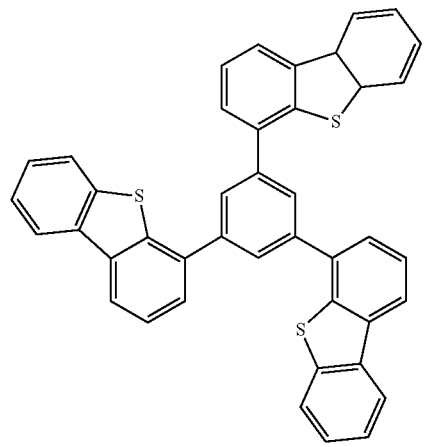

DBT3P-II (Fabrication Method of Light-Emitting Device 1)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 10 nm by a sputtering method, whereby the first electrode 101 was formed. The electrode area was set to 4 mm² (2 mm×2 mm). Note that the first electrode 101 is a transparent electrode, and the transparent electrode and the reflective electrode can be collectively regarded as the first electrode 101.

Next, in pretreatment for forming the light-emitting device over the substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately 10-4 Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation apparatus such that the surface on which the first electrode 101 was formed faced downward. Then, N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) represented by Structural Formula (i) and a fluorine-containing electron acceptor material with a molecular weight of 672 (OCHD-003) were deposited on the first electrode 101 to a thickness of 10 nm by co-evaporation such that the weight ratio of mmtBuBioFBi to OCHD-003 was 1:0.1, whereby the hole-injection layer 111 was formed.

Over the hole-injection layer 111, mmtBuBioFBi was deposited to a thickness of 135 nm by evaporation, whereby the hole-transport layer 112 was formed.

Subsequently, over the hole-transport layer 112, N,N-bis [4-(dibenzofuran-4-yl)phenyl]-4-amino-p-terphenyl (abbreviation: DBfBB1TP) represented by Structural Formula (ii) was deposited to a thickness of 10 nm by evaporation, whereby an electron-blocking layer was formed.

Then, 9-(1-naphthyl)-10-[4-(2-naphthyl)phenyl]anthracene (abbreviation: αN-βNPAnth) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were deposited to a thickness of 20 nm by co-evaporation such that the weight ratio of αN-βNPAnth to 3,10PCA2Nbf(IV)-02 was 1:0.015, whereby the light-emitting layer 113 was formed.

After that, 6-(1,1'-biphenyl-3-yl)-4-[3,5-bis(9H-carbazol-9-yl)phenyl]-2-phenylpyrimidine (abbreviation: 6mBP-4Cz2PPm) represented by Structural Formula (v) was deposited to a thickness of 10 nm by evaporation, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by Structural Formula (vi) and 6-methyl-8-quinolinolato-lithium (abbreviation: Li-6mq) represented by Structural Formula (vii) were deposited to a thickness of 20 nm by co-evaporation such that the weight ratio of mmtBumBPTzn to Li-6mq was 1:1, whereby the electron-transport layer 114 was formed.

After the electron-transport layer 114 was formed, lithium fluoride (LiF) was deposited to a thickness of 1 nm to form the electron-injection layer 115, and lastly silver (Ag) and magnesium (Mg) were deposited to a thickness of 15 nm by co-evaporation such that the volume ratio of Ag to Mg was 10:1 to form the second electrode 102, whereby the light-emitting device 1 was fabricated. Note that the second electrode 102 is a transfective electrode having a function of reflecting light and a function of transmitting light; thus, the light-emitting device of this example is a top-emission device in which light is extracted through the second electrode 102. Furthermore, over the second electrode 102, 5,5'-diphenyl-2,2'-di-5H-[1]benzothieno[3,2-c]carbazole (abbreviation: BisBTc) represented by Structural Formula (viii) was deposited to a thickness of 60 nm by evaporation to improve outcoupling efficiency.

(Method for Fabricating Comparative Light-Emitting Device 1)

The comparative light-emitting device 1 was fabricated in a manner similar to that of the light-emitting device 1 except that the thickness of the hole-transport layer was set to 130 nm and the material of the cap layer was changed to 4,4',4''-(benzene-1,3,5-triyl)tri(dibenzothiophene) (abbreviation: DBT3P-II) represented by Structural Formula (ix).

The structures of the light-emitting device 1 and the comparative light-emitting device 1 are listed in the following table.

TABLE 2

| Light-emitting device | | Light-emitting device 1 | Comparative light-emitting device 1 |
|---|---|---|---|
| Cap layer | 60 nm | BisBTc | DBT3P-II |
| Cathode | 15 nm | Ag:Mg (10:1) | |
| Electron-injection layer | 1 nm | LiF | |
| Electron-transport layer | 20 nm | mmtBumBPTzn:Li-6mq (1:1) | |
| Hole-blocking layer | 10 nm | 6mBP-4CzP2Pm | |
| Light-emitting layer | 20 nm | αN-βNPAnth:3,10PCA2Nbf(IV)-02 (1:0.015) | |
| Electron-blocking layer | 10 nm | DBfBB1TP | |
| Hole-transport layer | *1 | mmtBuBioFBi | |
| Hole-injection layer | 10 nm | mmtBuBioFBi:OCHD-003 (1:0.1) | |
| Anode | 10 nm | ITSO | |
| Reflective electrode | 100 nm | Ag | |

*1 Light-emitting device 1: 135 nm, Comparative light-emitting device 1: 130 nm

Figure 19:
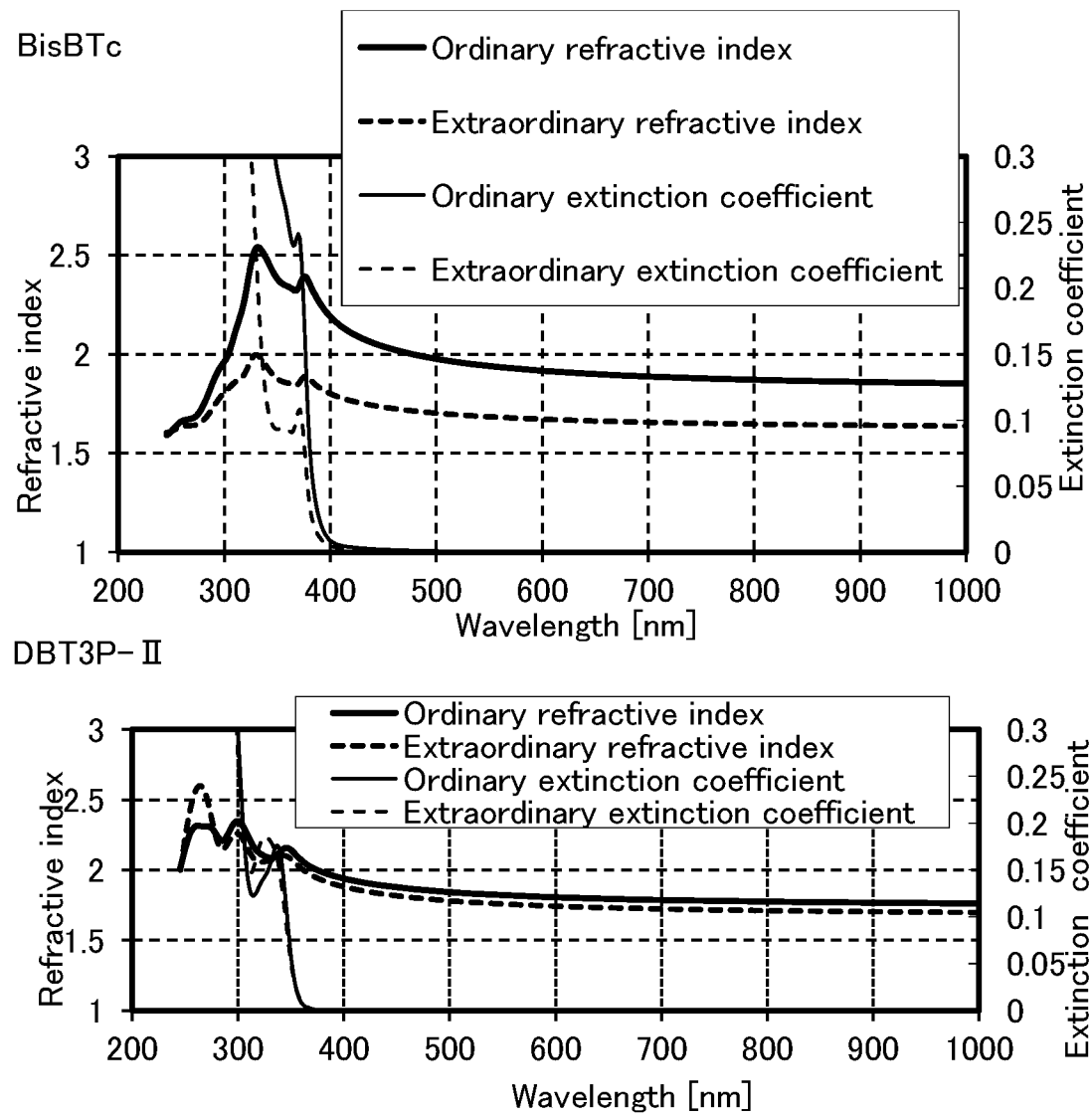
FIG. 19 shows ordinary and extraordinary refractive indexes and ordinary and extraordinary extinction coefficients of BisBTc and DBT3P-II.

The measured ordinary refractive indexes of mmtBu-BioFBi, mmtBumBPTzn, Li-6mq, BisBTc, and DBT3P-II and the measured extinction coefficients of BisBTc and DBT3P-II are shown in FIG. 18 and FIG. 19. The measurement was performed with an M-2000U spectroscopic ellipsometer manufactured by J. A. Woollam Japan Corp. To obtain films used as measurement samples, the material for each layer was deposited to a thickness of approximately 50 nm over a quartz substrate by a vacuum evaporation method.

From the graphs, mmtBuBioFBi, mmtBumBPTzn, and Li-6mq are low refractive index materials having an ordinary refractive index of higher than or equal to 1.50 and lower than or equal to 1.75 in the entire wavelength range from 455 nm to 465 nm, and BisBTc is a high refractive index material having an ordinary refractive index of higher than or equal to 1.90 and lower than or equal to 2.40 and an ordinary extinction coefficient of higher than or equal to 0 and lower than or equal to 0.01 in the entire wavelength range from 455 nm to 465 nm. Furthermore, the peak wavelength on the longest wavelength side of the ordinary extinction coefficient is 370 nm, and the alignment order parameter at this wavelength is −0.23, which is less than −0.1. Note that the light-emitting device 1 and the comparative light-emitting device 1 are blue light-emitting devices.

The light-emitting device and the comparative light-emitting device were sealed using a glass substrate in a glove box containing a nitrogen atmosphere so as not to be exposed to the air. Specifically, a UV curable sealing material was applied to surround the devices, only the UV curable sealing material was irradiated with UV while the light-emitting devices were not irradiated with the UV, and heat treatment was performed at 80° C. under an atmospheric pressure for one hour. Then, the initial characteristics of the light-emitting devices were measured.

Figure 20:
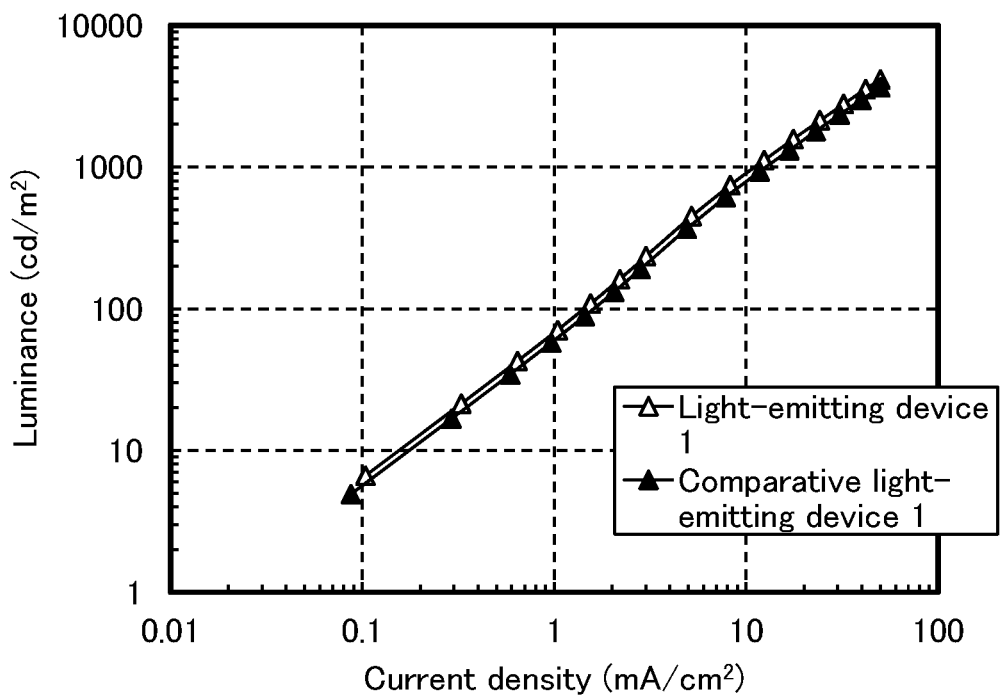
FIG. 20 shows luminance-current density characteristics of a light-emitting device 1 and a comparative light-emitting device 1.
Figure 21:
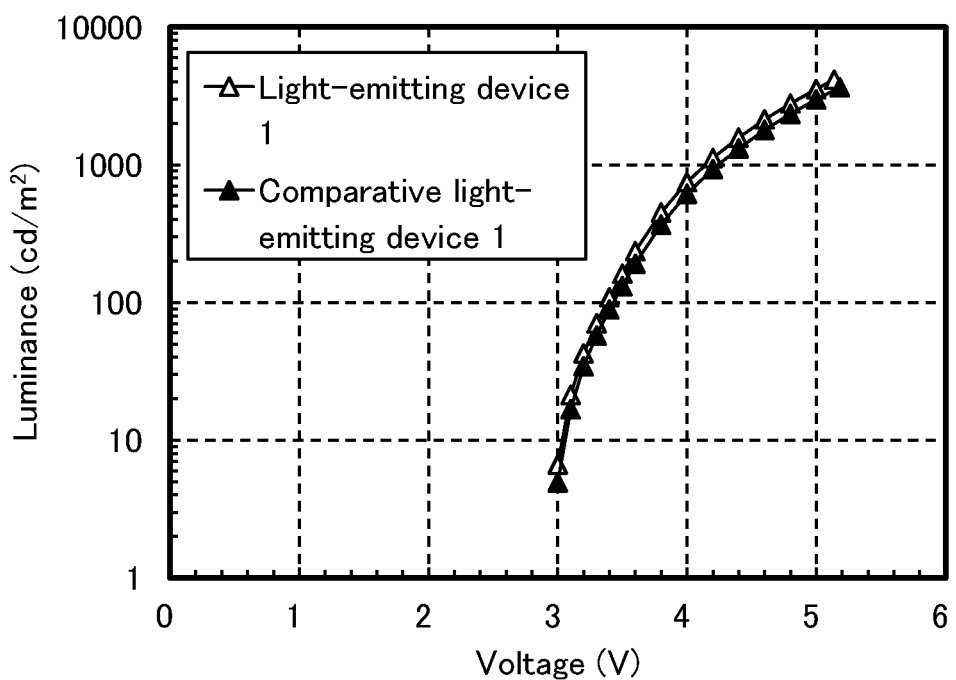
FIG. 21 shows luminance-voltage characteristics of the light-emitting device 1 and the comparative light-emitting device 1.
Figure 22:
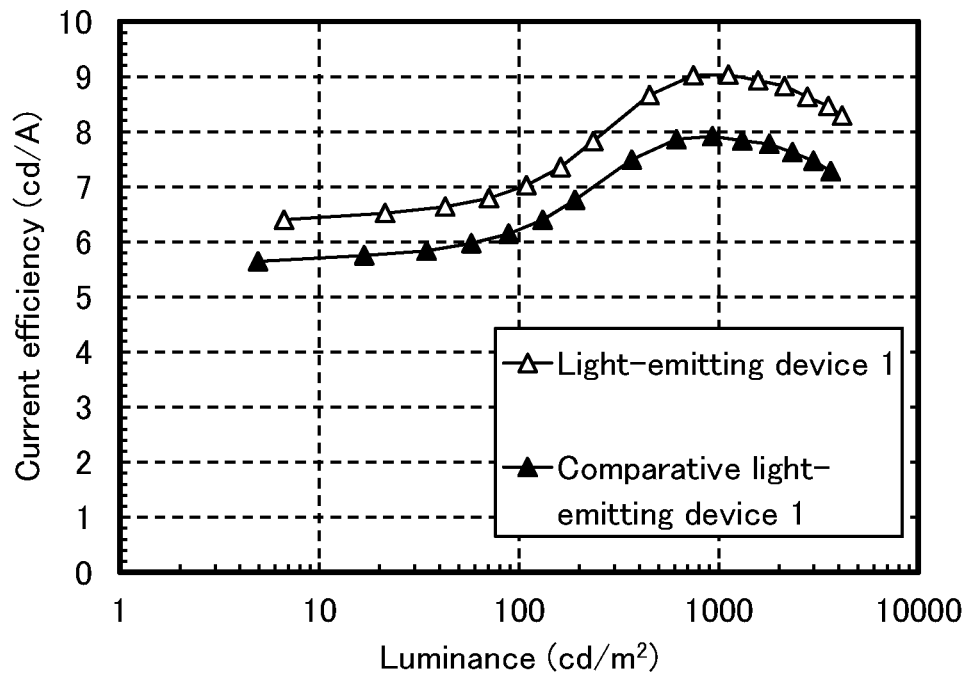
FIG. 22 shows current efficiency-luminance characteristics of the light-emitting device 1 and the comparative light-emitting device 1.
Figure 23:
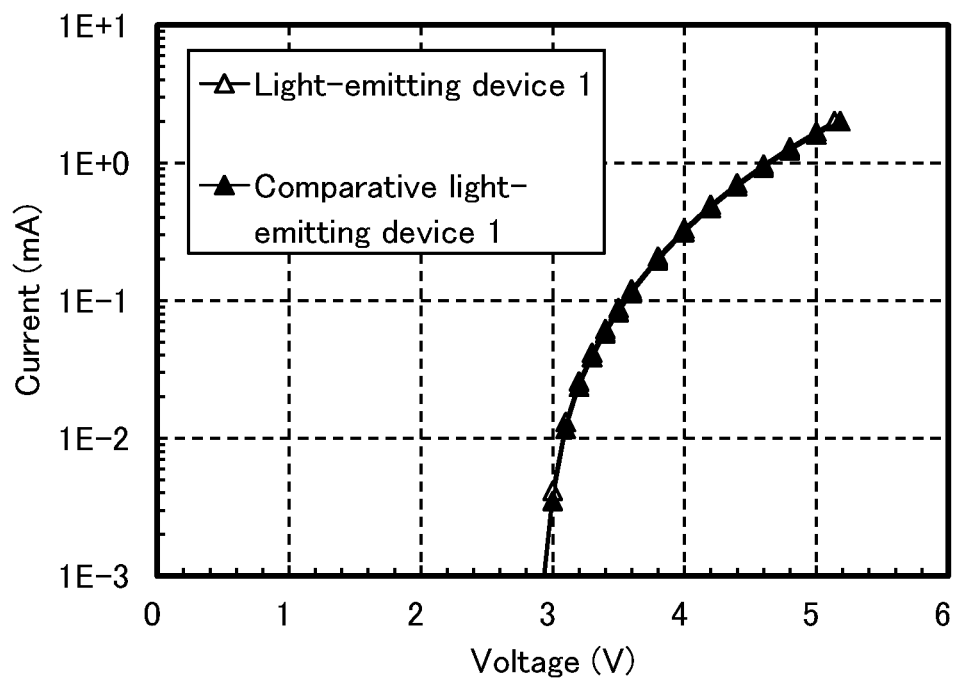
FIG. 23 shows current density-voltage characteristics of the light-emitting device 1 and the comparative light-emitting device 1.
Figure 24:
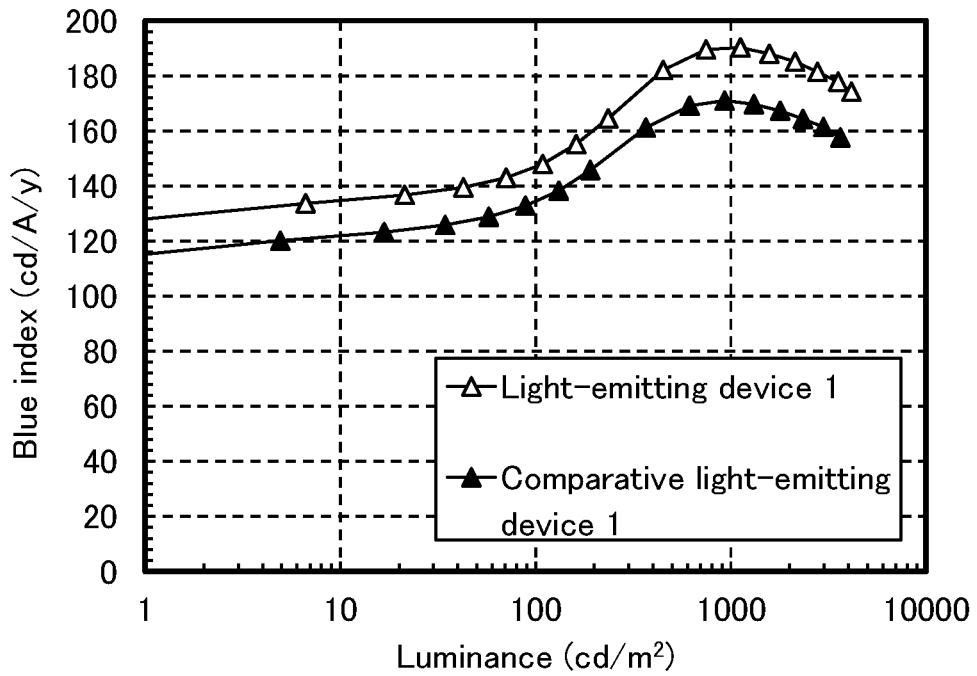
FIG. 24 shows blue index-luminance characteristics of the light-emitting device 1 and the comparative light-emitting device 1.
Figure 25:
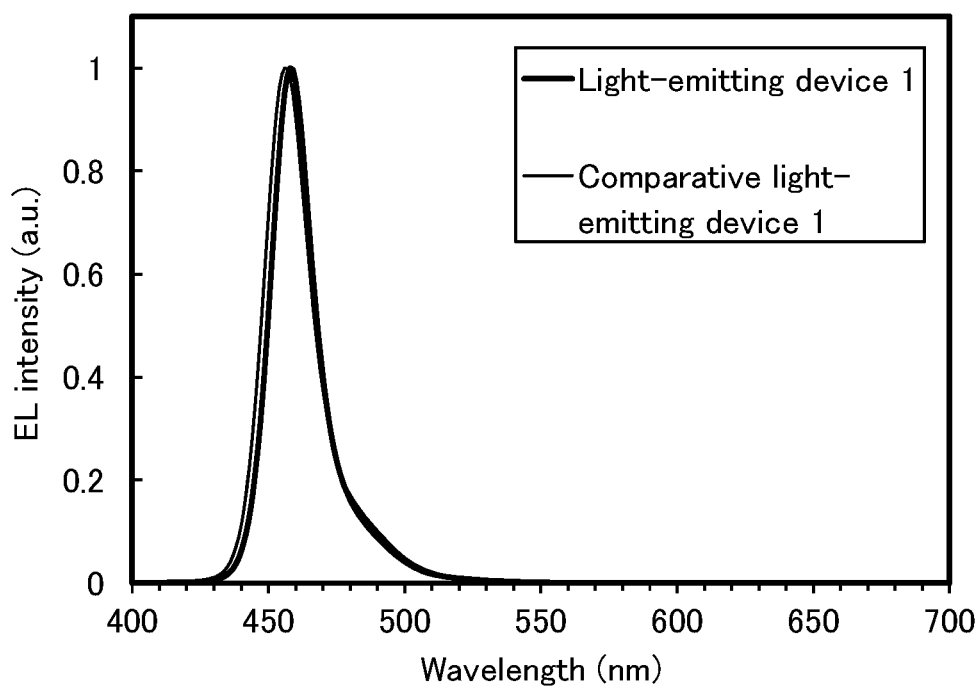
FIG. 25 shows emission spectra of the light-emitting device 1 and the comparative light-emitting device 1.

FIG. 20 shows the luminance-current density characteristics of the light-emitting device 1 and the comparative light-emitting device 1, FIG. 21 shows the luminance-voltage characteristics thereof, FIG. 22 shows the current efficiency-luminance characteristics thereof, FIG. 23 shows the current density-voltage characteristics thereof, FIG. 24 shows the blue index-luminance characteristics thereof, and FIG. 25 shows the emission spectra thereof. Table 3 shows the main characteristics of the light-emitting device 1 and the comparative light-emitting device 1 at a luminance of approximately 1000 cd/m$^2$. The luminance, CIE chromaticity, and emission spectra were measured at normal temperature with an SR-UL1R spectroradiometer manufactured by TOPCON TECHNOHOUSE CORPORATION.

TABLE 3

| | Voltage (V) | Current (mA) | Current density (mA/cm$^2$) | Chromaticity x | Chromaticity y | Current efficiency (cd/A) | BI (cd/A/y) |
|---|---|---|---|---|---|---|---|
| Light-emitting device 1 | 4.2 | 0.50 | 12.4 | 0.14 | 0.05 | 9.0 | 190 |
| Comparative light-emitting device 1 | 4.2 | 0.47 | 11.7 | 0.14 | 0.05 | 7.9 | 171 |

FIGS. 20 to 25 and Table 3 show that the light-emitting device 1 of one embodiment of the present invention is a light-emitting device that has favorable current efficiency and blue index (BI). In particular, with an extremely high BI of 190 (cd/A/y), the light-emitting device 1 can be said to have favorable BI. Thus, one embodiment of the present invention is particularly suitable for a light-emitting device used in a display.

Figure 26:
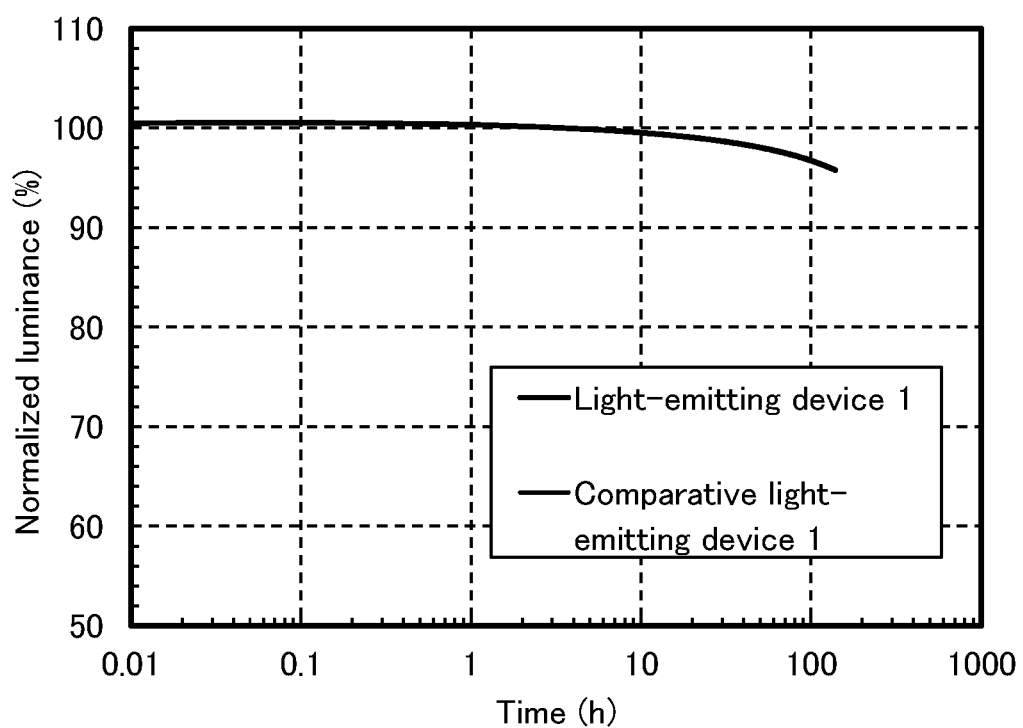
FIG. 26 shows changes in relative luminance over time of the light-emitting device 1 and the comparative light-emitting device 1.

FIG. 26 is a graph showing a change in luminance over driving time at a current density of 50 mA/cm$^2$. The light-emitting device 1 of one embodiment of the present invention as well as the comparative light-emitting device 1 was found to have high reliability.

Next, a plurality of light-emitting devices with different cap layer thicknesses (light-emitting devices 1-1 to 1-4 and comparative light-emitting devices 1-1 to 1-4) were fabricated, and the relationship between the thickness of the cap layer and the maximum BI was examined. Note that the thickness of the hole-transport layer was adjusted so that the maximum BI can be obtained at each cap layer thickness.

<Methods for Fabricating Light-Emitting Devices 1-1 to 1-4>

The light-emitting device 1-1 was fabricated in a manner similar to that of the light-emitting device 1 except that the thickness of the cap layer was set to 50 nm. The light-emitting device 1-2 was fabricated in a manner similar to that of the light-emitting device 1. The light-emitting device 1-3 was fabricated in a manner similar to that of the light-emitting device 1 except that the thickness of the hole-transport layer was set to 130 nm and the thickness of the cap layer was set to 70 nm. The light-emitting device 1-4 was fabricated in a manner similar to that of the light-emitting device 1-3 except that the thickness of the cap layer was set to 80 nm.

<Methods for Fabricating Comparative Light-Emitting Devices 1-1 to 1-4>

The comparative light-emitting device 1-1 was fabricated in a manner similar to that of the comparative light-emitting device 1 except that the thickness of the hole-transport layer was set to 135 nm and the thickness of the cap layer was set to 50 nm. The comparative light-emitting device 1-2 was fabricated in a manner similar to that of the comparative light-emitting device 1. The comparative light-emitting device 1-3 was fabricated in a manner similar to that of the comparative light-emitting device 1 except that the thickness of the cap layer was set to 70 nm. The comparative light-emitting device 1-4 was fabricated in a manner similar to that of the comparative light-emitting device 1 except that the thickness of the cap layer was set to 80 nm.

The structures of the light-emitting devices 1-1 to 1-4 and the comparative light-emitting devices 1-1 to 1-4 are listed in the following tables.

TABLE 4

| Light-emitting device | | Light-emitting device 1-X | Comparative light-emitting device 1-Y |
|---|---|---|---|
| Cap layer | *3 | BisBTc | DBT3P-II |
| Cathode | 15 nm | Ag:Mg (10:1) | |
| Electron-injection layer | 1 nm | LiF | |
| Electron-transport layer | 20 nm | mmtBumBPTzn:Li-6mq (1:1) | |
| Hole-blocking layer | 10 nm | 6mBP-4CzP2Pm | |
| Light-emitting layer | 20 nm | αN-βNPAnth:3,10PCA2Nbf(IV)-02 (1:0.015) | |
| Electron-blocking layer | 10 nm | DBfBB1TP | |
| Hole-transport layer | *2 | mmtBuBioFBi | |
| Hole-injection layer | 10 nm | mmtBuBioFBi:OCHD-003 (1:0.1) | |
| Anode | 10 nm | ITSO | |
| Reflective electrode | 100 nm | Ag | |

TABLE 5

| Light-emitting device 1-X | | | Comparative light-emitting device 1-Y | | |
|---|---|---|---|---|---|
| X | *2 Thickness of hole-transport layer | *3 Thickness of cap layer | Y | *2 Thickness of hole-transport layer | *3 Thickness of cap layer |
| 1 | 135 nm | 50 nm | 1 | 135 nm | 50 nm |
| 2 | 135 nm | 60 nm | 2 | 130 nm | 60 nm |
| 3 | 130 nm | 70 nm | 3 | 130 nm | 70 nm |
| 4 | 130 nm | 80 nm | 4 | 130 nm | 80 nm |

Figure 27:
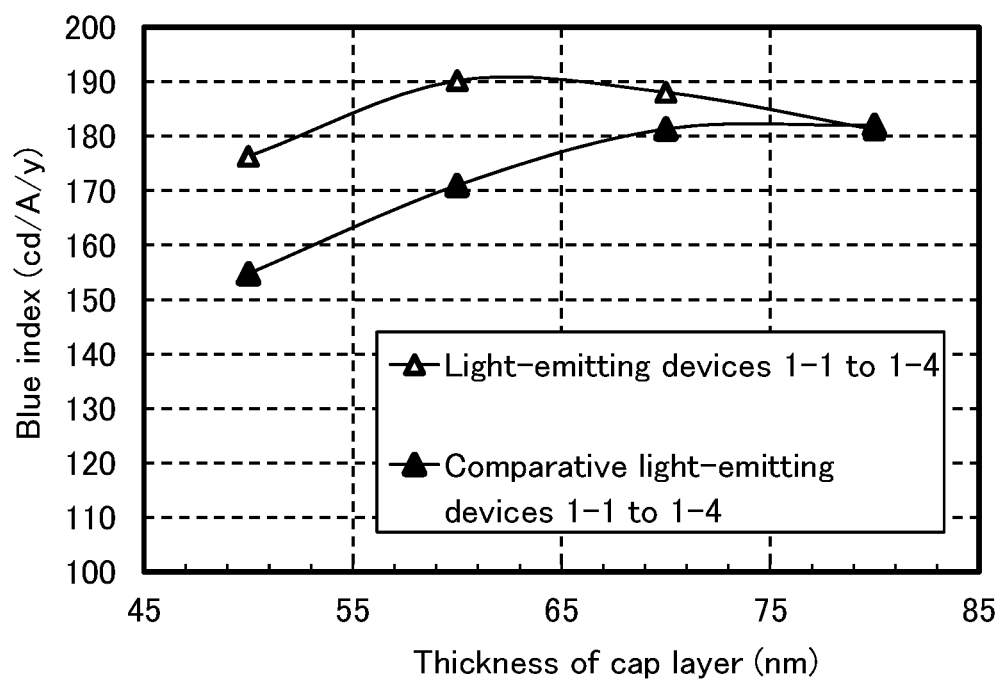
FIG. 27 shows relationships between the thickness of a cap layer and the maximum blue index value of light-emitting devices 1-1 to 1-4 and comparative light-emitting devices 1-1 to 1-4.

The results are shown in FIG. 27. When a layer having a low ordinary refractive index is provided in a light-emitting device and a cap layer is formed therein using an organic compound having a high ordinary refractive index and a low ordinary extinction coefficient, the light-emitting device can have an extremely favorable BI.

Example 2

In this example, a light-emitting device 10, which is a light-emitting device of one embodiment of the present invention, is described. Structural formulae of organic compounds used in this example are shown below.

[Chemical Formula 15]

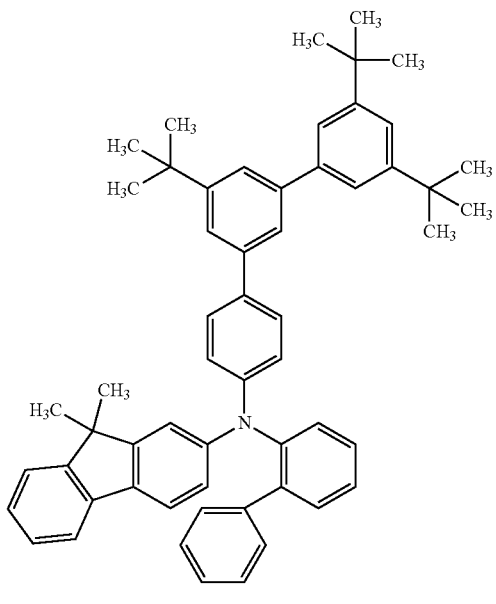

mmtBumTPoFBi-04

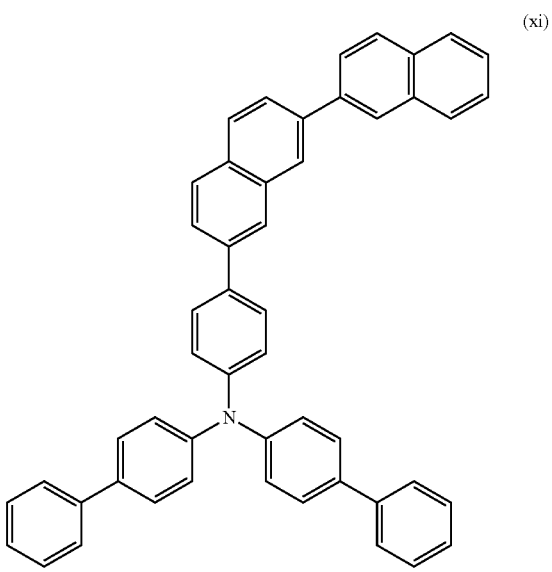

BBA(βN2)B-03

(i)
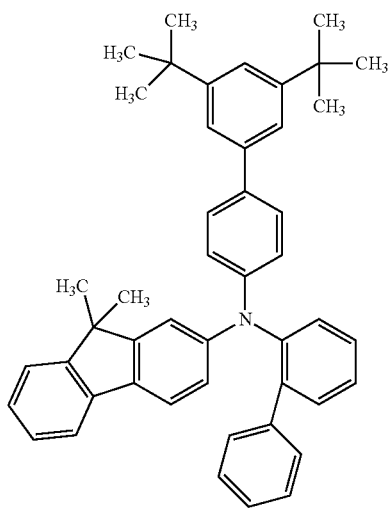
mmtBuBioFBi
(ii)
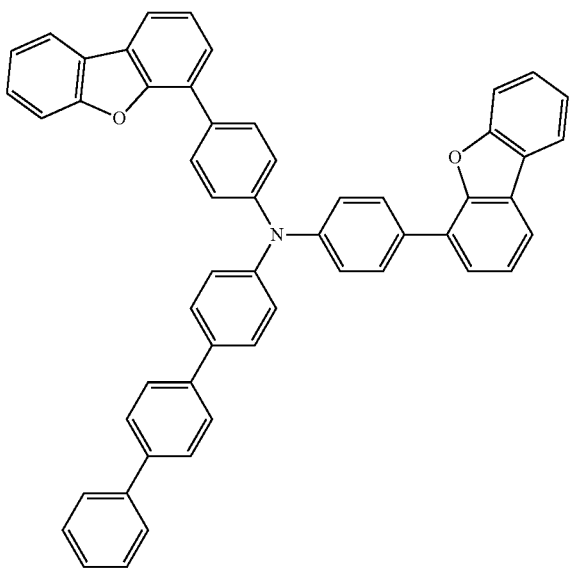
DBfBB1TP
(xii)
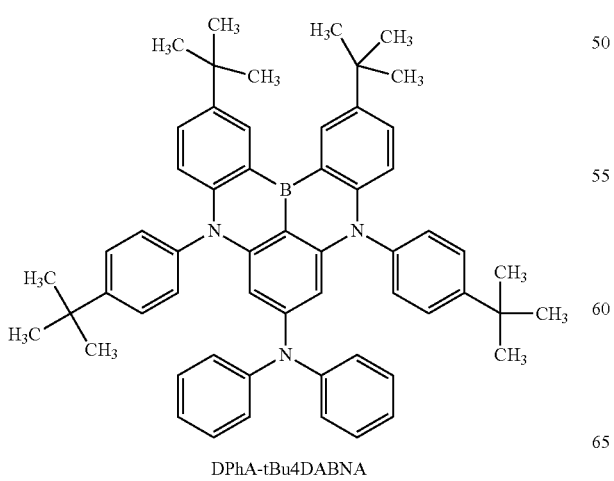
DPhA-tBu4DABNA
(v)
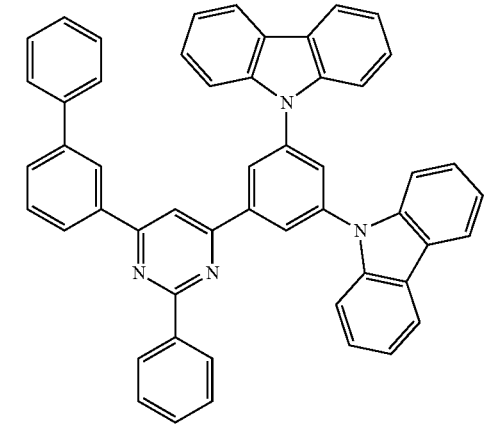
6mBP-4Cz2PPm
(vi)
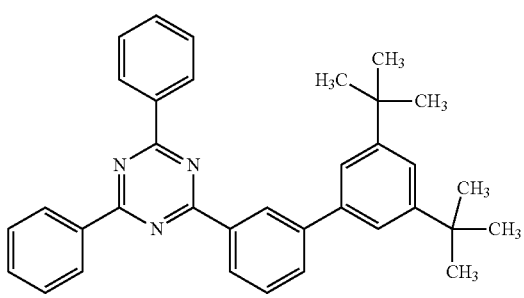
mmtBumBPTzn
(iii)
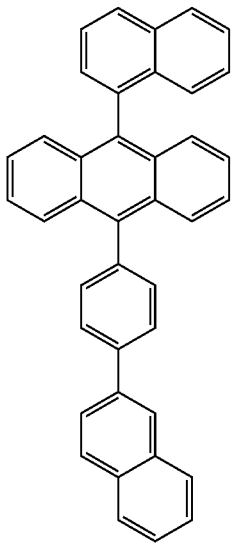
αN-βNPAnth -continued (viii)

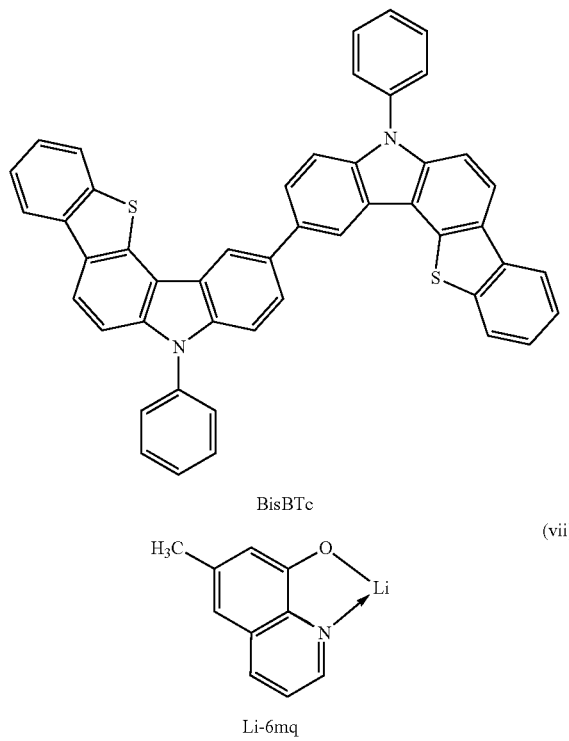

BisBTc (vii)

Li-6mq (Fabrication Method of Light-Emitting Device 10)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 5 nm by a sputtering method, whereby the first electrode 101 was formed. The electrode area was set to 4 mm² (2 mm×2 mm). Note that the first electrode 101 is a transparent electrode, and the transparent electrode and the reflective electrode can be collectively regarded as the first electrode 101.

Next, in pretreatment for forming the light-emitting device over the substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately 10-4 Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation apparatus such that the surface on which the first electrode 101 was formed faced downward. Then, N-(3",5',5"'-tri-tert-butyl-1,1':3',1"-terphenyl-4-yl)-N-(1,1'-biphenyl-2-yl)-9,9-dimethyl-9H-fluoren-2-amine (abbreviation: mmtBumTPoFBi-04) represented by Structural Formula (x) and a fluorine-containing electron acceptor material with a molecular weight of 672 (OCHD-003) were deposited on the first electrode 101 to a thickness of 10 nm by co-evaporation such that the weight ratio of mmtBumT-PoFBi-04 to OCHD-003 was 1:0.1, whereby the hole-injection layer 111 was formed.

Over the hole-injection layer 111, mmtBumTPoFBi-04, 4,4'-diphenyl-4"-(7;2'-binaphthyl-2-yl)triphenylamine (abbreviation: BBA(βN2)B-03) represented by Structural Formula (xi), and N-3',5'-ditertiarybutyl-1,1'-biphenyl-4-yl-N-1,1'-biphenyl-2-yl-9,9-dimethyl-9H-fluoren-2-amine (abbreviation: mmtBuBioFBi) represented by Structural Formula (i) were deposited by evaporation to thicknesses of 52.5 nm, 50 nm, and 40 nm as a first layer, a second layer, and a third layer, respectively, whereby the hole-transport layer 112 was formed.

Subsequently, over the hole-transport layer 112, N,N-bis[4-(dibenzofuran-4-yl)phenyl]-4-amino-p-terphenyl (abbreviation: DBfBB1TP) represented by Structural Formula (ii) was deposited to a thickness of 10 nm by evaporation, whereby an electron-blocking layer was formed.

Then, 9-(1-naphthyl)-10-[4-(2-naphthyl)phenyl]anthracene (abbreviation: αN-βNPAnth) represented by Structural Formula (iii) and 2,12-di(tert-butyl)-5,9-di(4-tert-butylphenyl)-N,N-diphenyl-5H,9H-[1,4]benzazaborino[2,3,4-kl]phenazaborin-7-amine (abbreviation: DPhA-tBu4DABNA) represented by Structural Formula (xii) were deposited to a thickness of 20 nm by co-evaporation such that the weight ratio of αN-[βNPAnth to DPhA-tBu4DABNA was 1:0.015, whereby the light-emitting layer 113 was formed.

After that, 6-(1,1'-biphenyl-3-yl)-4-[3,5-bis(9H-carbazol-9-yl)phenyl]-2-phenylpyrimidine (abbreviation: 6mBP-4Cz2PPm) represented by Structural Formula (v) was deposited to a thickness of 10 nm by evaporation, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by Structural Formula (vi) and 6-methyl-8-quinolinolato-lithium (abbreviation: Li-6mq) represented by Structural Formula (vii) were deposited to a thickness of 20 nm by co-evaporation such that the weight ratio of mmtBumBPTzn to Li-6mq was 1:1, whereby the electron-transport layer 114 was formed.

After the electron-transport layer 114 was formed, lithium fluoride (LiF) was deposited to a thickness of 1 nm by evaporation to form the electron-injection layer 115, and lastly silver (Ag) and magnesium (Mg) were deposited to a thickness of 15 nm by co-evaporation such that the volume ratio of Ag to Mg was 1:0.1 to form the second electrode 102, whereby the light-emitting device 10 was fabricated. Note that the second electrode 102 is a transflective electrode having a function of reflecting light and a function of transmitting light; thus, the light-emitting device of this example is a top-emission device in which light is extracted through the second electrode 102. Furthermore, over the second electrode 102, 5,5'-diphenyl-2,2'-di-5H-[1]benzothieno[3,2-c]carbazole (abbreviation: BisBTc) represented by Structural Formula (viii) was deposited to a thickness of 65 nm by evaporation to improve outcoupling efficiency.

The structure of the light-emitting device 10 is listed in the following table.

TABLE 6

| | Light-emitting device 10 | |
|---|---|---|
| Cap layer | 65 nm | BisBTc |
| Cathode | 15 nm | Ag:Mg (10:1) |
| Electron-injection layer | 1 nm | LiF |

TABLE 6-continued

| | | Light-emitting device 10 |
|---|---|---|
| Electron-transport layer | 20 nm | mmtBumBPTzn:Li-6mq (1:1) |
| Hole-blocking layer | 10 nm | 6mBP-4CzP2Pm |
| Light-emitting layer | 20 nm | αN-βNPAnth:DPhA-tBu4DABNA (1:0.015) |

TABLE 6-continued

| | | Light-emitting device 10 |
|---|---|---|
| Electron-blocking layer | 10 nm | DBfBB1TP |
| Hole-transport layer 3 | 40 nm | mmtBuBioFBi |
| Hole-transport layer 2 | 50 nm | BBA(βN2)B-03 |
| Hole-transport layer 1 | 52.5 nm | mmtBumTPoFBi-04 |
| Hole-injection layer | 10 nm | mmtBumTPoFBi04:OCHD-003 (1:0.1) |
| Anode | 5 nm | ITSO |
| Reflective electrode | 100 nm | Ag |

The measured refractive indexes of mmtBumTPoFBi-04 and BBA(βN2)B-03 are shown in FIG. 28. The measurement was performed with an M-2000U spectroscopic ellipsometer manufactured by J. A. Woollam Japan Corp. To obtain films used as measurement samples, the material for each layer was deposited to a thickness of approximately 50 nm over a quartz substrate by a vacuum evaporation method. Note that the refractive indexes of mmtBuBioFBi, mmtBumBPTzn, Li-6mq, and BisBTc and the extinction coefficient of BisBTc are shown in FIG. 18 and FIG. 19.

From FIGS. 18, 19, and 28, mmtBumTPoFBi-04, mmtBuBioFBi, mmtBumBPTzn, and Li-6mq are low refractive index materials having an ordinary refractive index of higher than or equal to 1.50 and lower than or equal to 1.75 in the entire wavelength range from 455 nm to 465 nm, and BisBTc is a high refractive index material having an ordinary refractive index of higher than or equal to 1.90 and lower than or equal to 2.40 and an ordinary extinction coefficient of higher than or equal to 0 and lower than or equal to 0.01 in the entire wavelength range from 455 nm to 465 nm. Furthermore, the peak wavelength on the longest wavelength side of the ordinary extinction coefficient is 370 nm, and the alignment order parameter at this wavelength is −0.23, which is less than −0.1. Note that the light-emitting device 10 is a blue light-emitting device.

The light-emitting device 10 was sealed using a glass substrate in a glove box containing a nitrogen atmosphere so as not to be exposed to the air. Specifically, a UV curable sealing material was applied to surround the device, only the UV curable sealing material was irradiated with UV while the light-emitting device was not irradiated with the UV, and heat treatment was performed at 80° C. under an atmospheric pressure for one hour. Then, the initial characteristics of the light-emitting device were measured.

Figure 29:
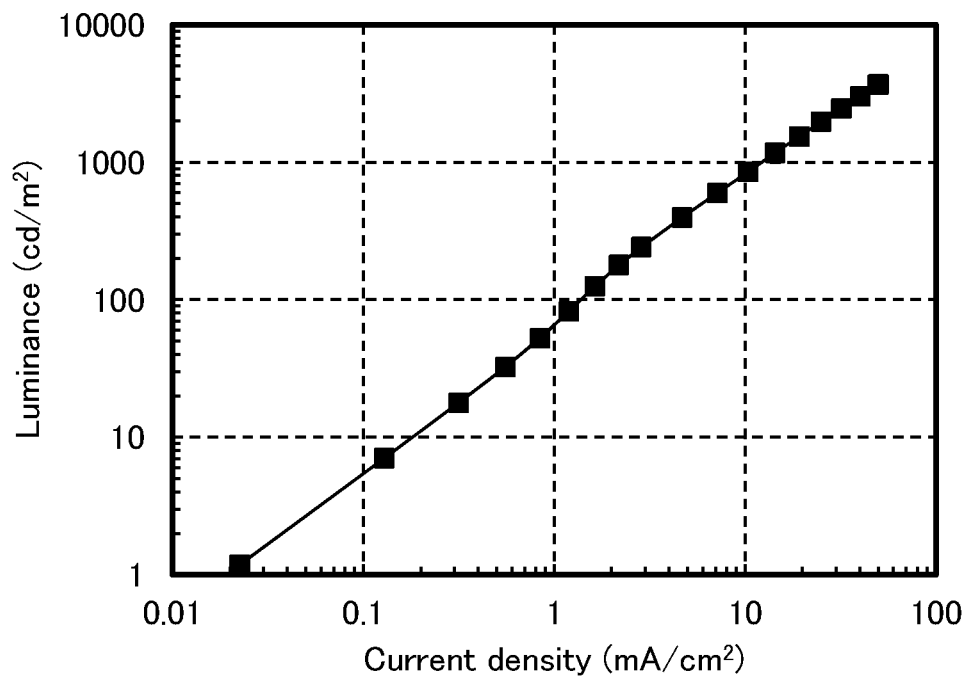
FIG. 29 shows luminance-current density characteristics of a light-emitting device 10.
Figure 30:
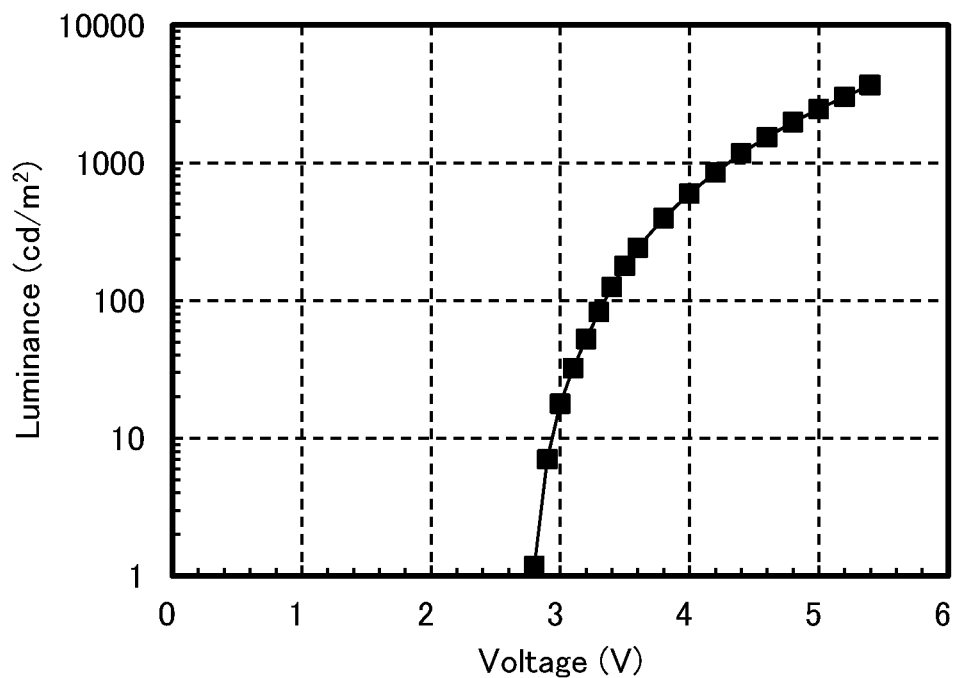
FIG. 30 shows luminance-voltage characteristics of the light-emitting device 10.
Figure 31:
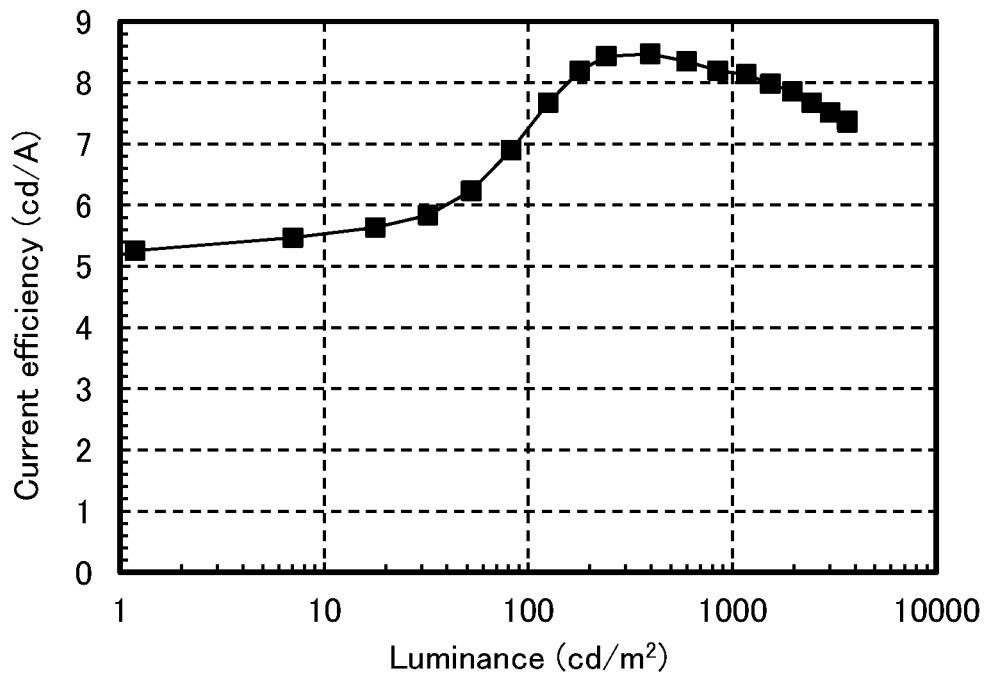
FIG. 31 shows current efficiency-luminance characteristics of the light-emitting device 10.
Figure 32:
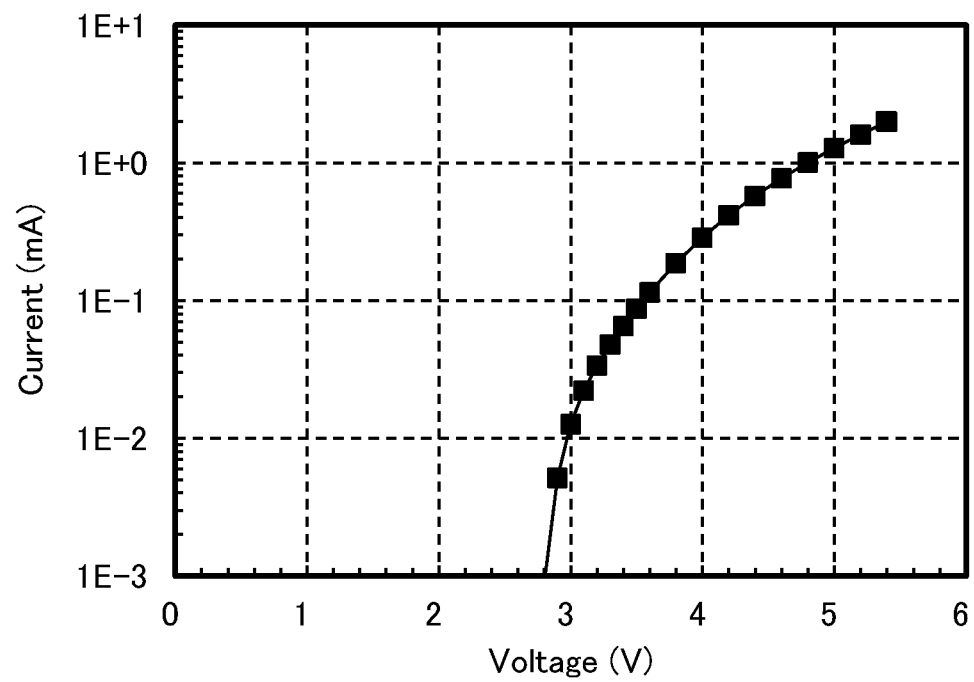
FIG. 32 shows current density-voltage characteristics of the light-emitting device 10.
Figure 33:
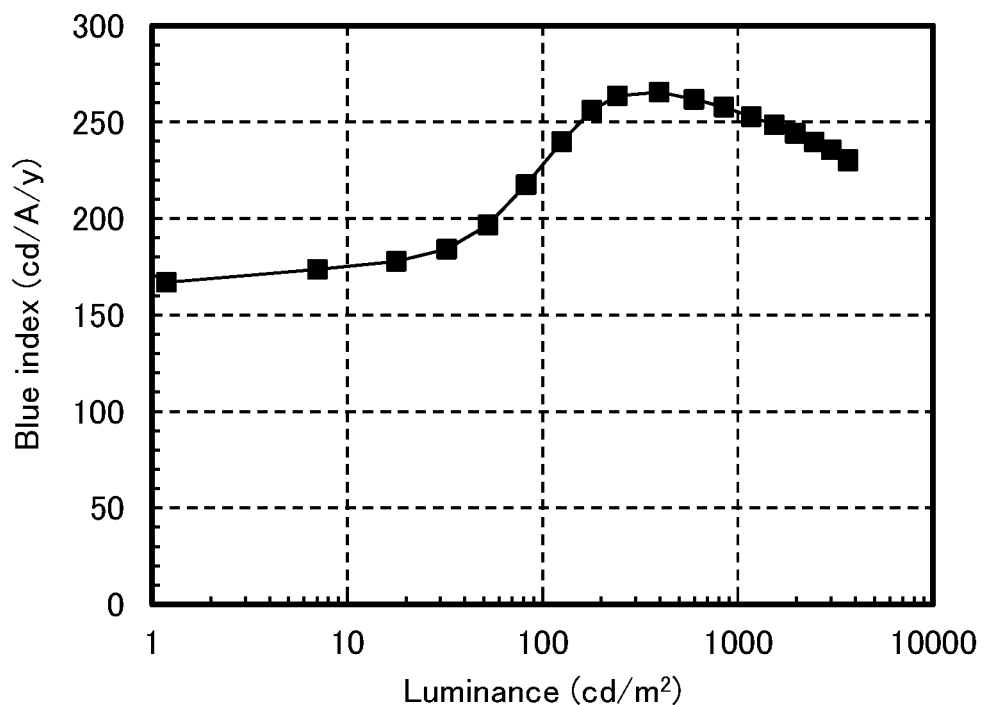
FIG. 33 shows blue index-luminance characteristics of the light-emitting device 10.
Figure 34:
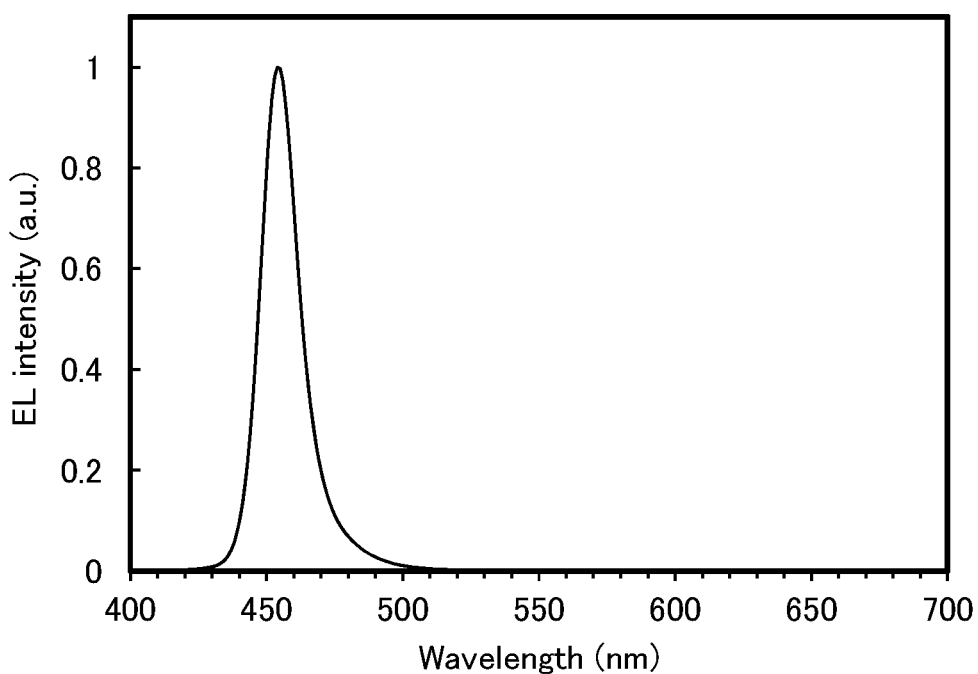
FIG. 34 shows an emission spectrum of the light-emitting device 10.

FIG. 29 shows the luminance-current density characteristics of the light-emitting device 10, FIG. 30 shows the luminance-voltage characteristics thereof, FIG. 31 shows the current efficiency-luminance characteristics thereof, FIG. 32 shows the current density-voltage characteristics thereof, FIG. 33 shows the blue index-luminance characteristics thereof, and FIG. 34 shows the emission spectra thereof. Table 7 shows the main characteristics at a luminance of approximately 1000 cd/m². The luminance, CIE chromaticity, and emission spectra were measured at normal temperature with an SR-UL1R spectroradiometer manufactured by TOPCON TECHNOHOUSE CORPORATION.

TABLE 7

| | Voltage (V) | Current (mA) | Current density (mA/cm²) | Chromaticity x | Chromaticity y | Current efficiency (cd/A) | BI (cd/A/y) |
|---|---|---|---|---|---|---|---|
| Light-emitting device 10 | 4.2 | 0.41 | 10.4 | 0.15 | 0.03 | 8.2 | 258 |

FIGS. 29 to 34 and Table 7 show that the light-emitting device 10 of one embodiment of the present invention is a light-emitting device that has extremely favorable current efficiency and blue index (BI). In particular, the BI is as extremely high as more than 250 (cd/A/y) and the maximum BI is 265 (cd/A/y); thus, the light-emitting device 10 can be said to have favorable BI. Therefore, one embodiment of the present invention is particularly suitable for a light-emitting device used in a display.

Figure 35:
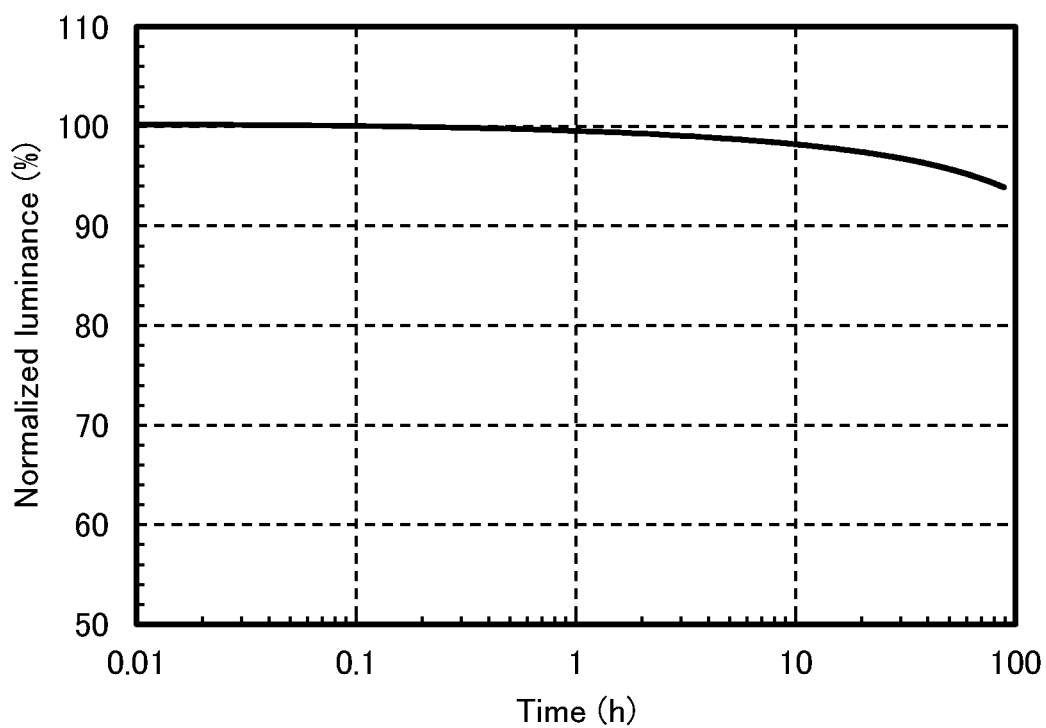
FIG. 35 shows a change in relative luminance over time of the light-emitting device 10.

FIG. 35 is a graph showing a change in luminance over driving time at a current density of 50 mA/cm². The light-emitting device 10 of one embodiment of the present invention was found to have high reliability.

Reference Synthesis Example 1

Described in this synthesis example is a method for synthesizing 2-{(3',5'-di-tert-butyl)-1,1'-biphenyl-3-yl}-4,6-diphenyl-1,3,5-triazine (abbreviation: mmtBumBPTzn) used in Example 1. The structure of mmtBumBPTzn is shown below.

[Chemical Formula 16]

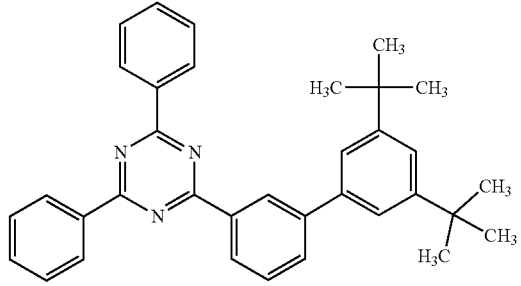

mmtBumBPTzn

Step 1: Synthesis of 3-bromo-3',5'-di-tert-butylbiphenyl

First, 1.0 g (4.3 mmol) of 3,5-di-t-butylphenylboronic acid, 1.5 g (5.2 mmol) of 1-bromo-3-iodobenzene, 4.5 mL of 2 mol/L aqueous solution of potassium carbonate, 20 mL of toluene, and 3 mL of ethanol were put into a three-neck flask and stirred under reduced pressure to be degassed. Furthermore, 52 mg (0.17 mmol) of tris(2-methylphenyl)phosphine (abbreviation: P(o-tolyl)$_3$) and 10 mg (0.043 mmol) of palladium(II) acetate were added to this mixture, and reacted under a nitrogen atmosphere at 80° C. for 14 hours. After the reaction, extraction with toluene was performed and the resulting organic layer was dried with magnesium sulfate. This mixture was subjected to gravity filtration and the filtrate was purified by silica gel column chromatography (the developing solvent: hexane) to give 1.0 g of a target white solid (yield: 68%). The synthesis scheme of Step 1 is shown below.

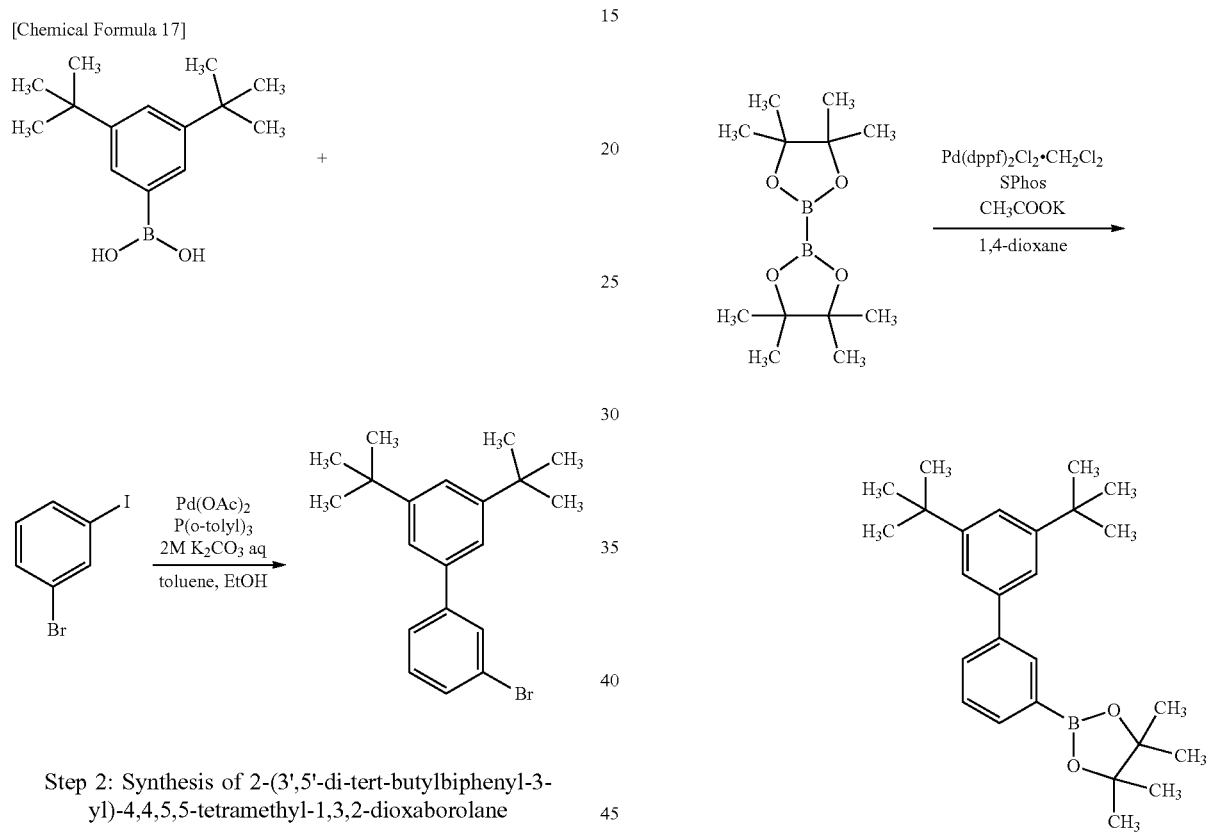

Step 2: Synthesis of 2-(3',5'-di-tert-butylbiphenyl-3-yl)-4,4,5,5-tetramethyl-1,3,2-dioxaborolane First, 1.0 g (2.9 mmol) of 3-bromo-3',5'-di-tert-butylbiphenyl, 0.96 g (3.8 mmol) of bis(pinacolato)diboron, 0.94 g (9.6 mmol) of potassium acetate, and 30 mL of 1,4-dioxane were put into a three-neck flask and stirred under reduced pressure to be degassed. Furthermore, 0.12 g (0.30 mmol) of 2-dicyclohexylphosphino-2',6'-dimethoxybiphenyl and 0.12 g (0.15 mmol) of [1,1'-bis(diphenylphosphino)ferrocene] palladium(II) dichloride dichloromethane adduct (abbreviation: Pd(dppf)$_2$Cl$_2$—CH$_2$Cl$_2$) were added to this mixture, and reacted under a nitrogen atmosphere at 110° C. for 24 hours. After the reaction, extraction with toluene was performed and the resulting organic layer was dried with magnesium sulfate. This mixture was subjected to gravity filtration and the filtrate was purified by silica gel column chromatography (the developing solvent: toluene) to give 0.89 g of a target yellow oil (yield: 78%). The synthesis scheme of Step 2 is shown below.

Step 3: Synthesis of mmtBumBPTzn

First, 1.5 g (5.6 mmol) of 4,6-diphenyl-2-chloro-1,3,5-triazine, 2.4 g (6.2 mmol) of 2-(3',5'-di-tert-butylphenyl-3-yl)-4,4,5,5-tetramethyl-1,3,2-dioxaborolane, 2.4 g (11 mmol) of tripotassium phosphate, 10 mL of water, 28 mL of toluene, and 10 mL of 1,4-dioxane were put into a three-neck flask and stirred under reduced pressure to be degassed. Furthermore, 13 mg (0.056 mmol) of palladium(II) acetate and 34 mg (0.11 mmol) of tris(2-methylphenyl)phosphine were added to this mixture, and heated and refluxed under a nitrogen atmosphere for 14 hours. After the reaction, extraction with ethyl acetate was performed and the resulting organic layer was removed with magnesium sulfate. This mixture was subjected to gravity filtration and the filtrate was purified by silica gel column chromatography (the developing solvent, chloroform:hexane=1:5 changed to 1:3). The obtained solid was recrystallized with hexane to give 2.0 g of a target white solid (yield: 51%). The synthesis scheme of Step 3 is shown below.

[Chemical Formula 19]

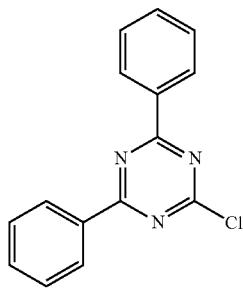

+

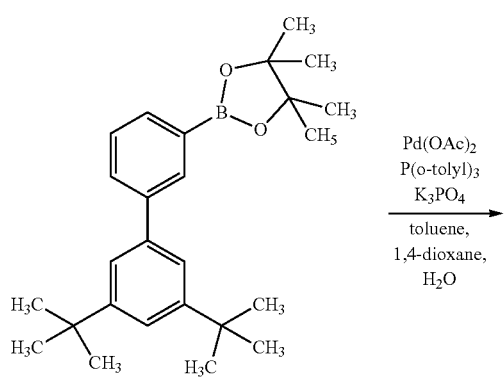

$\xrightarrow{\substack{Pd(OAc)_2 \\ P(o\text{-}tolyl)_3 \\ K_3PO_4 \\ \text{toluene,} \\ 1,4\text{-dioxane,} \\ H_2O}}$

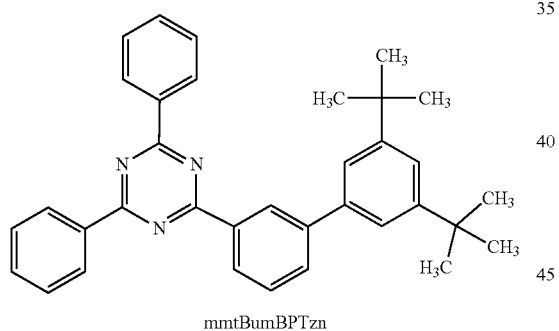

mmtBumBPTzn

By a train sublimation method, 2.0 g of the obtained white solid was purified by sublimation under an argon gas stream at a pressure of 3.4 Pa and a temperature of 220° C. The solid was heated. After the sublimation purification, 1.8 g of a target white solid was obtained at a collection rate of 80%.

Analysis results by nuclear magnetic resonance spectroscopy ($^1$H-NMR) of the white solid obtained in Step 3 are shown below. The results reveal that mmtBumBPTzn was obtained in this example.

$^1$H NMR (CDCl3, 300 MHz): δ=1.44 (s, 18H), 7.51-7.68 (m, 10H), 7.83 (d, 1H), 8.73-8.81 (m, 5H), 9.01 (s, 1H).

Reference Synthesis Example 2

Described in this example is a method for synthesizing 6-methyl-8-quinolinolato-lithium (abbreviation: Li-6mq) used in Example 1. The structural formula of Li-6mq is shown below.

[Chemical Formula 20]

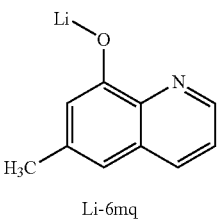

Li-6mq

First, 2.0 g (12.6 mmol) of 8-hydroxy-6-methylquinoline and 130 mL of dehydrated tetrahydrofuran (abbreviation: THF) were put into a three-neck flask and stirred. Then, 10.1 mL (10.1 mmol) of 1M THF solution of lithium tert-butoxide (abbreviation: tBuOLi) was added to this solution and stirred at room temperature for 47 hours. The reacted solution was concentrated to give a yellow solid. Acetonitrile was added to this solid and subjected to ultrasonic irradiation and filtration, so that a pale yellow solid was obtained. This washing step was performed twice. The obtained residue was 1.6 g of pale yellow solid of Li-6mq (yield: 95%). This synthesis scheme is shown below.

[Chemical Formula 21]

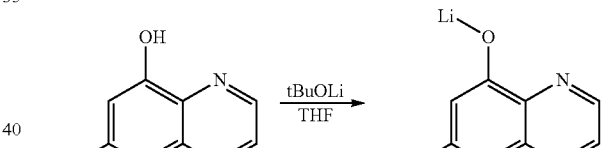

Next, the absorption and emission spectra of Li-6mq in a dehydrated acetone solution were measured. The absorption spectrum was measured with an ultraviolet-visible light spectrophotometer (V550, manufactured by JASCO Corporation), and the spectrum of dehydrated acetone alone in a quartz cell was subtracted. The emission spectrum was measured with a fluorescence spectrophotometer (FP-8600, produced by JASCO Corporation).

As a result, Li-6mq in the dehydrated acetone solution has an absorption peak at 390 nm, and an emission wavelength peak at 540 nm (excitation wavelength: 385 nm).

Reference Synthesis Example 3

Described in this example is a method for synthesizing N-(3'',5',5''-tri-tert-butyl-1,1':3',1''-terphenyl-4-yl)-N-(1,1'-biphenyl-2-yl)-9,9-dimethyl-9H-fluoren-2-amine (abbreviation: mmtBumTPoFBi-04). The structure of mmtBumTPoFBi-04 is shown below.

[Chemical Formula 22]

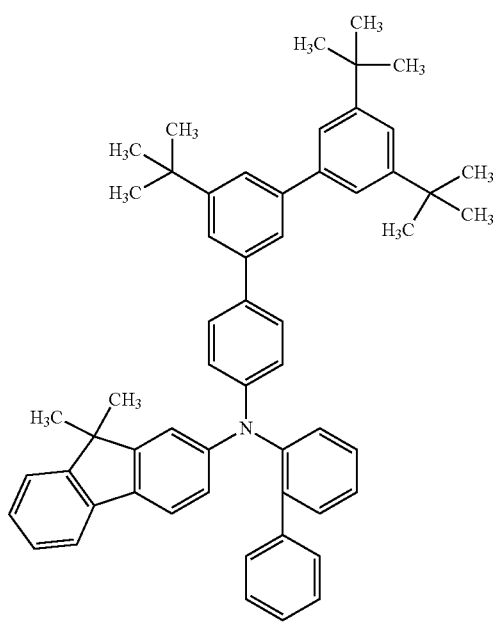

Step 1: Synthesis of 4-bromo-3",5',5"-tri-tert-butyl-1,1':3',1"-terphenyl

In a three-neck flask were put 9.0 g (20.1 mmol) of 2-(3',5,5'-tri-tert-butyl[1,1'-biphenyl]-3-yl)-4,4,5,5-tetramethyl-1,3,2-dioxaborolane, 6.8 g (24.1 mmol) of 1-bromo-4-iodobenzene, 8.3 g (60.3 mmol) of potassium carbonate, 100 mL of toluene, 40 mL of ethanol, and 30 mL of tap water. The mixture was degassed under reduced pressure, and then the air in the flask was replaced with nitrogen. Then, 91 mg (0.40 mmol) of palladium acetate and 211 mg (0.80 mmol) of triphenylphosphine were added, and the mixture was heated at 80° C. for approximately 4 hours. After that, the temperature of the flask was lowered to room temperature, and the mixture was separated into an organic layer and an aqueous layer. Magnesium sulfate was added to this solution to eliminate moisture, whereby this solution was concentrated. A hexane solution of the obtained solution was purified by silica gel column chromatography, whereby 6.0 g of a target white solid was obtained in a yield of 62.5%. The synthesis scheme of Step 1 is shown below.

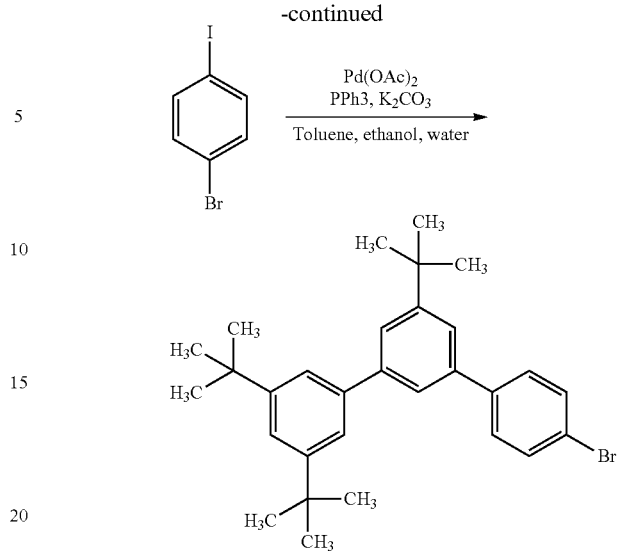

Step 2: Synthesis of mmtBumTPoFBi-04

In a three-neck flask were put 3.0 g (6.3 mmol) of 4-bromo-3",5',5"-tri-tert-butyl-1,1':3',1"-terphenyl, 2.3 g (6.3 mmol) of N-(1,1'-biphenyl-4-yl)-N-phenyl-9,9-dimethyl-9H-fluoren-2-amine, 1.8 g (18.9 mmol) of sodium-tert-butoxide, and 32 mL of toluene. The mixture was degassed under reduced pressure, the air in the flask was replaced with nitrogen, 72 mg (0.13 mmol) of bis(dibenzylideneacetone)palladium(0) (abbreviation: Pd(dba)$_2$) and 76 mg (0.38 mmol) of tri-tert-butylphosphine were added thereto, and the mixture was heated at 120° C. for approximately 8 hours. After that, the temperature of the mixture was lowered to approximately 60° C., approximately 1 mL of water was added, a precipitated solid was separated by filtration, and the solid was washed with toluene. The filtrate was concentrated, and the obtained toluene solution was purified by silica gel column chromatography. The obtained solution was concentrated to give a condensed toluene solution. Ethanol was added to this toluene solution and the toluene solution was concentrated under reduced pressure, whereby an ethanol suspension was obtained. The precipitate was filtrated at approximately 20° C., and the obtained solid was dried at approximately 80° C. under reduced pressure, whereby 3.6 g of a target white solid was obtained in a yield of 75%. The synthesis scheme of Step 2 is shown below.

[Chemical Formula 23]

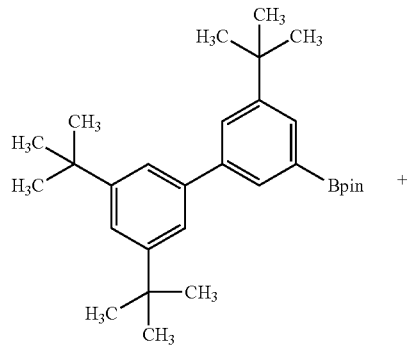

[Chemical Formula 24]

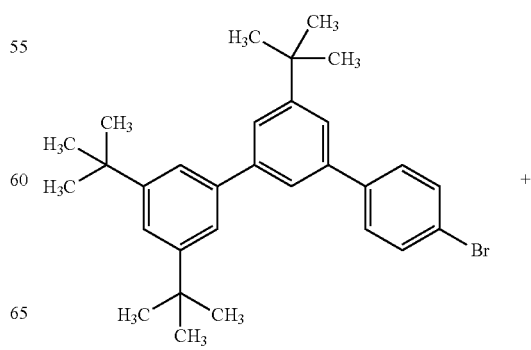

-continued

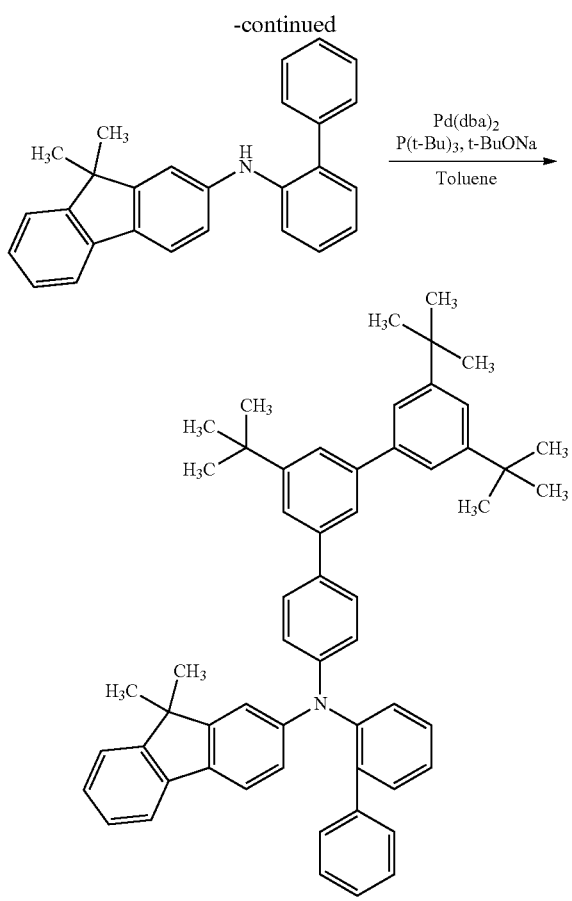

Analysis results by nuclear magnetic resonance spectroscopy ($^1$H-NMR) of the white solid obtained in Step 2 are shown below. The results reveal that mmtBumTPoFBi-04 was synthesized in this example.

$^1$H-NMR. δ (CDCl$_3$): 7.54-7.56 (m, 1H), 7.53 (dd, 1H, J=1.7 Hz), 7.50 (dd, 1H, J=1.7 Hz), 7.27-7.47 (m, 13H), 7.23 (dd, 1H, J=6.3 Hz, 1.2 Hz), 7.18-7.19 (m, 2H), 7.08-7.00 (m, 5H), 6.88 (d, 1H, J=1.7 Hz) 6.77 (dd, 1H, J=8.0 Hz, 2.3 Hz), 1.42 (s, 9H), 1.39 (s, 18H), 1.29 (s, 6H).

This application is based on Japanese Patent Application Serial No. 2021-052207 filed with Japan Patent Office on Mar. 25, 2021, the entire contents of which are hereby incorporated by reference.

What is claimed is:

1. A material for a cap layer of a light-emitting device, the material comprising 5,5'-diphenyl-2,2'-di-5H-[1]benzothieno[3,2-c]carbazole, 3-{4-(triphenylen-2-yl)phenyl}-9-(triphenylen-2-yl)-9H-carbazole, 3,6-bis[4-(2-naphthyl)phenyl]-9-(2-naphthyl)-9H-carbazole, 9-[4-(2,2'-binaphthalen-6-yl)phenyl]-3-[4-(2-naphthyl)phenyl]-9H-carbazole, 2-{4-[2-(N-phenyl-9H-carbazol-3-yl)-9H-carbazol-9-yl]phenyl}dibenzo[f,h]quinoxaline, N,N-bis[4-(6-phenylbenzo[b]naphtho[1,2-d]furan-8-yl)phenyl]-4-amino-p-terphenyl, 9-[4-(9'-phenyl-3,3'-bi-9H-carbazol-9-yl)phenyl]naphtho[1',2':4,5]furo[2,3-b]pyrazine, or 4,8-bis[3-(triphenylen-2-yl)phenyl]-[1]benzofuro[3,2-d]pyrimidine.

2. The material for a cap layer of a light-emitting device, according to claim 1, wherein the material has an ordinary refractive index of higher than or equal to 1.90 and lower than or equal to 2.40 and an ordinary extinction coefficient of higher than or equal to 0 and lower than or equal to 0.01, in an entire wavelength range from 455 nm to 465 nm.

3. The material for a cap layer of a light-emitting device, according to claim 1, wherein the material has an ordinary refractive index of higher than or equal to 1.85 and lower than or equal to 2.40 and an ordinary extinction coefficient of higher than or equal to 0 and lower than or equal to 0.01, at any wavelength in a range from 500 nm to 650 nm.

4. The material for a cap layer of a light-emitting device, according to claim 3, wherein the ordinary refractive index is higher than or equal to 1.90 and lower than or equal to 2.40.

5. A material for a cap layer of a light-emitting device, wherein the material comprises a condensed ring skeleton having four or more rings or a condensed ring skeleton having five or more rings, and
wherein the material comprises a sulfur atom and a nitrogen atom.

6. The material for a cap layer of a light-emitting device, according to claim 5, wherein the material has an ordinary refractive index of higher than or equal to 1.90 and lower than or equal to 2.40 and an ordinary extinction coefficient of higher than or equal to 0 and lower than or equal to 0.01, in an entire wavelength range from 455 nm to 465 nm.

7. A cap layer of a light-emitting device,
wherein the light-emitting device comprises an EL layer between a pair of electrodes
wherein one of the pair of electrodes is a light-transmitting electrode,
wherein the cap layer is in contact with a surface of the light-transmitting electrode on the side opposite to the EL layer, and
wherein the cap layer comprises a material comprising 5,5'-diphenyl-2,2'-di-5H-[1]benzothieno[3,2-c]carbazole, 3-{4-(triphenylen-2-yl)phenyl}-9-(triphenylen-2-yl)-9H-carbazole, 3,6-bis[4-(2-naphthyl)phenyl]-9-(2-naphthyl)-9H-carbazole, 9-[4-(2,2'-binaphthalen-6-yl)phenyl]-3-[4-(2-naphthyl)phenyl]-9H-carbazole, 2-{4-[2-(N-phenyl-9H-carbazol-3-yl)-9H-carbazol-9-yl]phenyl}dibenzo[f,h]quinoxaline, N,N-bis[4-(6-phenylbenzo[b]naphtho[1,2-d]furan-8-yl)phenyl]-4-amino-p-terphenyl, 9-[4-(9'-phenyl-3,3'-bi-9H-carbazol-9-yl)phenyl]naphtho[1',2':4,5]furo[2,3-b]pyrazine, or 4,8-bis[3-(triphenylen-2-yl)phenyl]-[1]benzofuro[3,2-d]pyrimidine.

8. A light-emitting device comprising a light-emitting layer between a pair of electrodes,
wherein one of the pair of electrodes is a light-transmitting electrode,
wherein a cap layer is in contact with a surface of the light-transmitting electrode on the side opposite to the light-emitting layer, and
wherein the cap layer comprises a material comprising 5,5'-diphenyl-2,2'-di-5H-[1]benzothieno[3,2-c]carbazole, 3-{4-(triphenylen-2-yl)phenyl}-9-(triphenylen-2-yl)-9H-carbazole, 3,6-bis[4-(2-naphthyl)phenyl]-9-(2-naphthyl)-9H-carbazole, 9-[4-(2,2'-binaphthalen-6-yl)phenyl]-3-[4-(2-naphthyl)phenyl]-9H-carbazole, 2-{4-[2-(N-phenyl-9H-carbazol-3-yl)-9H-carbazol-9-yl]phenyl}dibenzo[f,h]quinoxaline, N,N-bis[4-(6-phenylbenzo[b]naphtho[1,2-d]furan-8-yl)phenyl]-4-amino-p-terphenyl, 9-[4-(9'-phenyl-3,3'-bi-9H-carbazol-9-yl)phenyl]naphtho[1'2':4,5]furo[2,3-b]pyrazine, or 4,8-bis[3-(triphenylen-2-yl)phenyl]-[1]benzofuro[3,2-d]pyrimidine.

9. The light-emitting device according to claim 8, wherein an ordinary refractive index of the material is higher than or equal to 1.95 and lower than or equal to 2.40.

10. A light-emitting device comprising a light-emitting layer between a pair of electrodes,
    wherein one of the pair of electrodes is a light-transmitting electrode,
    wherein a cap layer is in contact with a surface of the light-transmitting electrode on the side opposite to the light-emitting layer, and
    wherein the cap layer comprises a material comprising a condensed ring skeleton having four or more rings or a condensed ring skeleton having five or more rings, a sulfur atom, and a nitrogen atom.

11. The light-emitting device according to claim 10, wherein an ordinary refractive index of the material is higher than or equal to 1.90 and lower than or equal to 2.40.

12. A light-emitting device comprising an EL layer between a pair of electrodes,
    wherein one of the pair of electrodes is a light-transmitting electrode,
    wherein the EL layer comprises at least a light-emitting layer and a low refractive index layer,
    wherein the low refractive index layer is positioned between the light-emitting layer and the light-transmitting electrode,
    wherein a cap layer is in contact with a surface of the light-transmitting electrode on the side opposite to the EL layer,
    wherein light emitted by the light-emitting device has a peak wavelength of higher than or equal to 455 nm and lower than or equal to 465 nm,
    wherein the cap layer comprises a high refractive index material having an ordinary refractive index of higher than or equal to 1.90 and lower than or equal to 2.40 and an ordinary extinction coefficient of higher than or equal to 0 and lower than or equal to 0.01 at the peak wavelength, and
    wherein the low refractive index layer comprises a low refractive index material having an ordinary refractive index of higher than or equal to 1.50 and lower than or equal to 1.75 at the peak wavelength.

13. The light-emitting device according to claim 12, wherein the high refractive index material has an ordinary extinction coefficient of higher than 0.01 at wavelengths of lower than or equal to 390 nm.

14. The light-emitting device according to claim 12, wherein the ordinary refractive index of the high refractive index material is higher than or equal to 1.95 and lower than or equal to 2.40.

15. A light-emitting device comprising an EL layer between a pair of electrodes,
    wherein one of the pair of electrodes is a light-transmitting electrode,
    wherein the EL layer comprises at least a light-emitting layer and a low refractive index layer,
    wherein a cap layer is in contact with a surface of the light-transmitting electrode on the side opposite to the EL layer,
    wherein the cap layer comprises a high refractive index material having an ordinary refractive index of higher than or equal to 1.85 and lower than or equal to 2.40 and an ordinary extinction coefficient of higher than or equal to 0 and lower than or equal to 0.01 at any wavelength in a range from 500 nm to 650 nm, and
    wherein the low refractive index layer comprises a low refractive index material having an ordinary refractive index of higher than or equal to 1.45 and lower than or equal to 1.70 in an entire wavelength range from 500 nm to 650 nm.

16. A light-emitting device comprising an EL layer between a pair of electrodes,
    wherein one of the pair of electrodes is a light-transmitting electrode,
    wherein the EL layer comprises at least a light-emitting layer and a low refractive index layer,
    wherein light emitted by the light-emitting device has a peak wavelength of higher than or equal to 500 nm and lower than or equal to 650 nm,
    wherein a cap layer is in contact with a surface of the light-transmitting electrode on the side opposite to the EL layer,
    wherein the cap layer comprises a high refractive index material having an ordinary refractive index of higher than or equal to 1.85 and lower than or equal to 2.40 and an ordinary extinction coefficient of higher than or equal to 0 and lower than or equal to 0.01 at the peak wavelength, and
    wherein the low refractive index layer comprises a low refractive index material having an ordinary refractive index of higher than or equal to 1.45 and lower than or equal to 1.70 at the peak wavelength.

17. The light-emitting device according to claim 16,
    wherein the low refractive index layer is positioned between the light-emitting layer and the light-transmitting electrode,
    wherein the ordinary refractive index of the high refractive index material is higher than or equal to 1.90 and lower than or equal to 2.40,
    wherein the light-transmitting electrode is a cathode,
    wherein the low refractive index layer is in an electron-transport region,
    wherein the low refractive index layer is an electron-transport layer, and
    wherein the low refractive index material is a mixed material of a material having an electron-transport property and a metal complex.

18. The light-emitting device according to claim 16,
    wherein the other of the pair of electrodes is a reflective electrode,
    wherein the EL layer comprises a second low refractive index layer between the light-emitting layer and the reflective electrode, and
    wherein the second low refractive index layer comprises a second low refractive index material having an ordinary refractive index of higher than or equal to 1.60 and lower than or equal to 1.70 at a peak wavelength of light emitted by the light-emitting device.

19. An electronic device comprising:
the light-emitting device according to claim 16;
a sensor;
an operation button; and
a speaker or a microphone.

* * * * *